(12) United States Patent
Yang et al.

(10) Patent No.: US 10,269,909 B1
(45) Date of Patent: Apr. 23, 2019

(54) MEMORY DEVICE AND METHOD FOR MANUFACTURING THE SAME

(71) Applicant: TAIWAN SEMICONDUCTOR MANUFACTURING CO., LTD., Hsinchu (TW)

(72) Inventors: Tsung-Yu Yang, Tainan (TW); Chung-Jen Huang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/937,954

(22) Filed: Mar. 28, 2018

Related U.S. Application Data

(60) Provisional application No. 62/590,698, filed on Nov. 27, 2017.

(51) Int. Cl.
| | |
|---|---|
| *H01L 29/788* | (2006.01) |
| *H01L 29/423* | (2006.01) |
| *H01L 27/11521* | (2017.01) |
| *H01L 29/06* | (2006.01) |
| *H01L 21/02* | (2006.01) |
| *H01L 29/66* | (2006.01) |
| *H01L 21/28* | (2006.01) |
| *H01L 21/265* | (2006.01) |
| *H01L 21/324* | (2006.01) |

(52) U.S. Cl.
CPC .. *H01L 29/42336* (2013.01); *H01L 21/02236* (2013.01); *H01L 21/26513* (2013.01); *H01L 21/28273* (2013.01); *H01L 21/324* (2013.01); *H01L 27/11521* (2013.01); *H01L 29/0649* (2013.01); *H01L 29/42328* (2013.01); *H01L 29/66825* (2013.01); *H01L 29/7884* (2013.01)

(58) Field of Classification Search
USPC ..... 257/319, E27.103, E21.682, E29.3, 315, 257/E21.209, E21.422, E21.69, E21.679, 257/E29.129, E21.423, 390, E21.662, 257/E21.68, E21.683, E29.17, E29.242, 257/E29.307, E29.309, 314; 438/211, 438/587, 700, 128
See application file for complete search history.

(56) References Cited

U.S. PATENT DOCUMENTS

| | | | | |
|---|---|---|---|---|
| 7,544,989 B2* | 6/2009 | Forbes | .............. | H01L 27/11521 257/314 |
| 2009/0242959 A1* | 10/2009 | Lin | .................. | H01L 21/28273 257/319 |

* cited by examiner

*Primary Examiner* — Niki H Nguyen
(74) *Attorney, Agent, or Firm* — McClure, Qualey & Rodack, LLP

(57) ABSTRACT

A memory device includes a substrate and a floating gate memory cell. The floating gate memory cell includes an erase gate structure disposed on the substrate, a first floating gate structure, a second floating gate structure, a first word line, a common source, a second word line, a first spacer and a second spacer. The first floating gate structure and the second floating gate structure are recessed in the substrate at two opposite sides of the erase gate structure. The first word line and the second word line are respectively adjacent to the first floating gate structure and the second floating gate structure. The common source is disposed in the substrate under the erase gate structure. The first word line and the second word line may be metal gates of high-k metal gate structures.

20 Claims, 43 Drawing Sheets

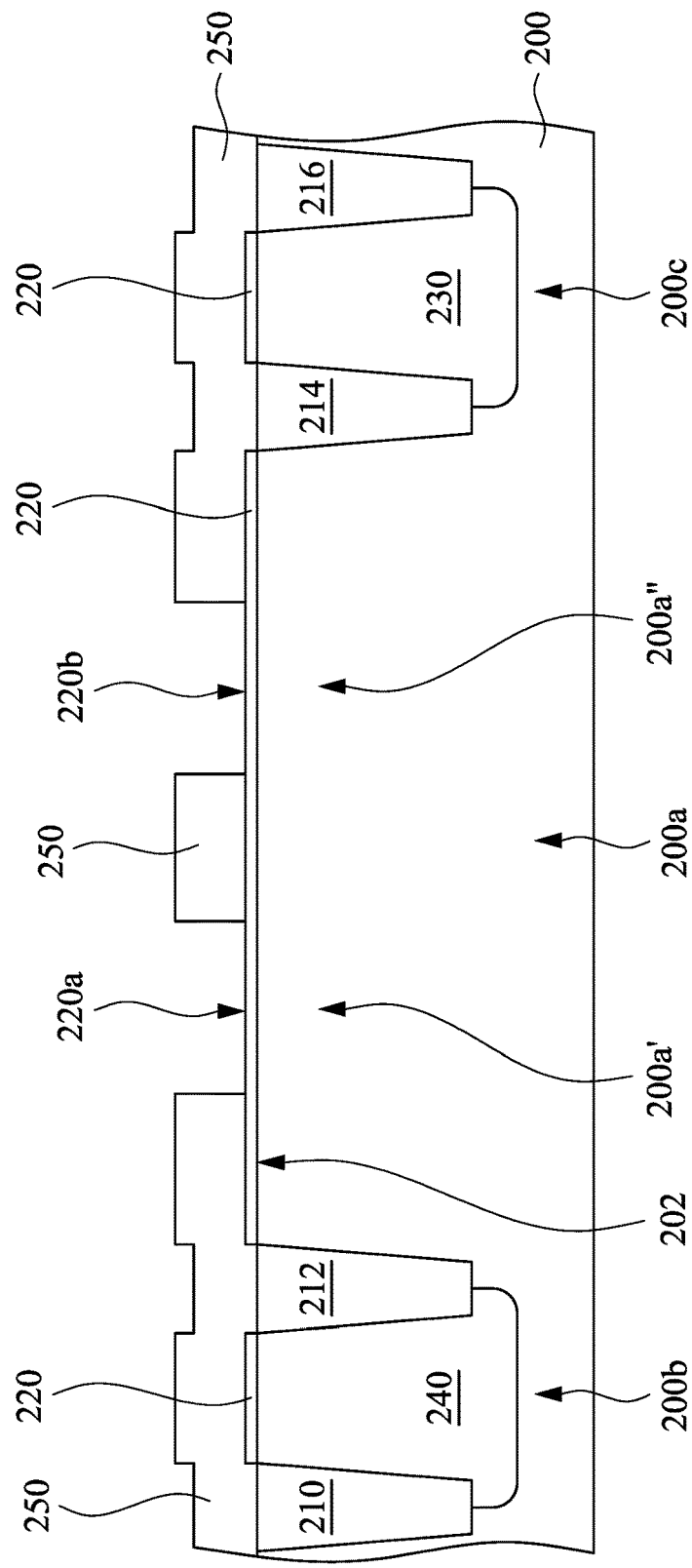
FIG. 2B(1)

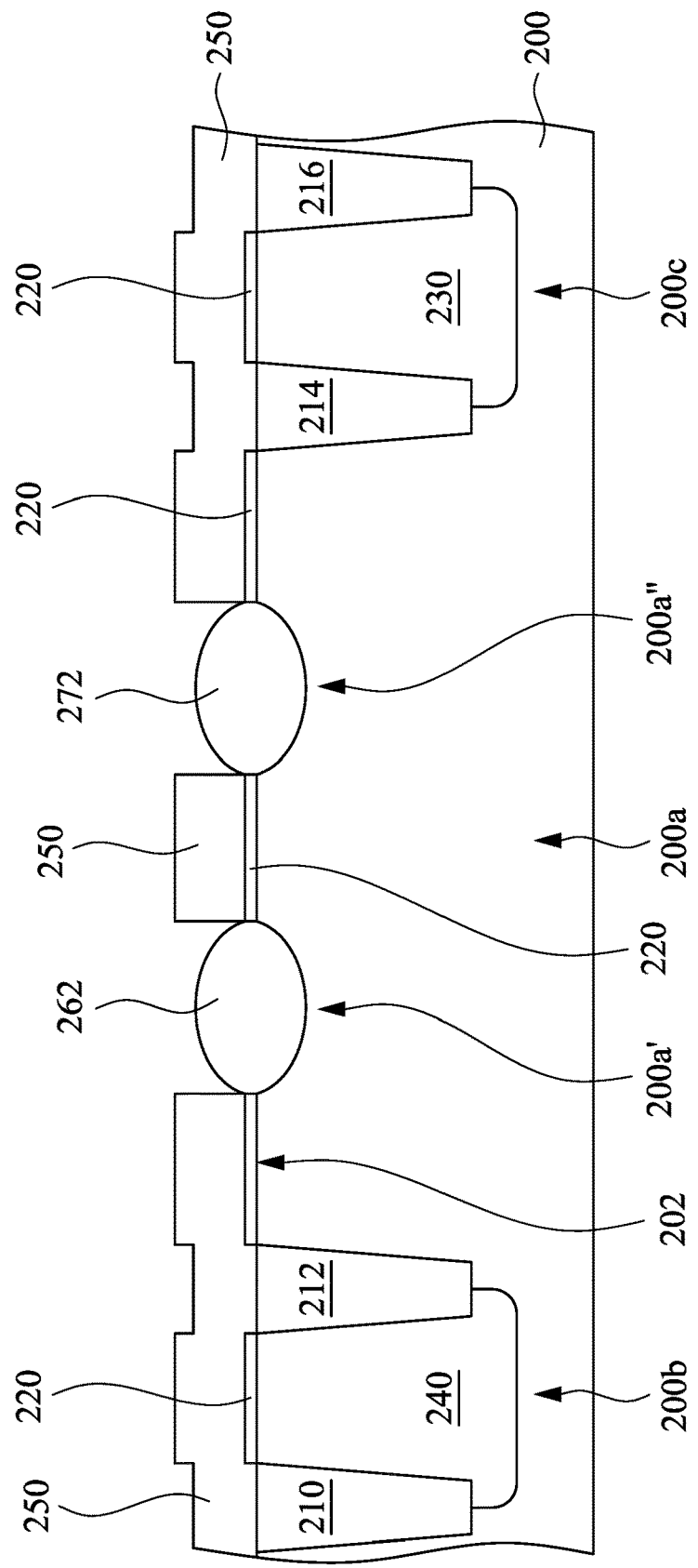
FIG. 2B(2)

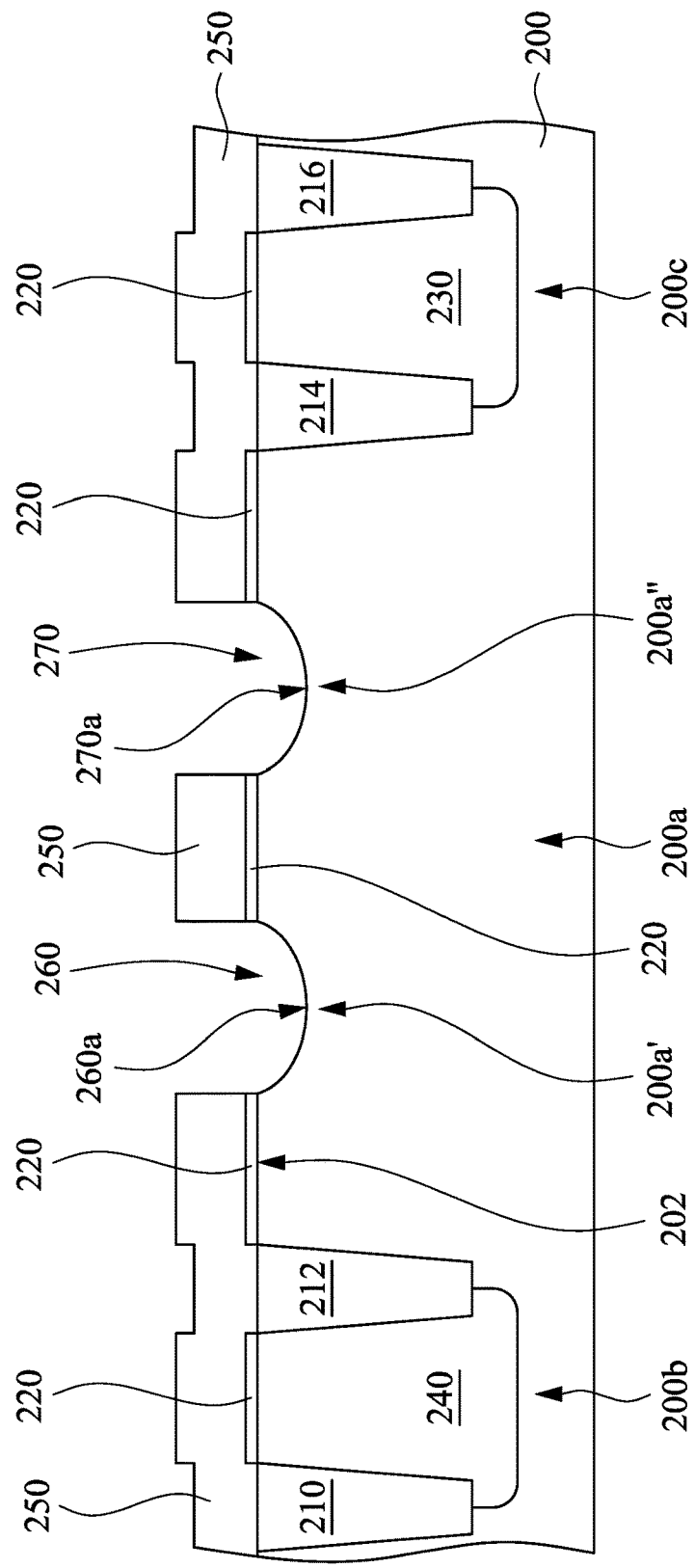
FIG. 2B(3)

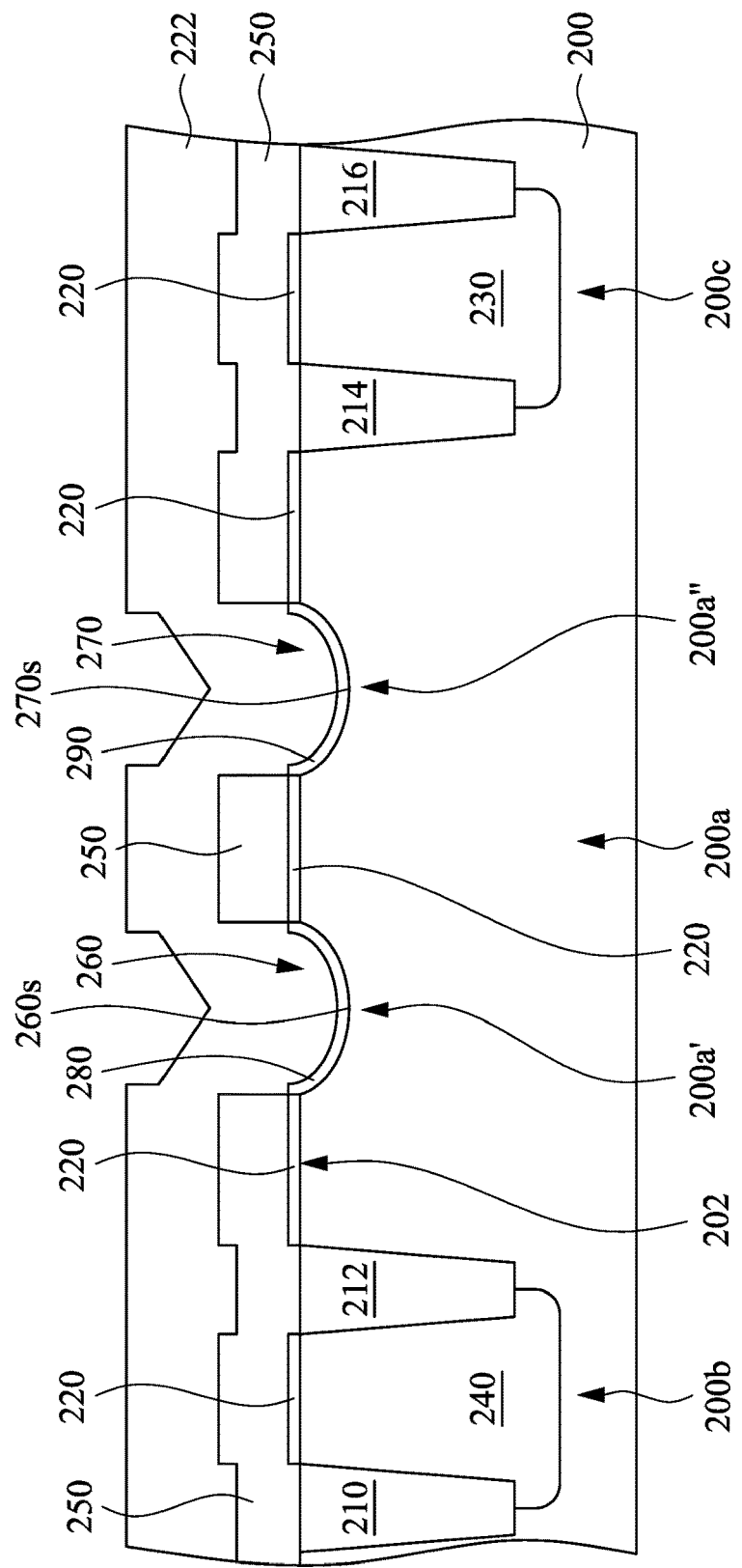
FIG. 2C(1)

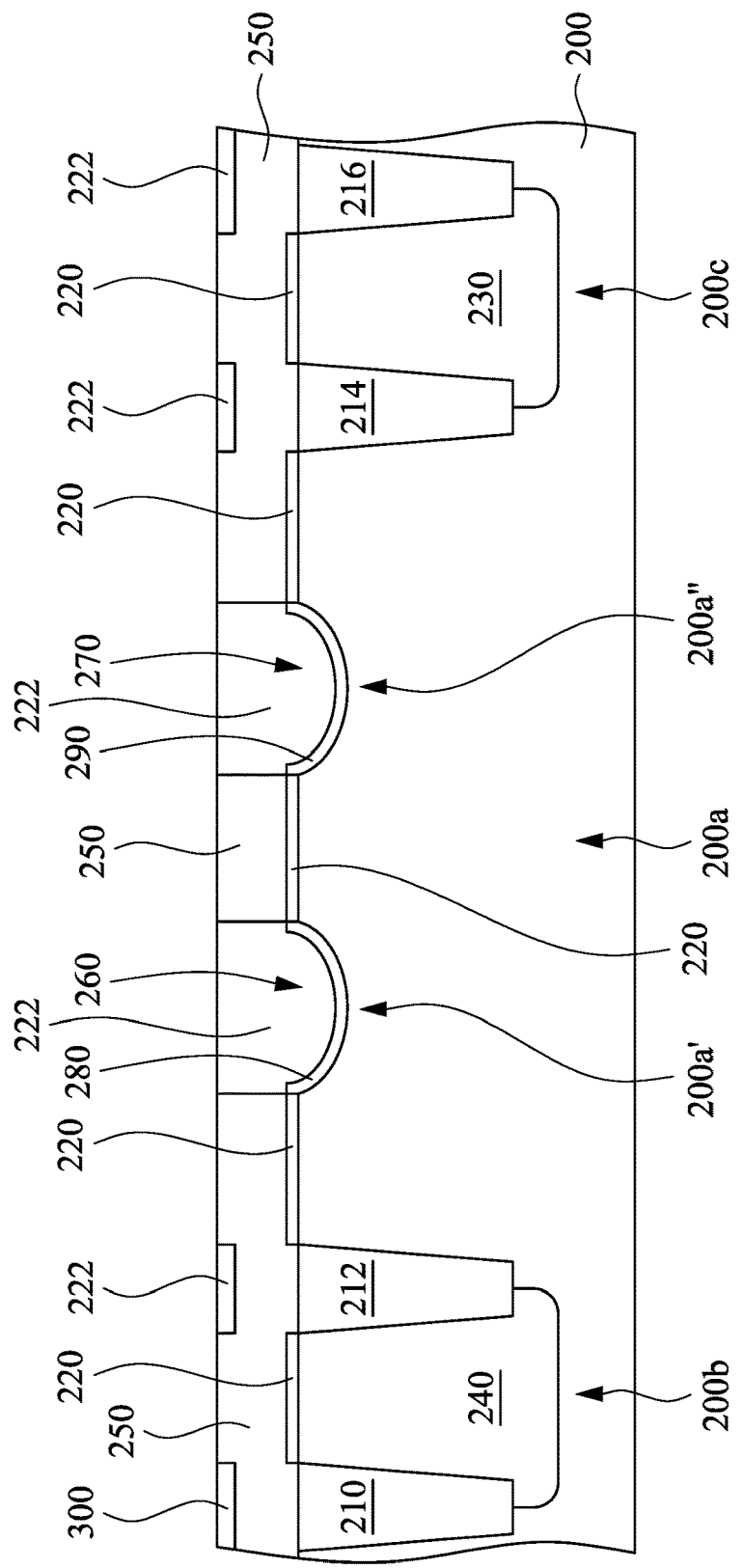
FIG. 2C(2)

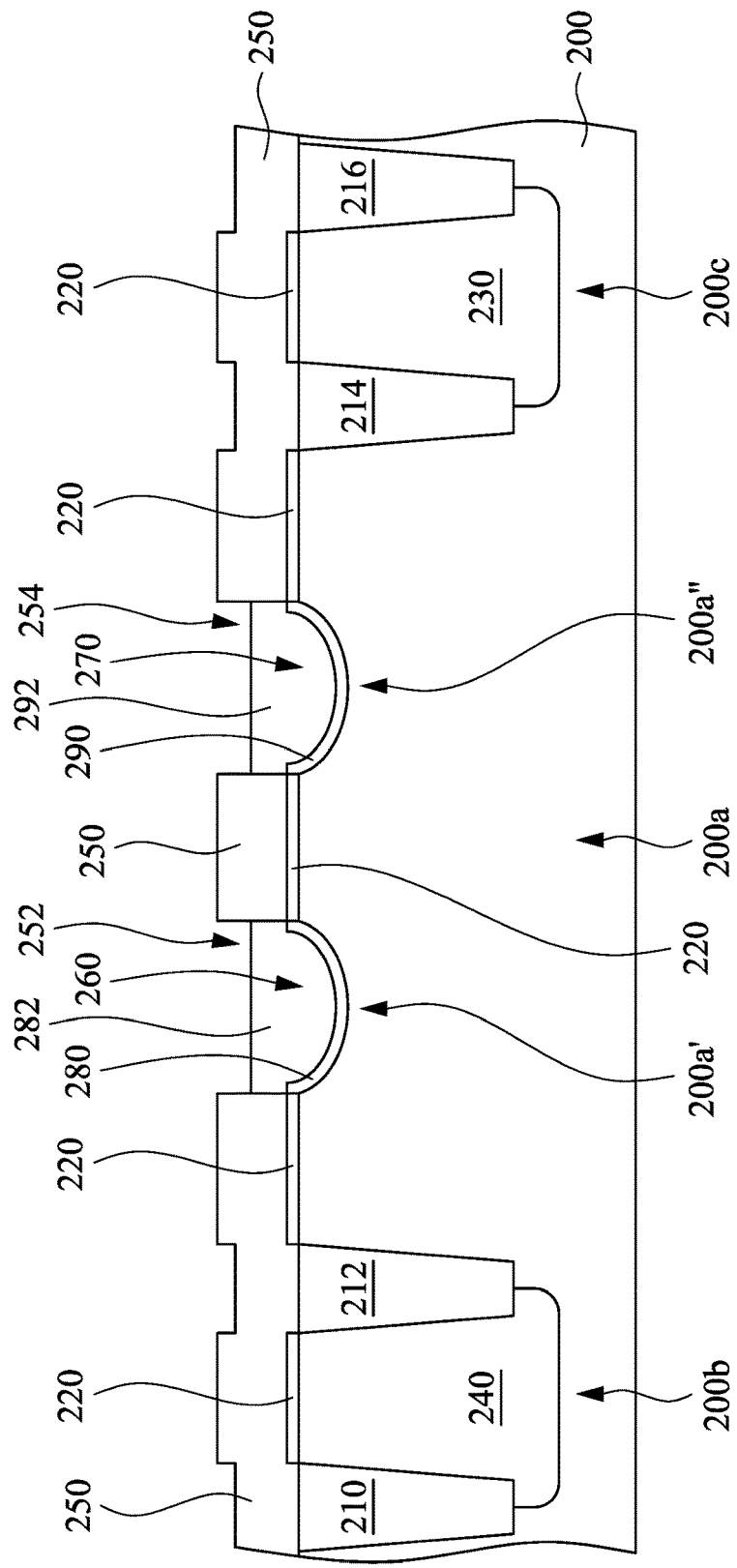
FIG. 2C(3)

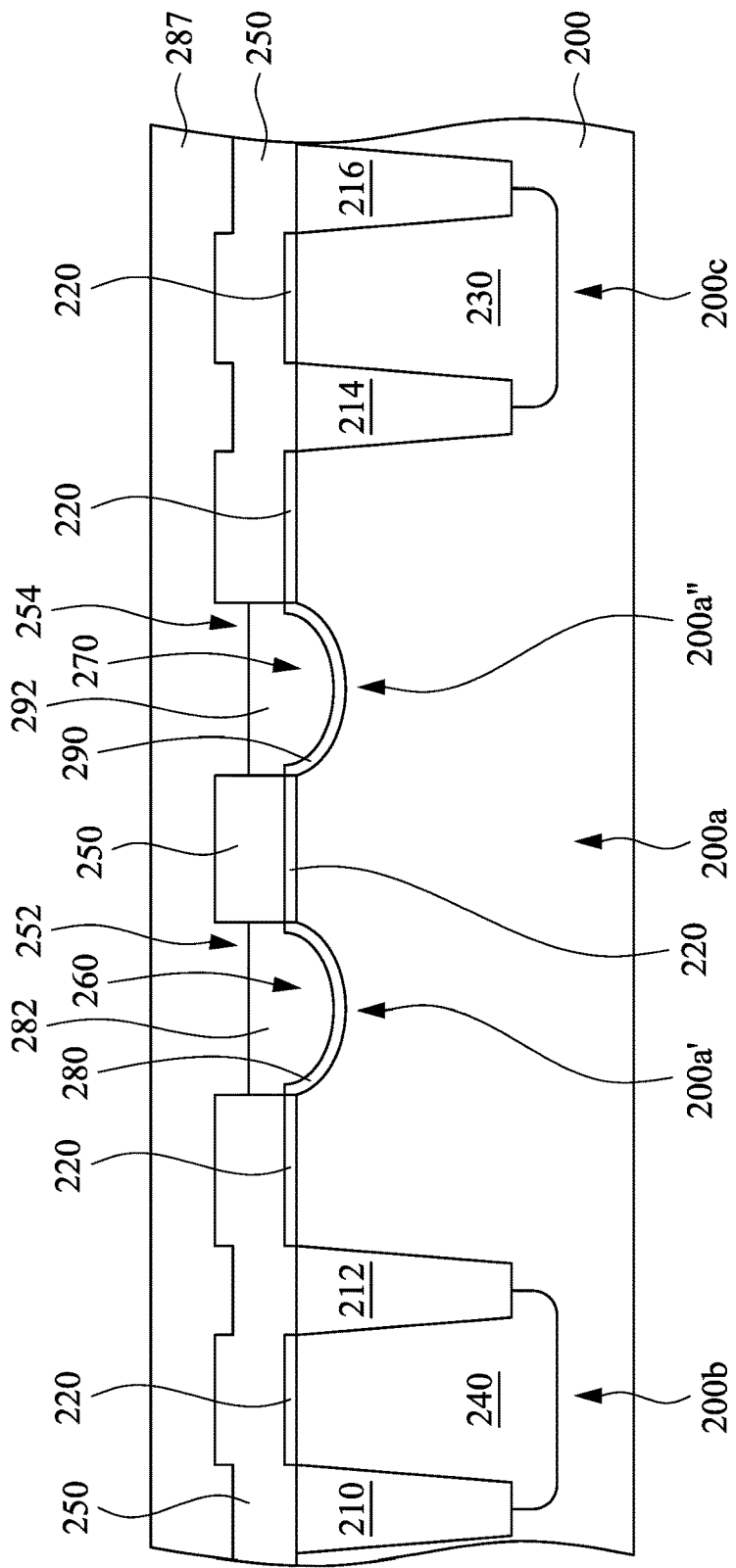
FIG. 2C(4)

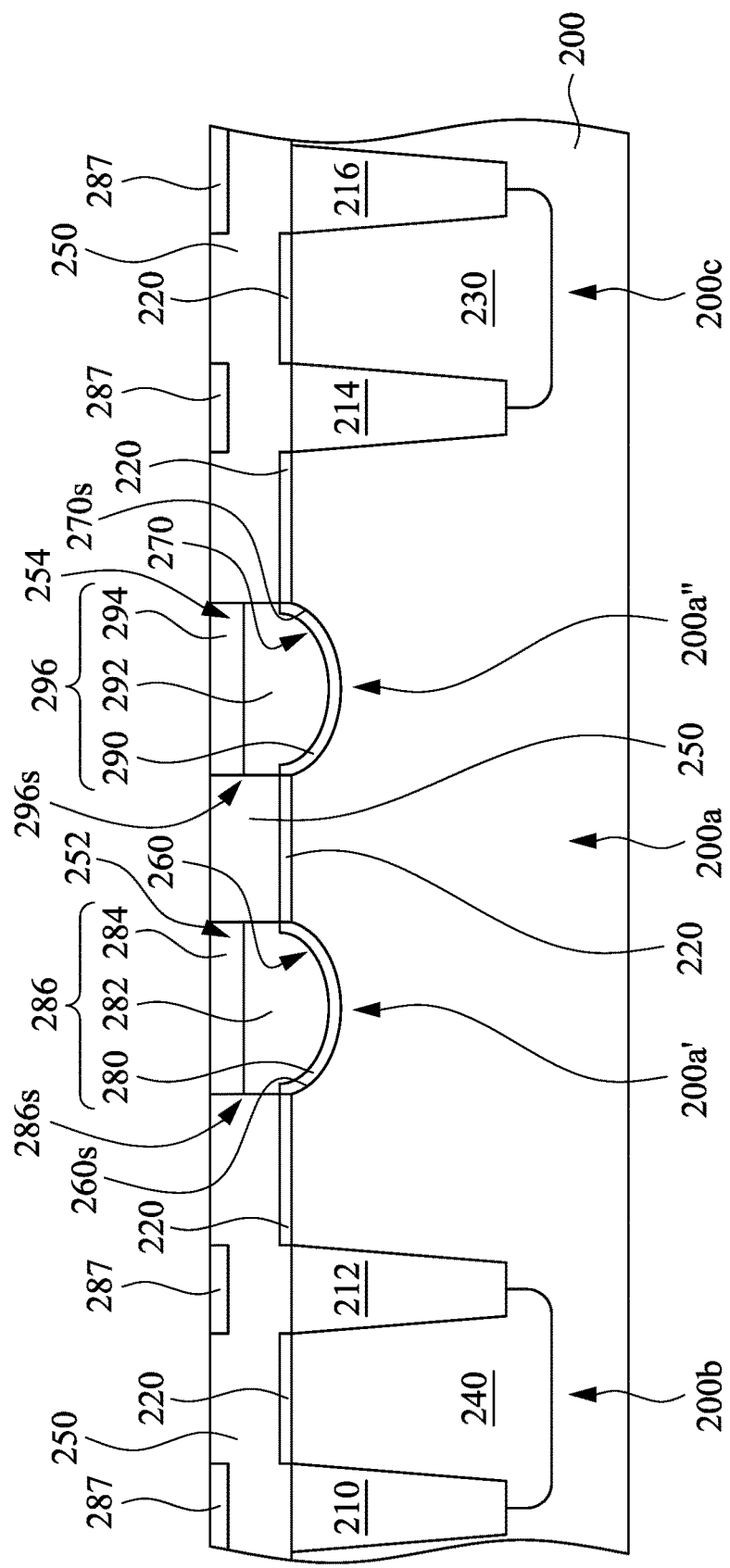
FIG. 2C(5)

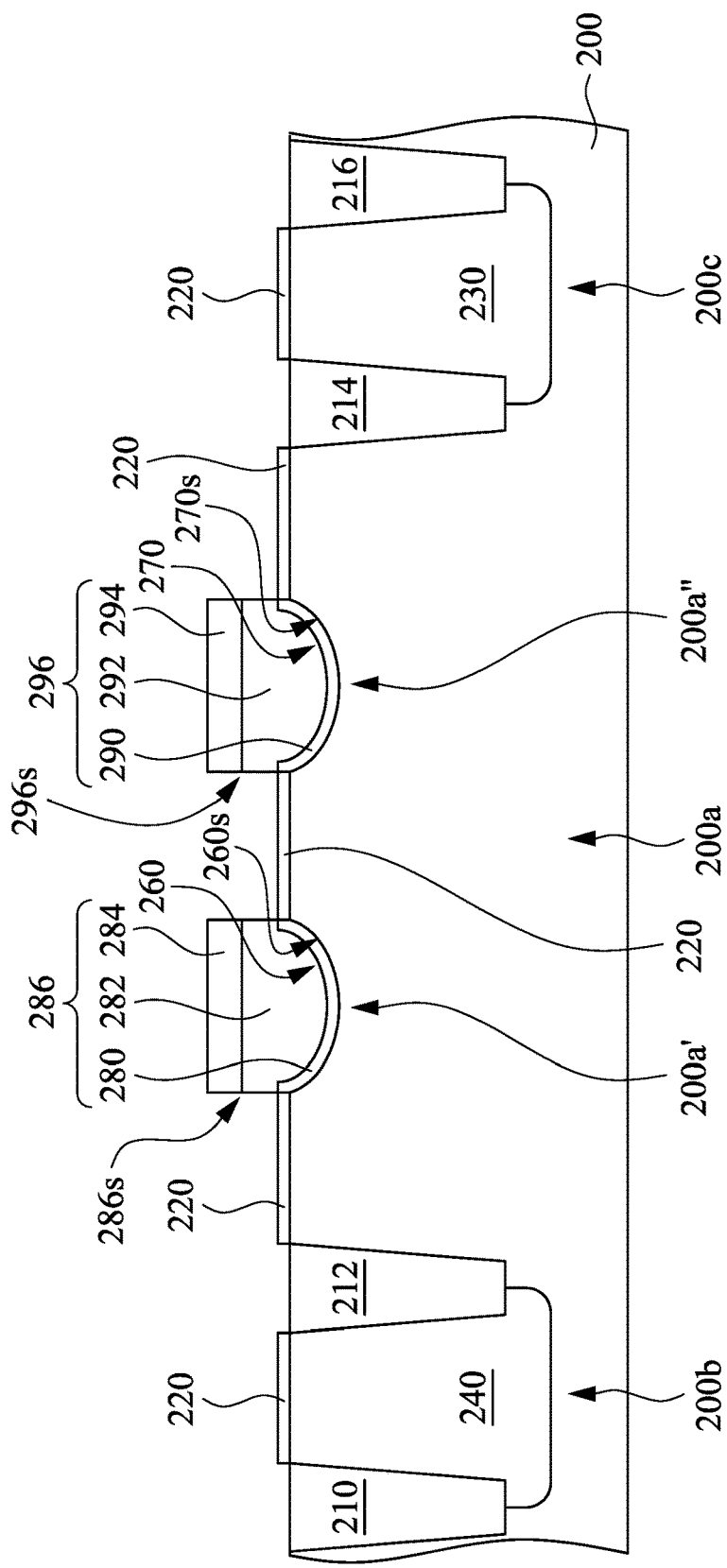
FIG. 2C(6)

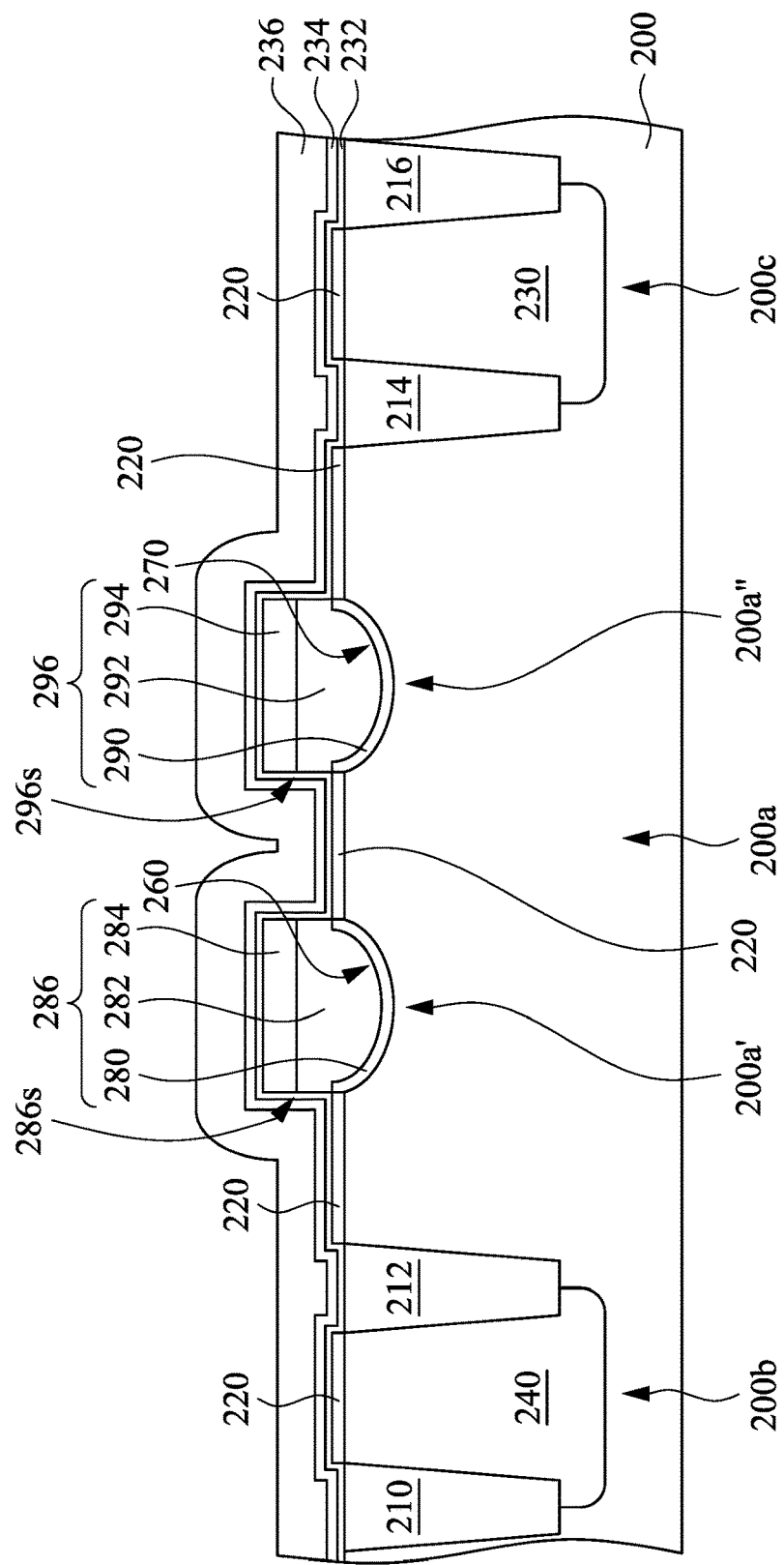
FIG. 2D(1)

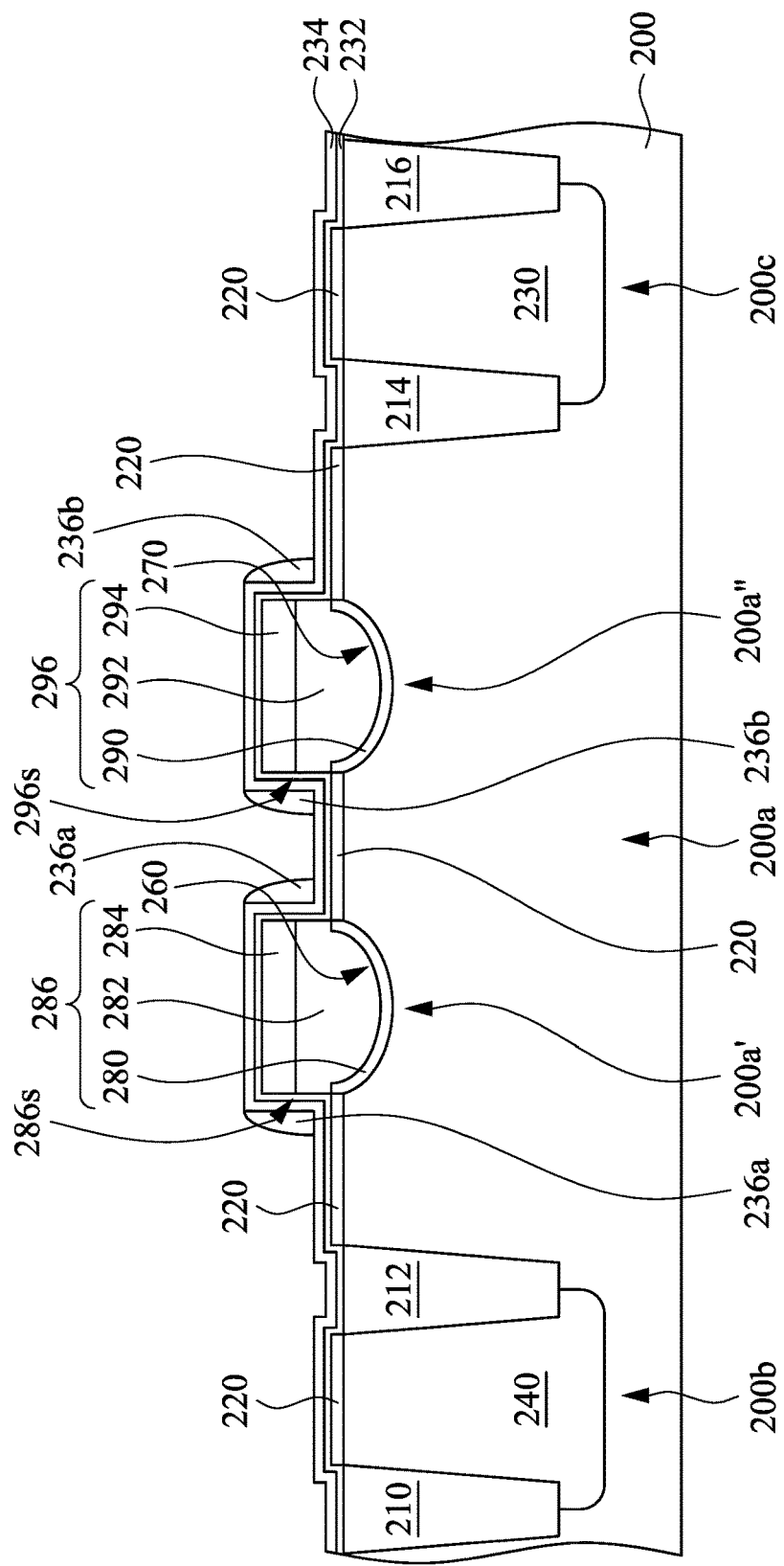
FIG. 2D(2)

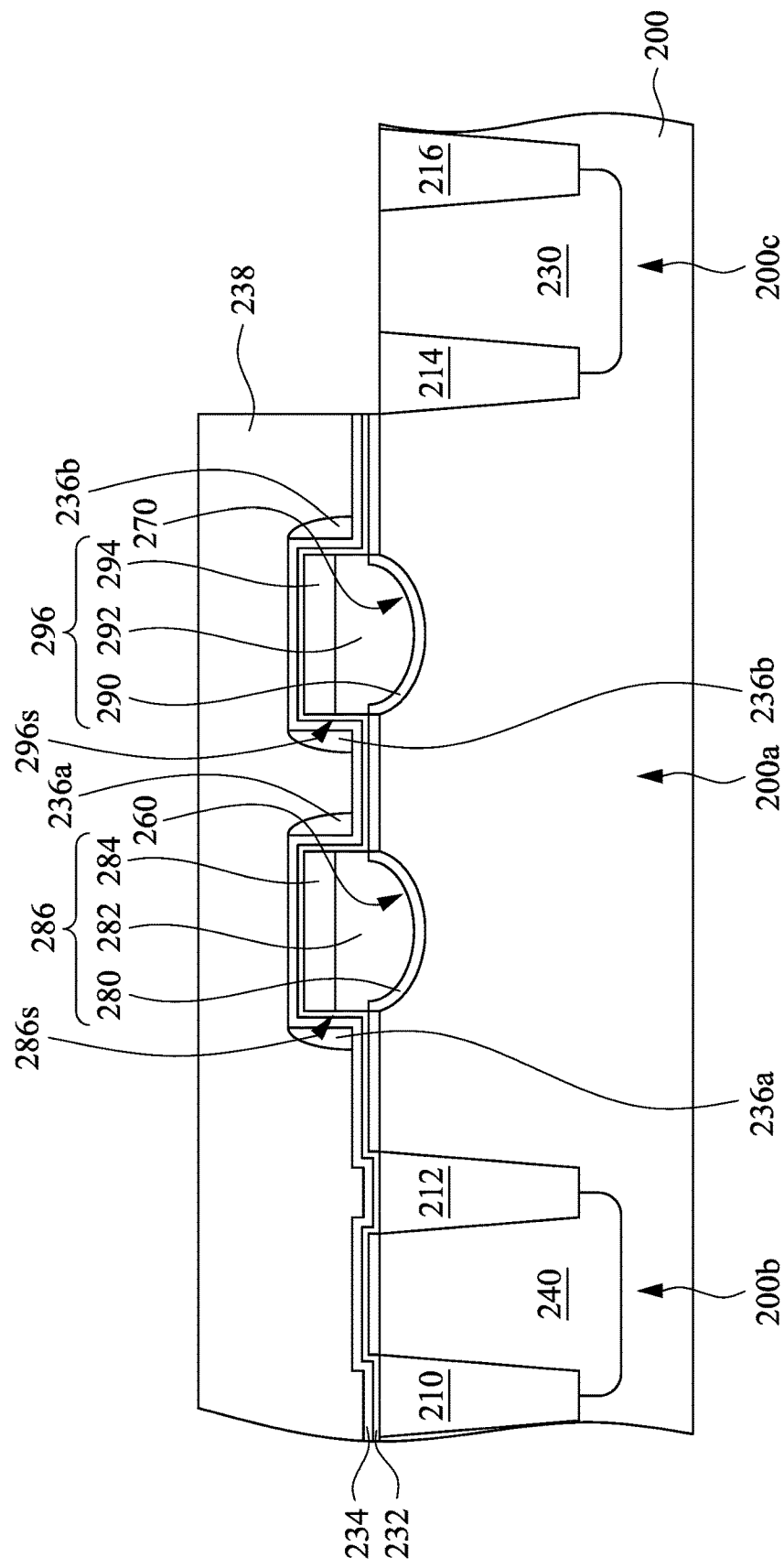
FIG. 2D(3)

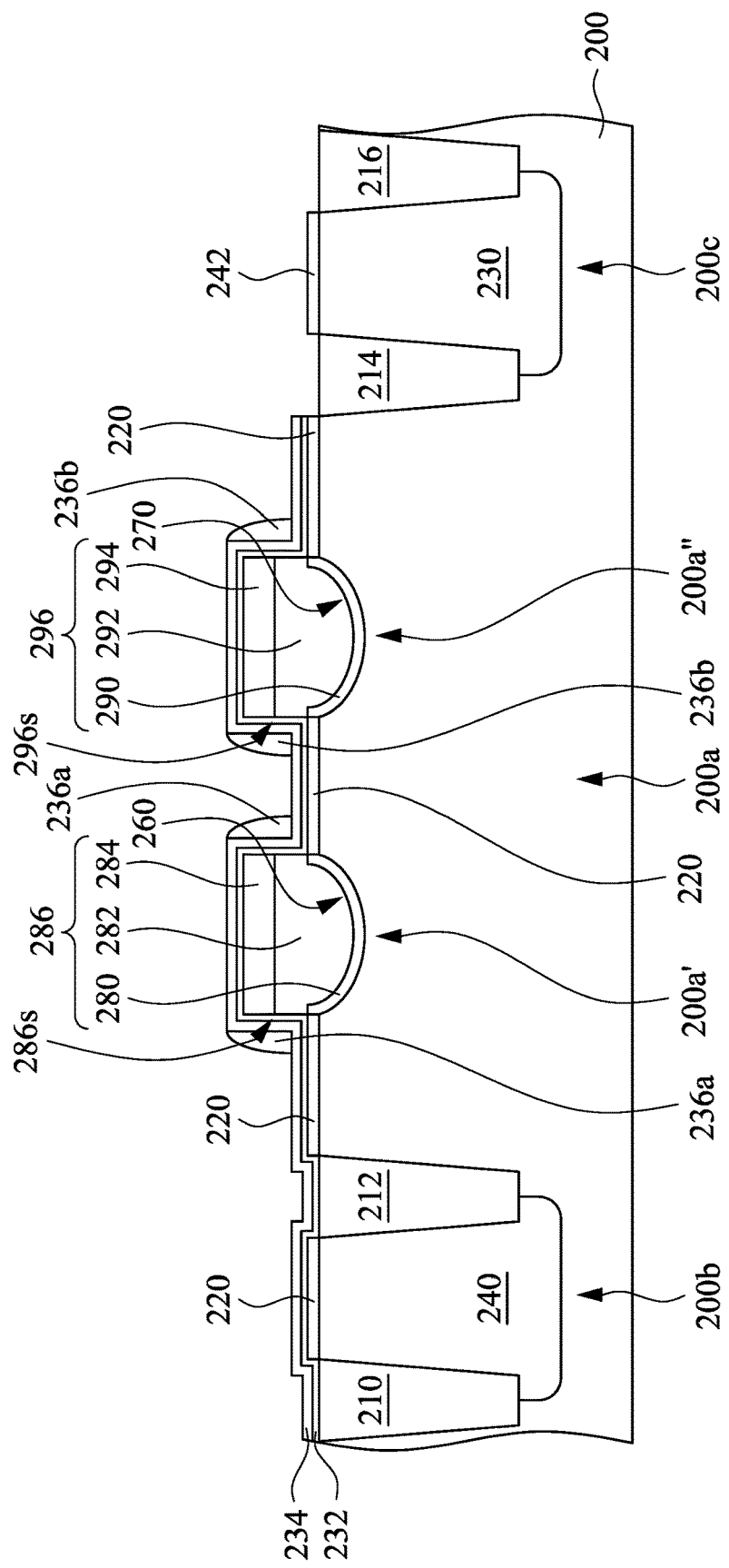
FIG. 2D(4)

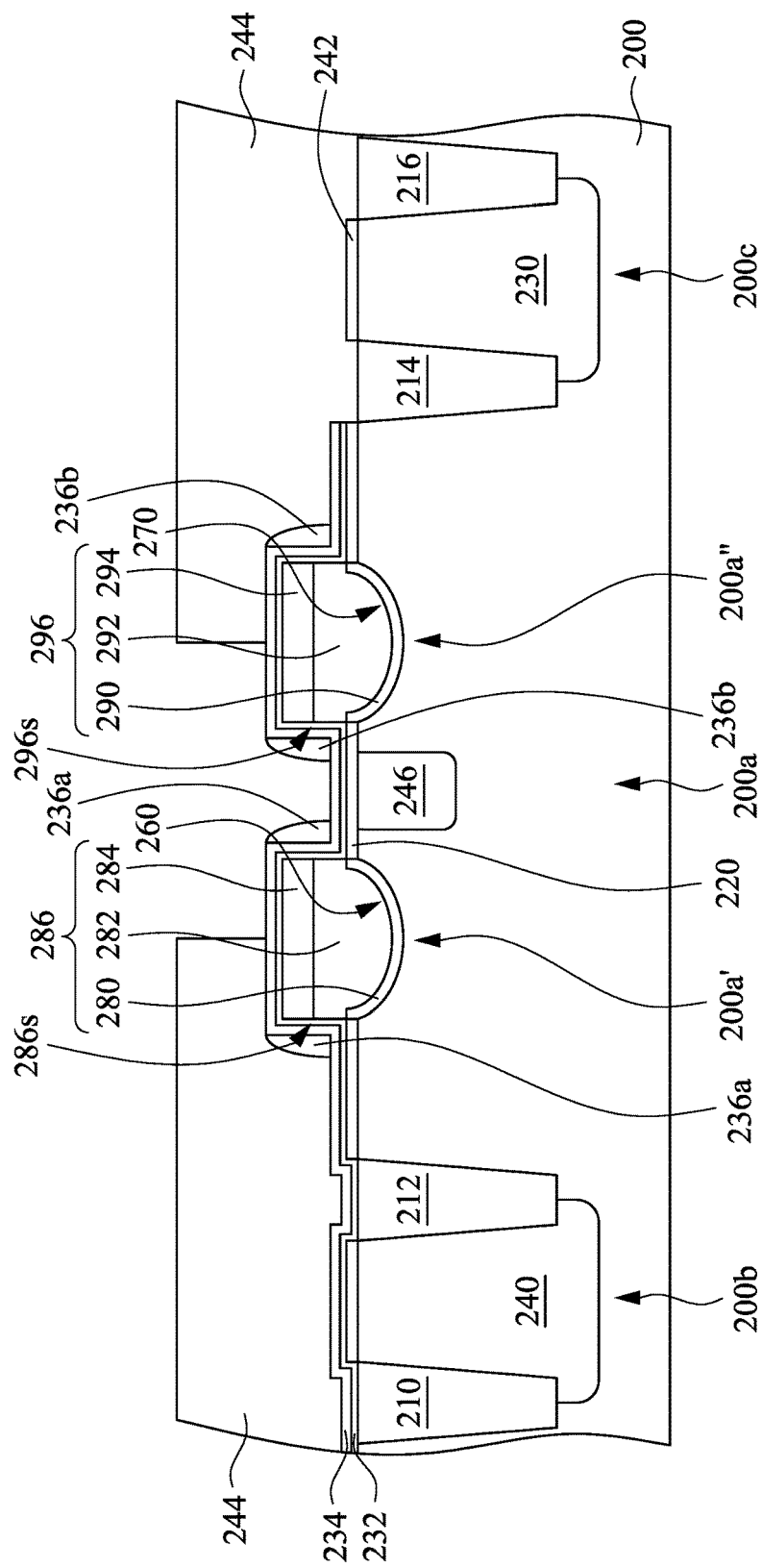
FIG. 2D(5)

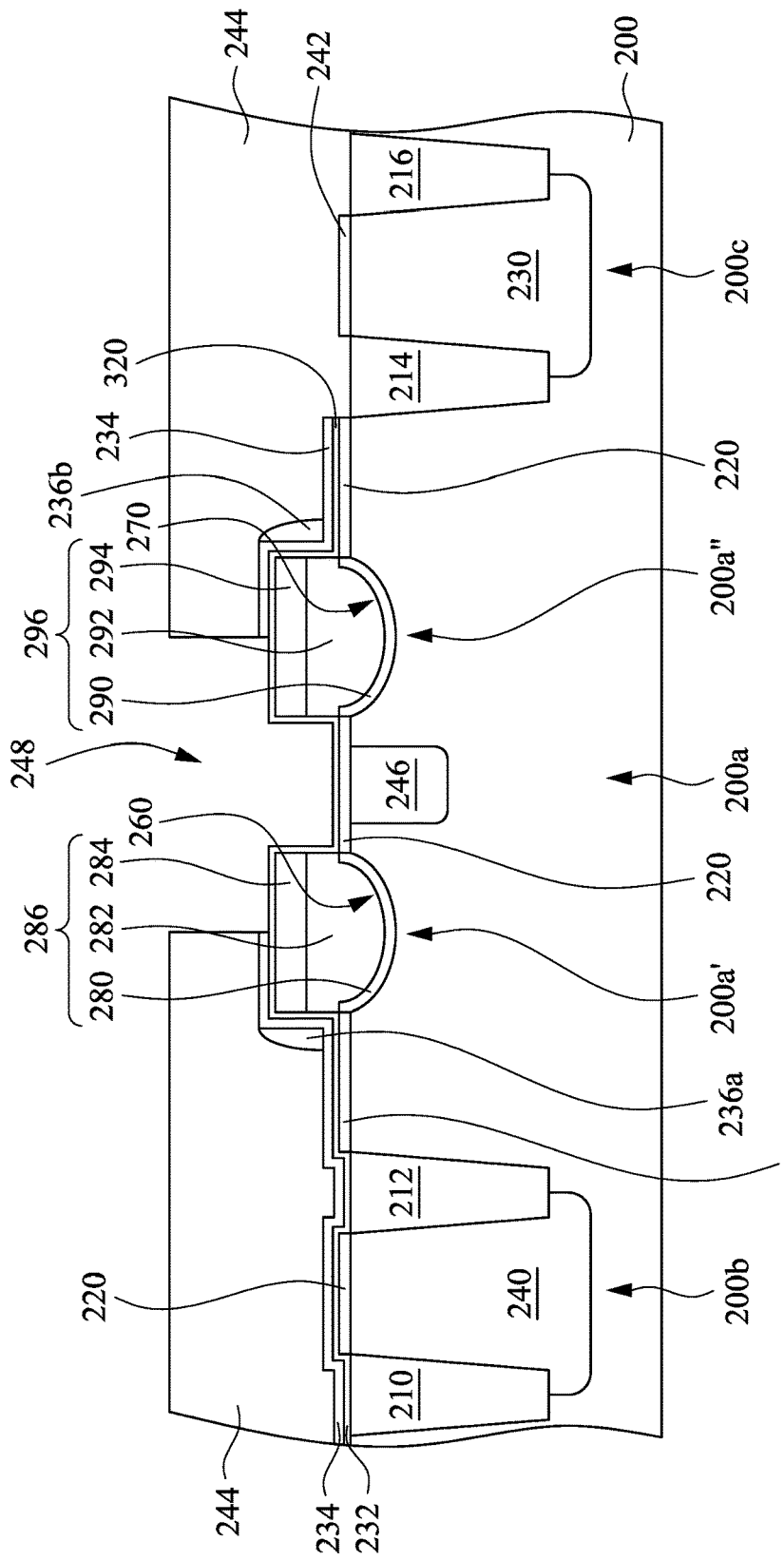
FIG. 2E(1)

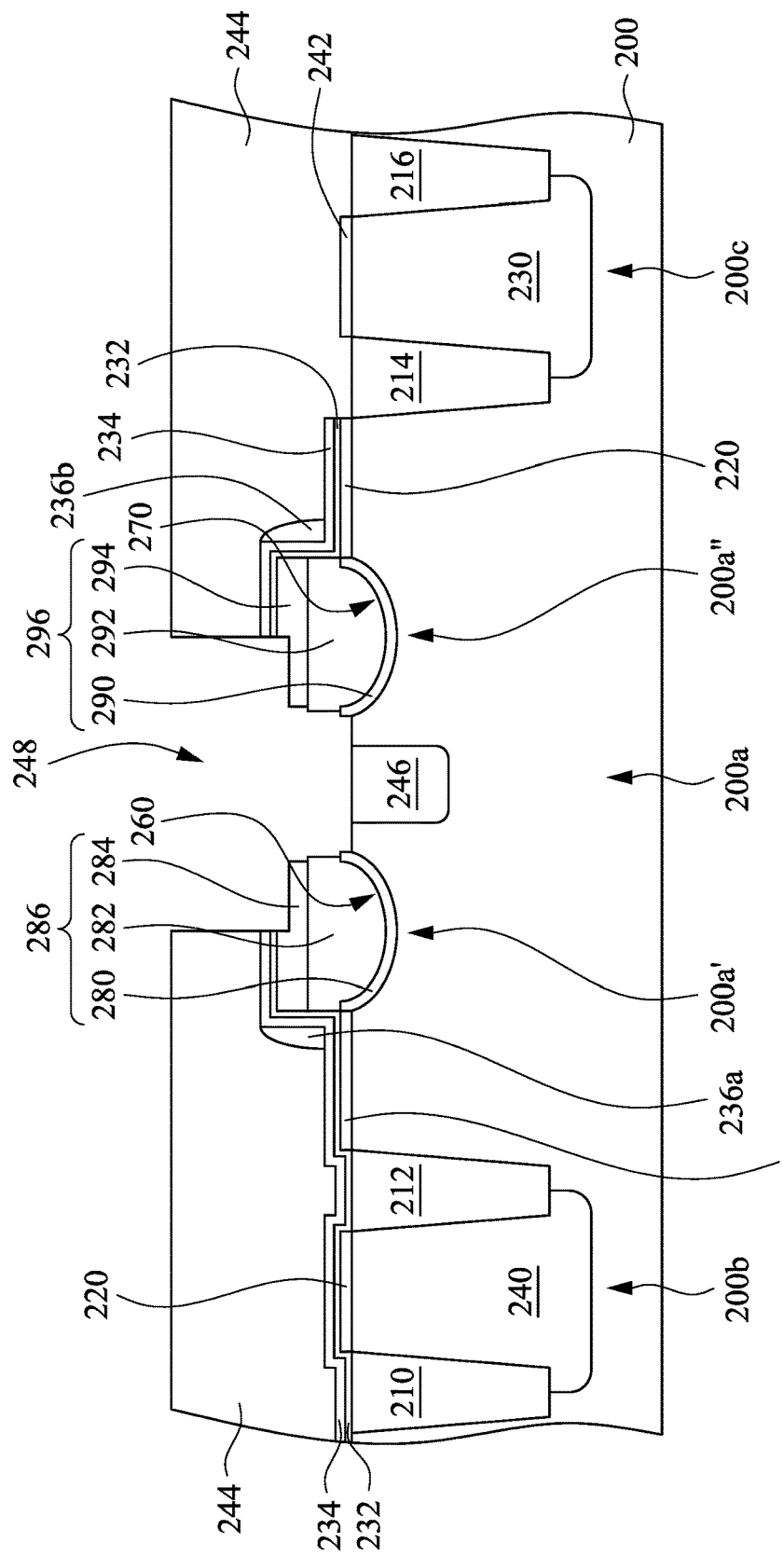
FIG. 2E(2)

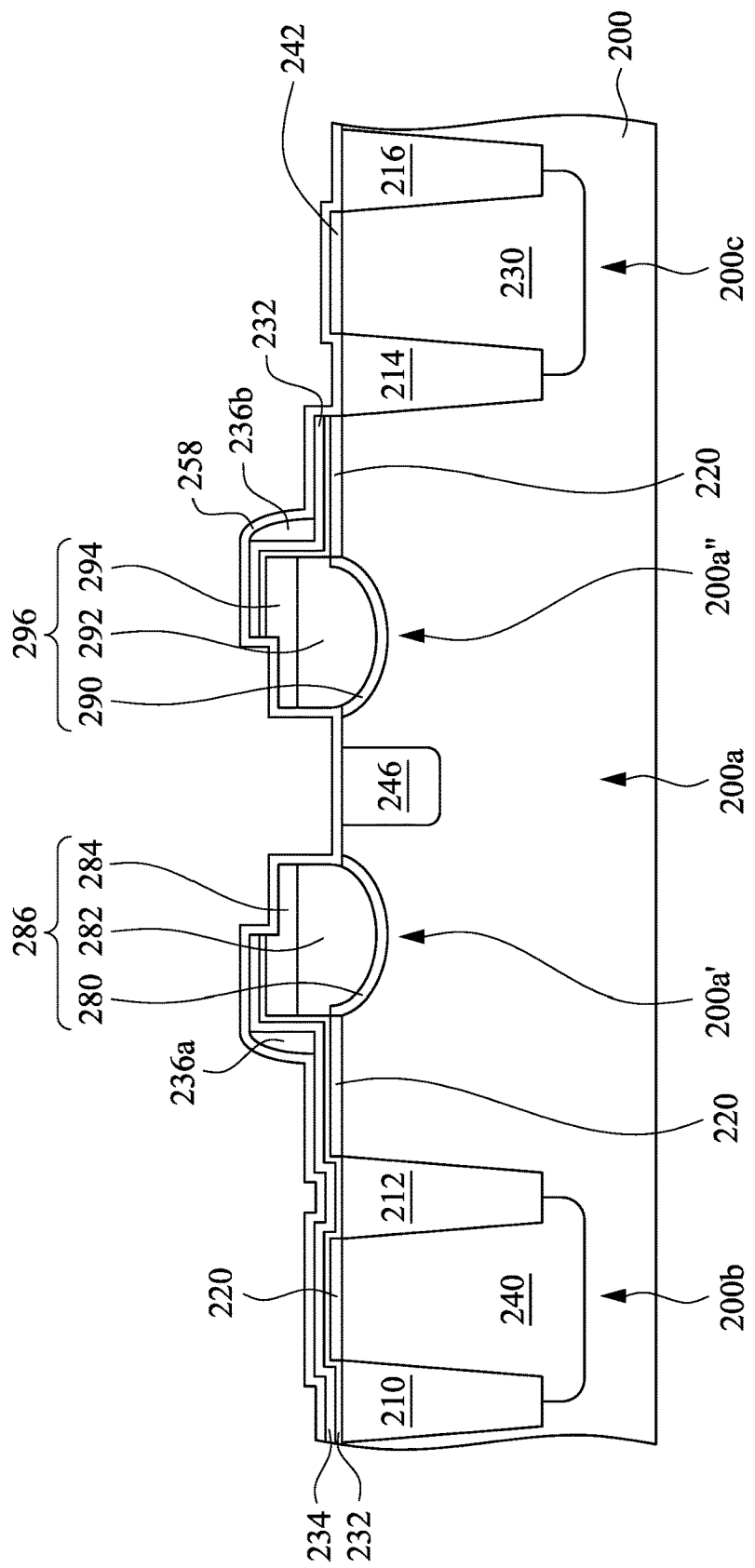
FIG. 2E(3)

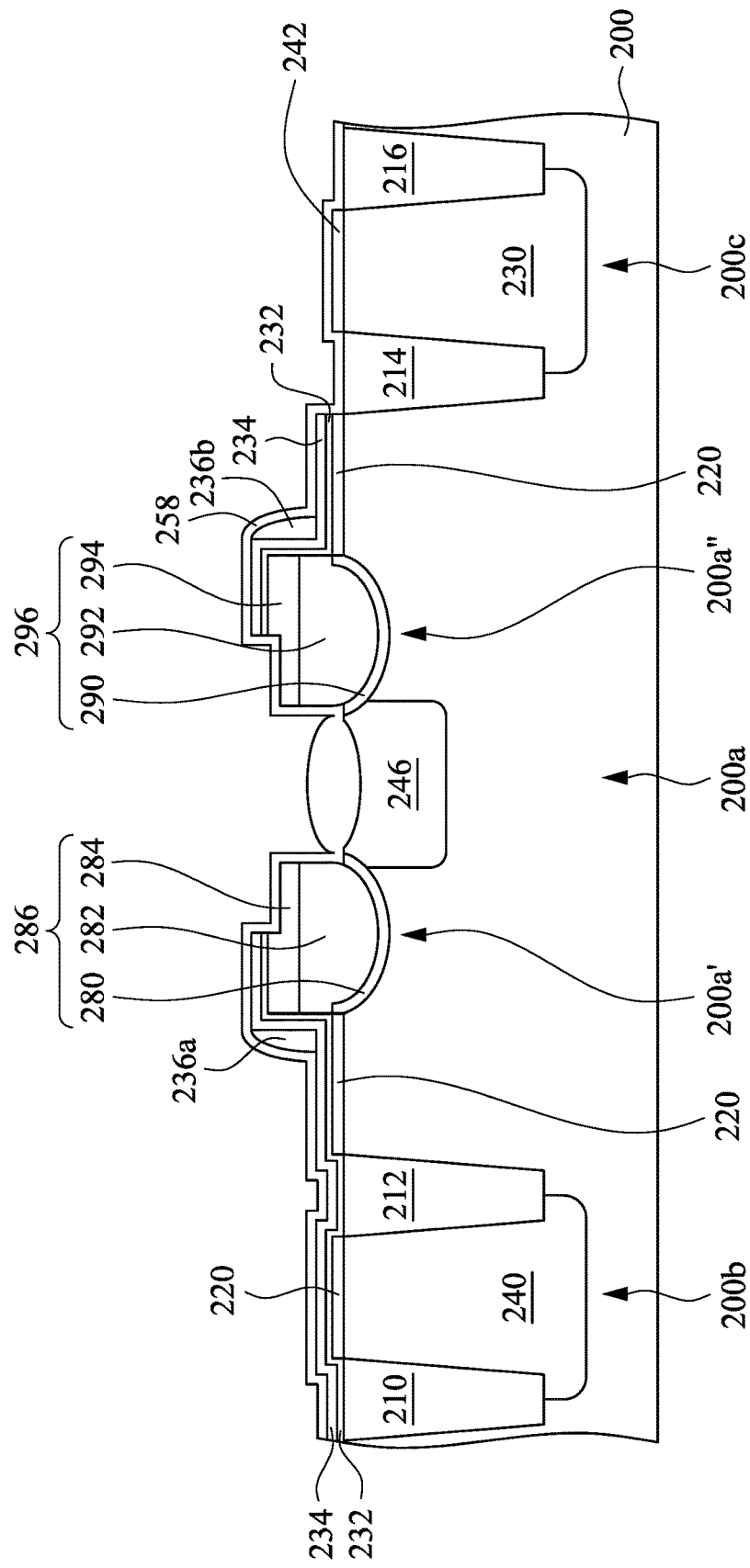
FIG. 2E(4)

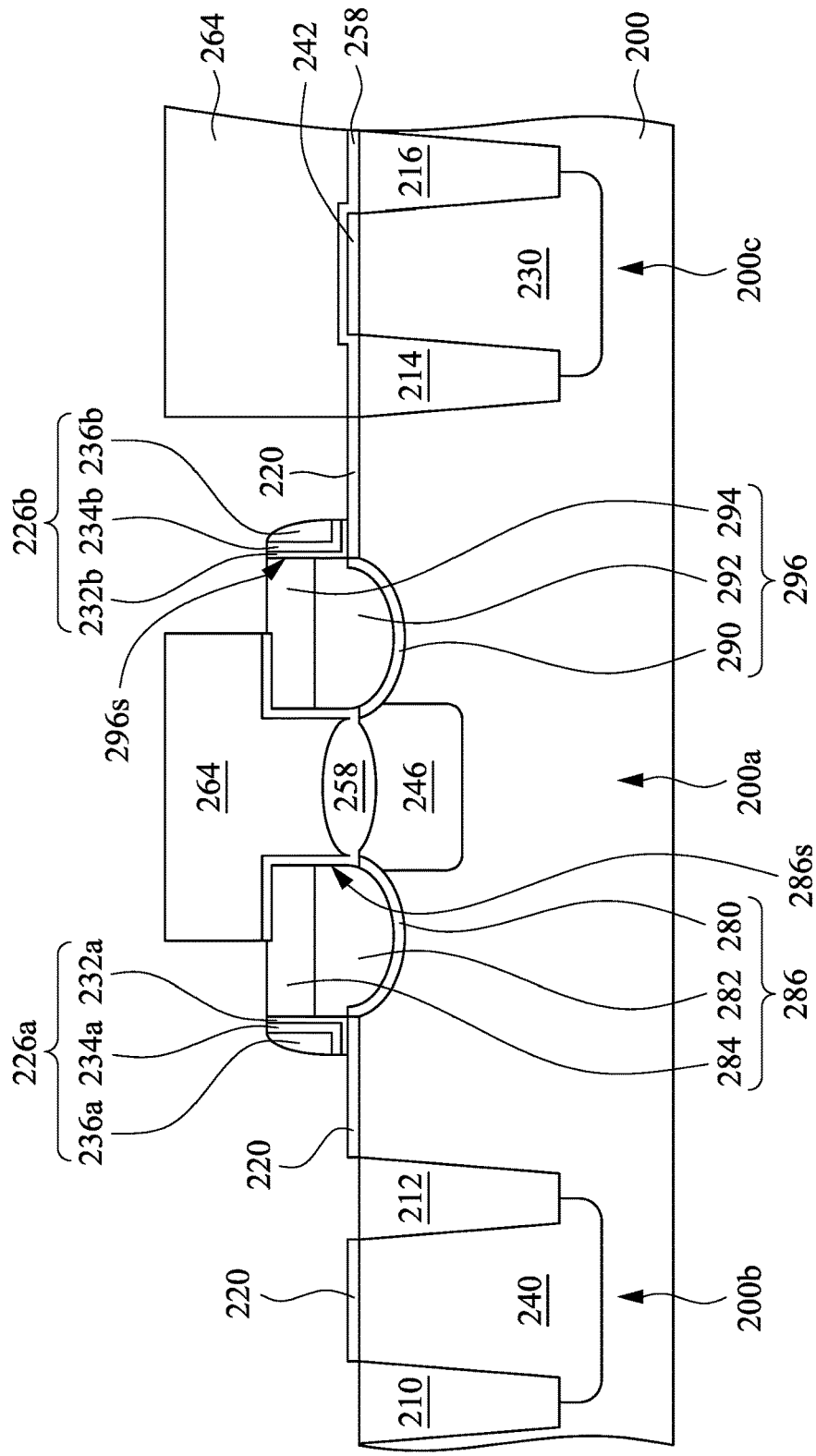
FIG. 2E(5)

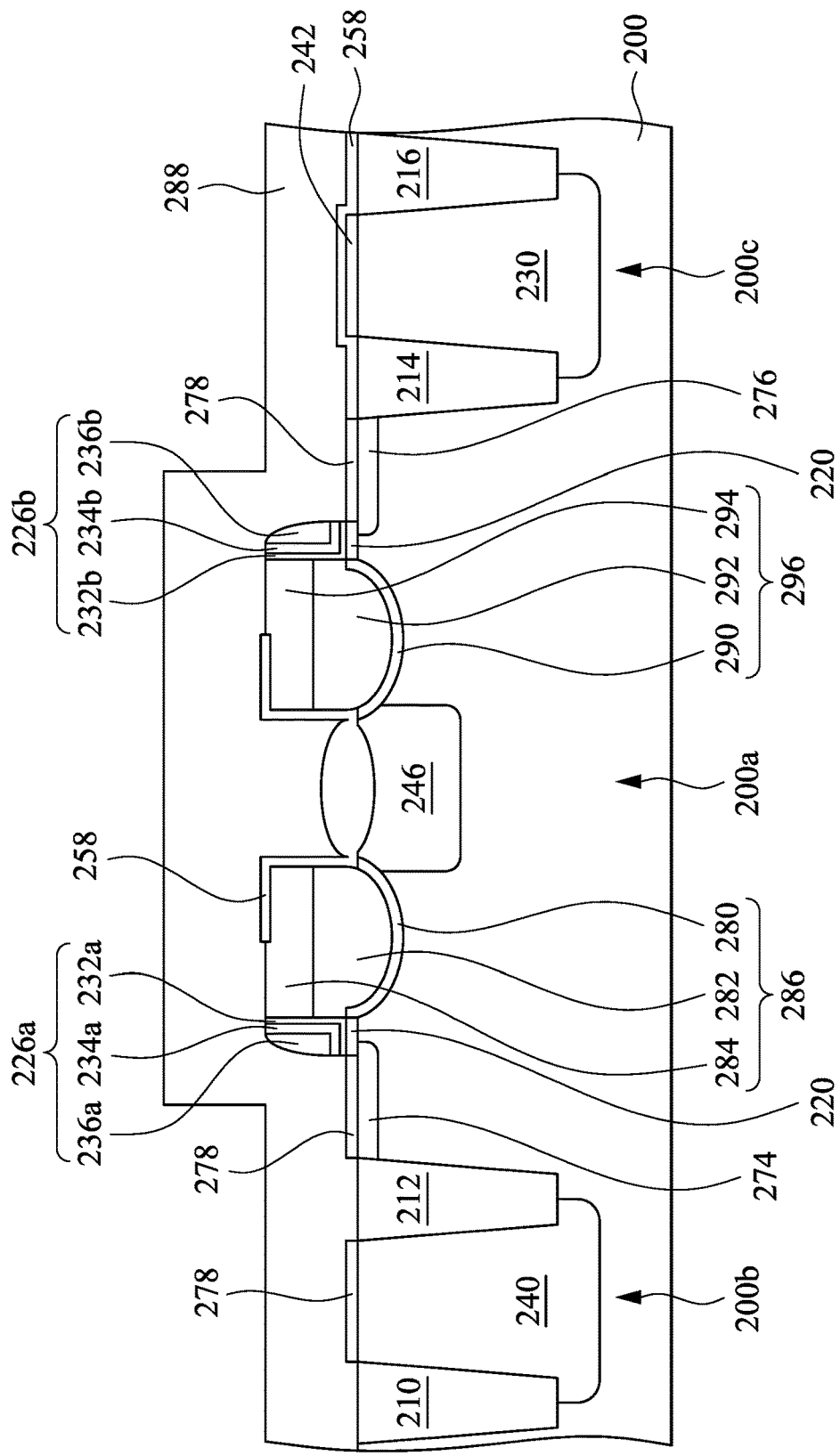
FIG. 2H(1)

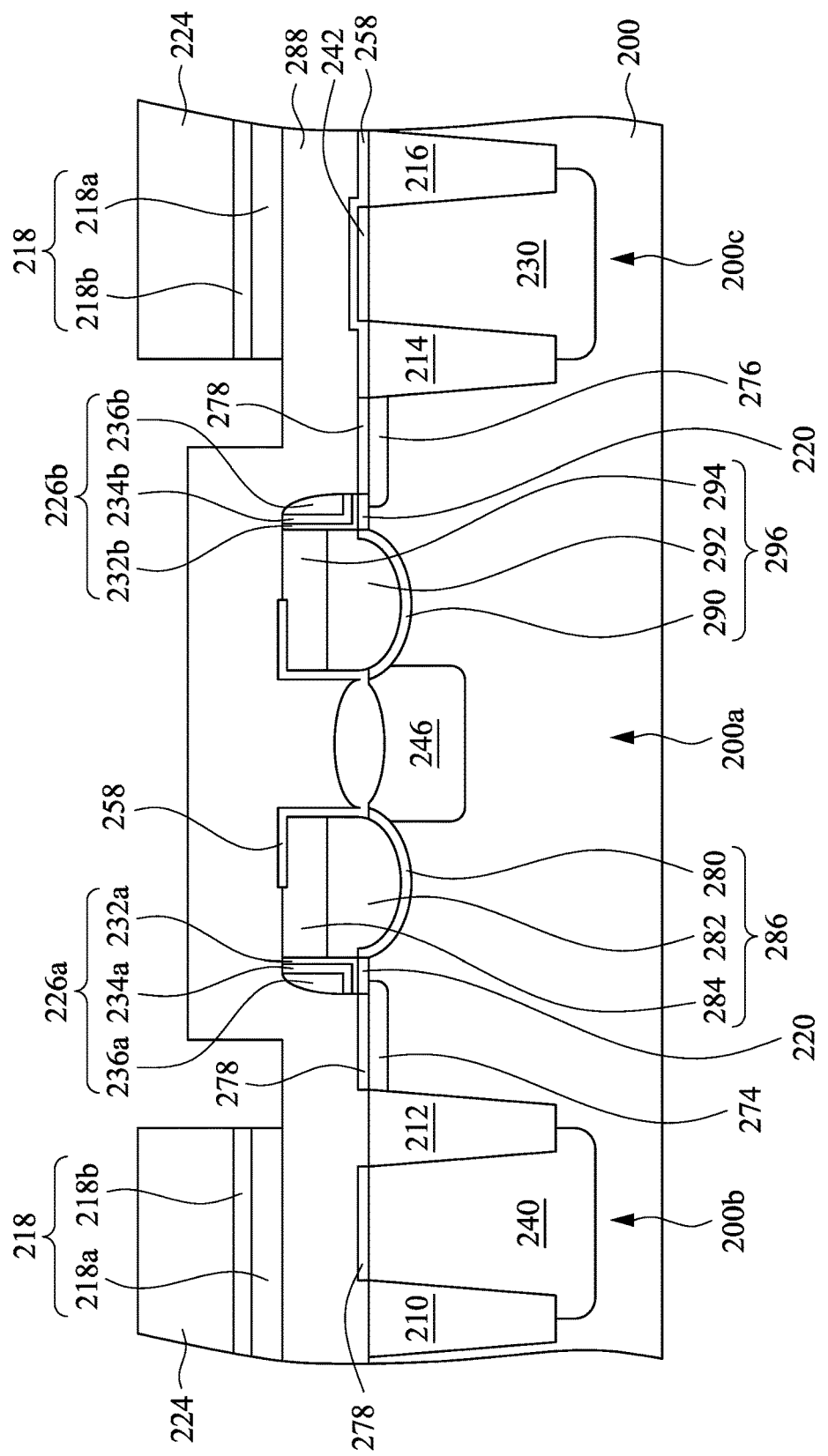
FIG. 2H(2)

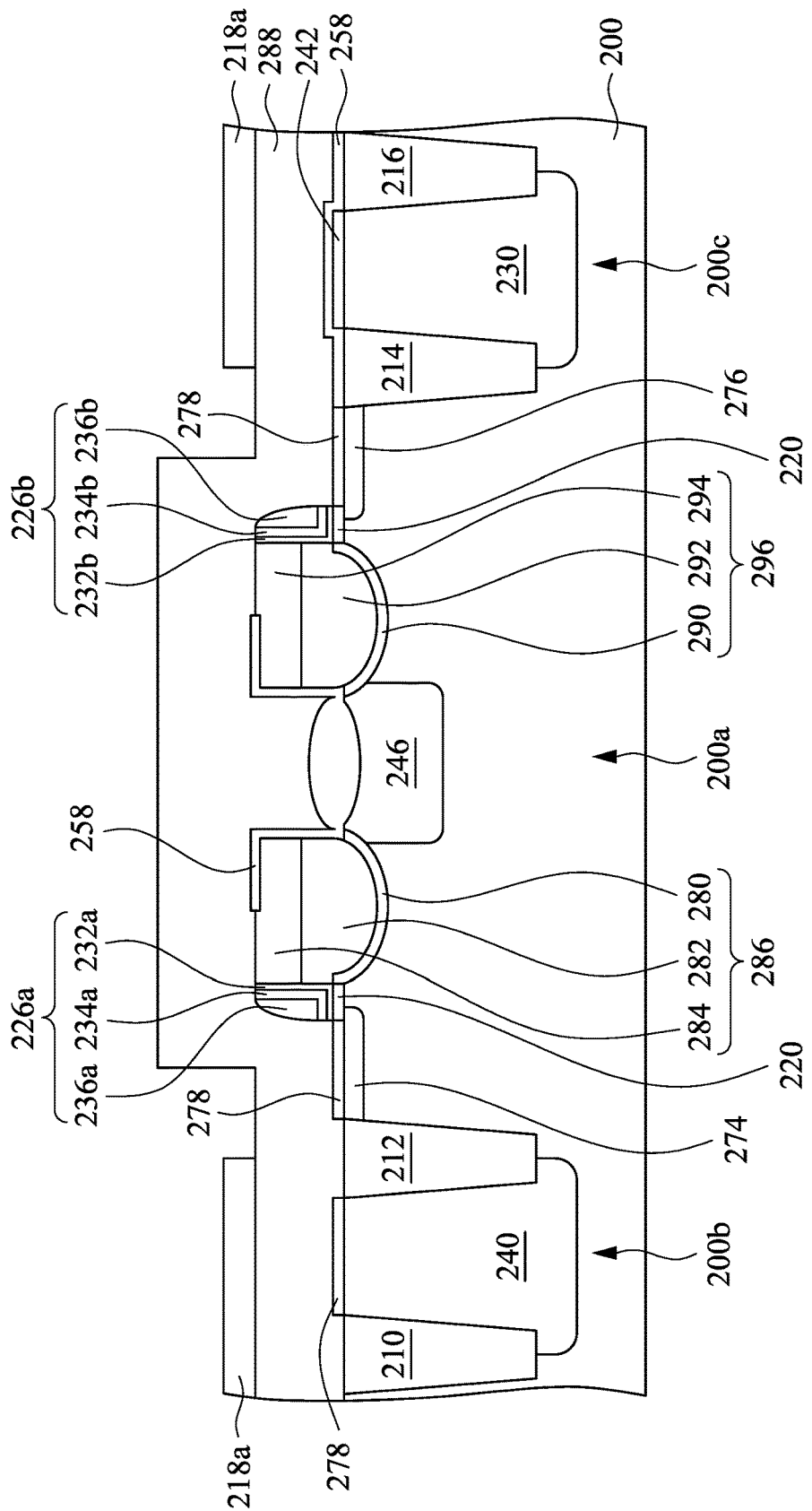
FIG. 2H(3)

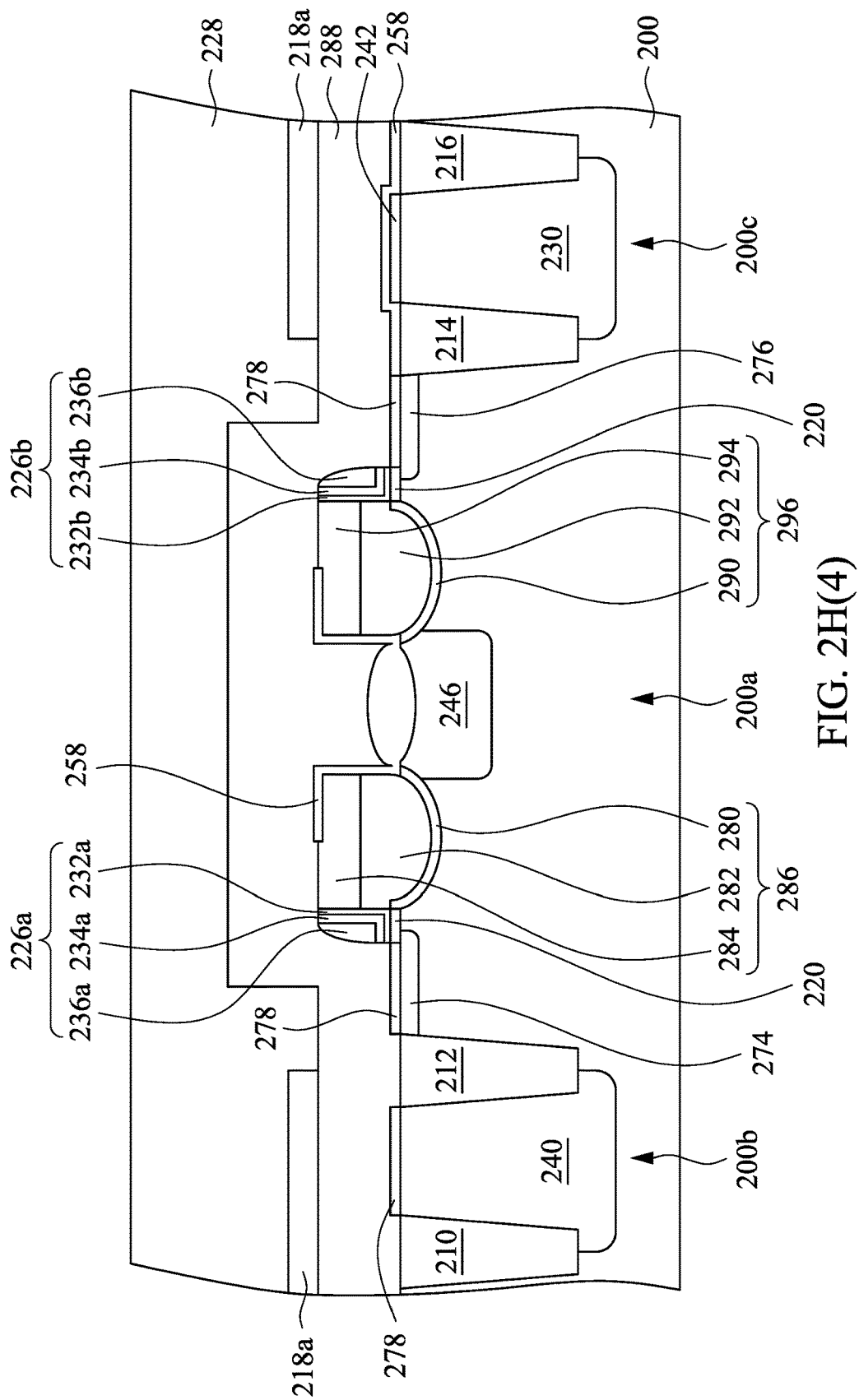
FIG. 2H(4)

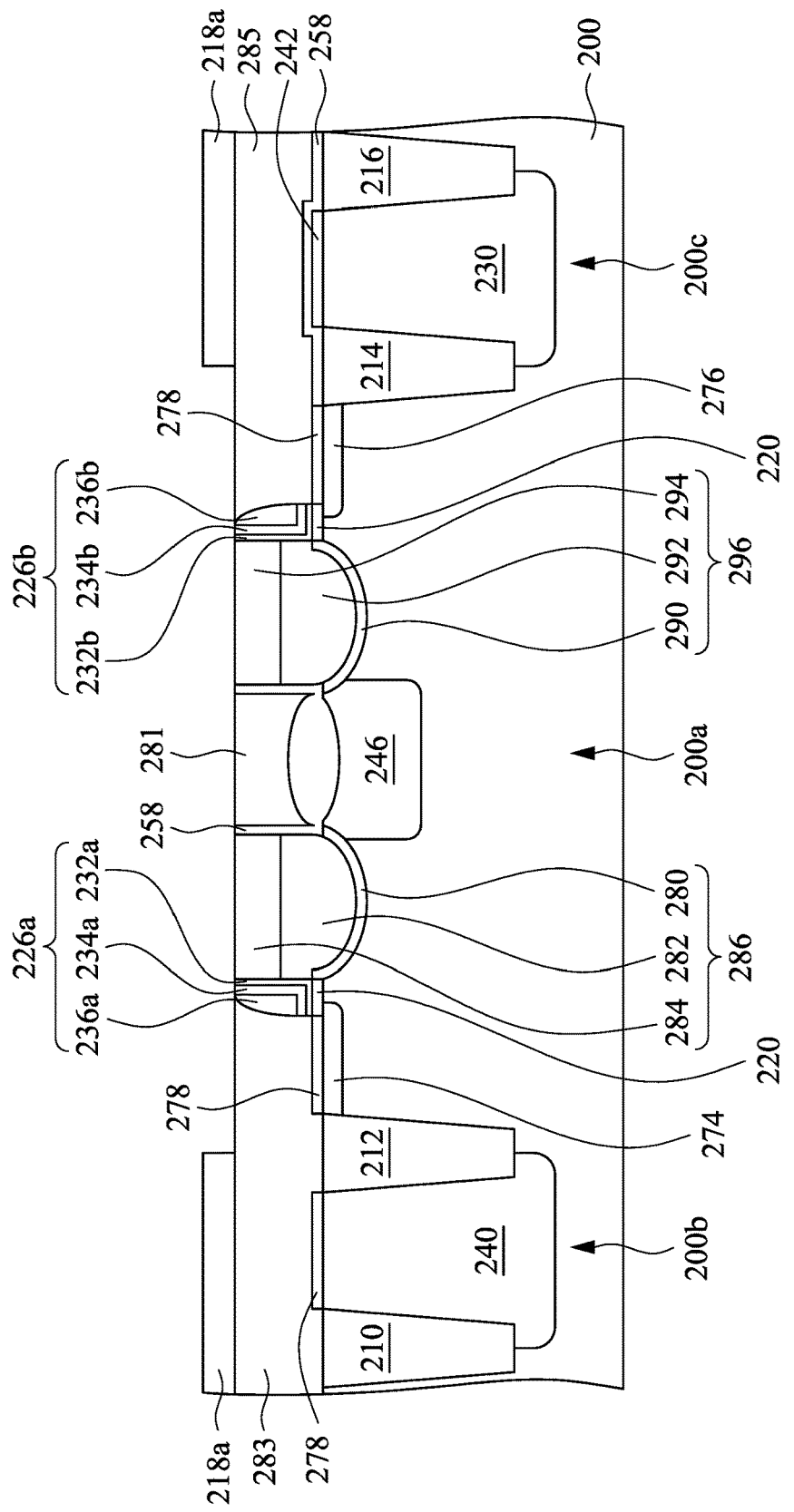
FIG. 2H(5)

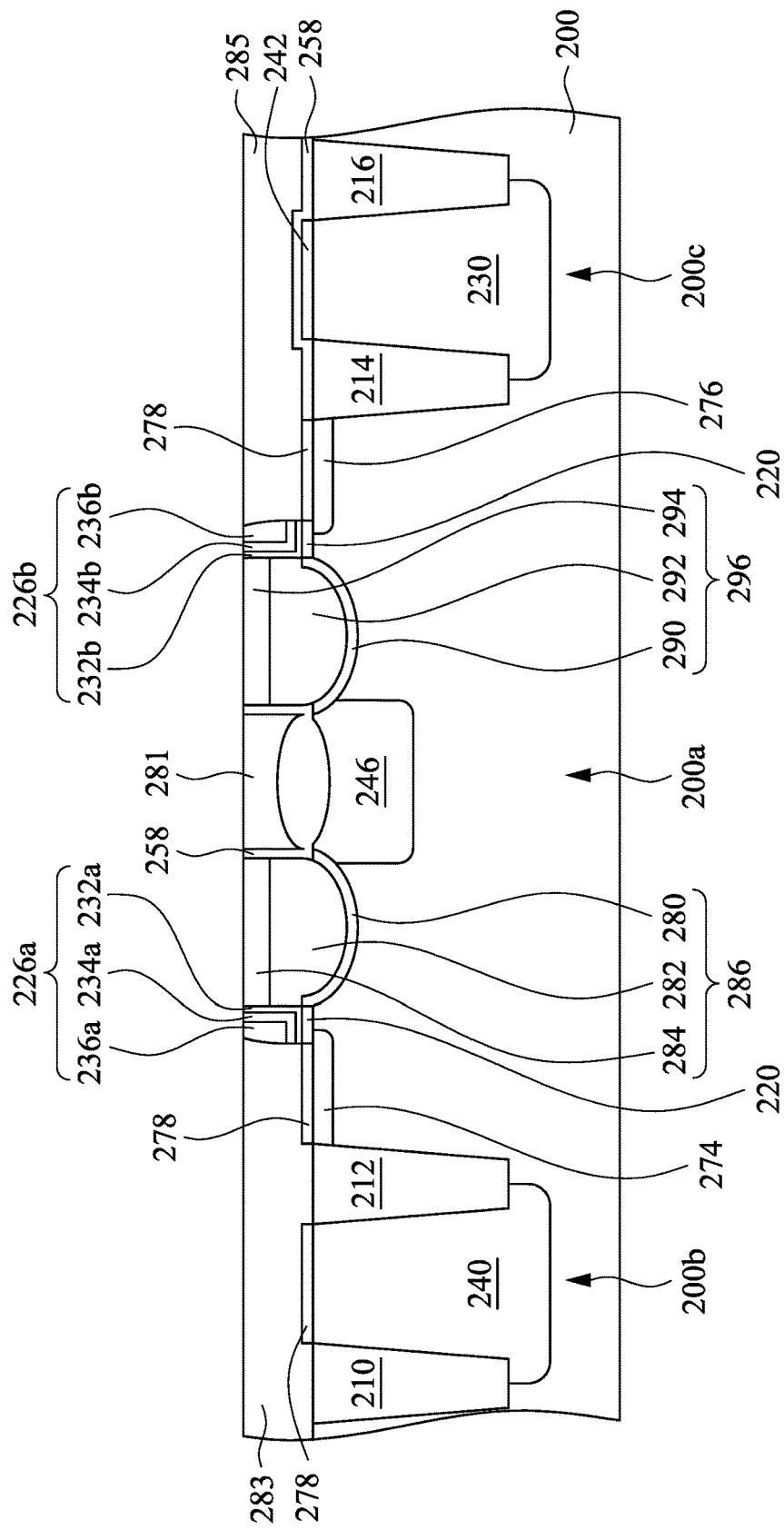
FIG. 2H(6)

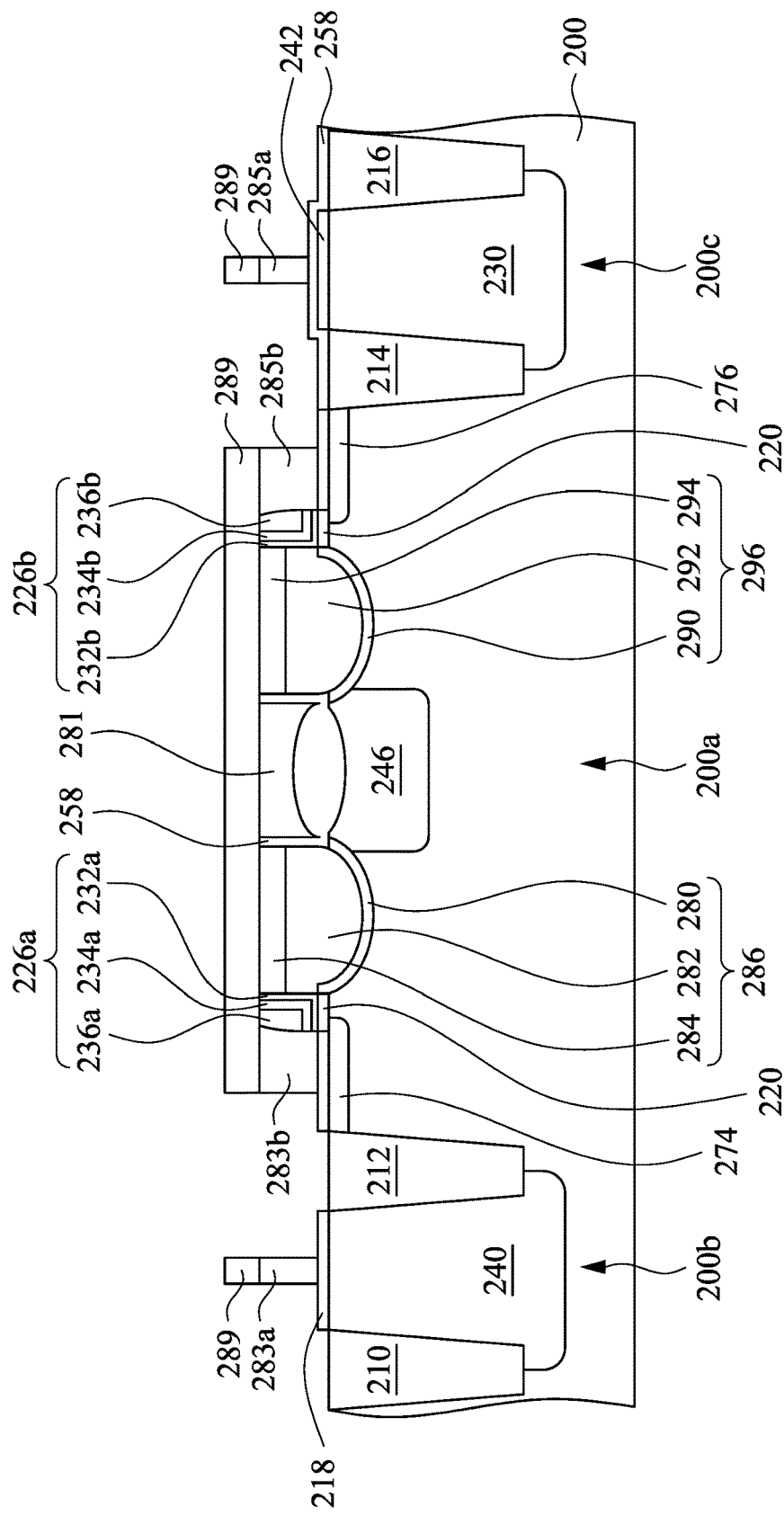
FIG. 2H(7)

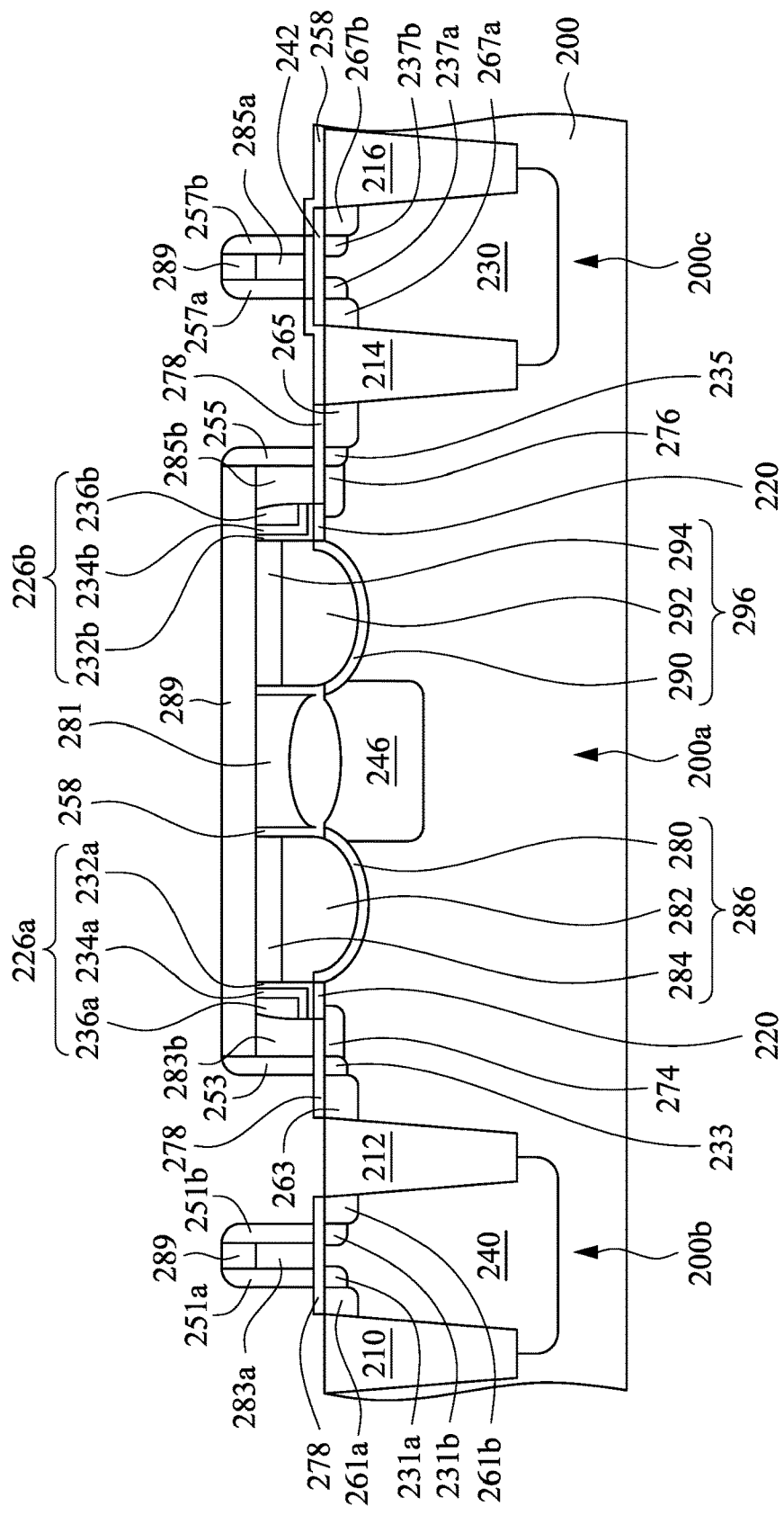
FIG. 2J(1)

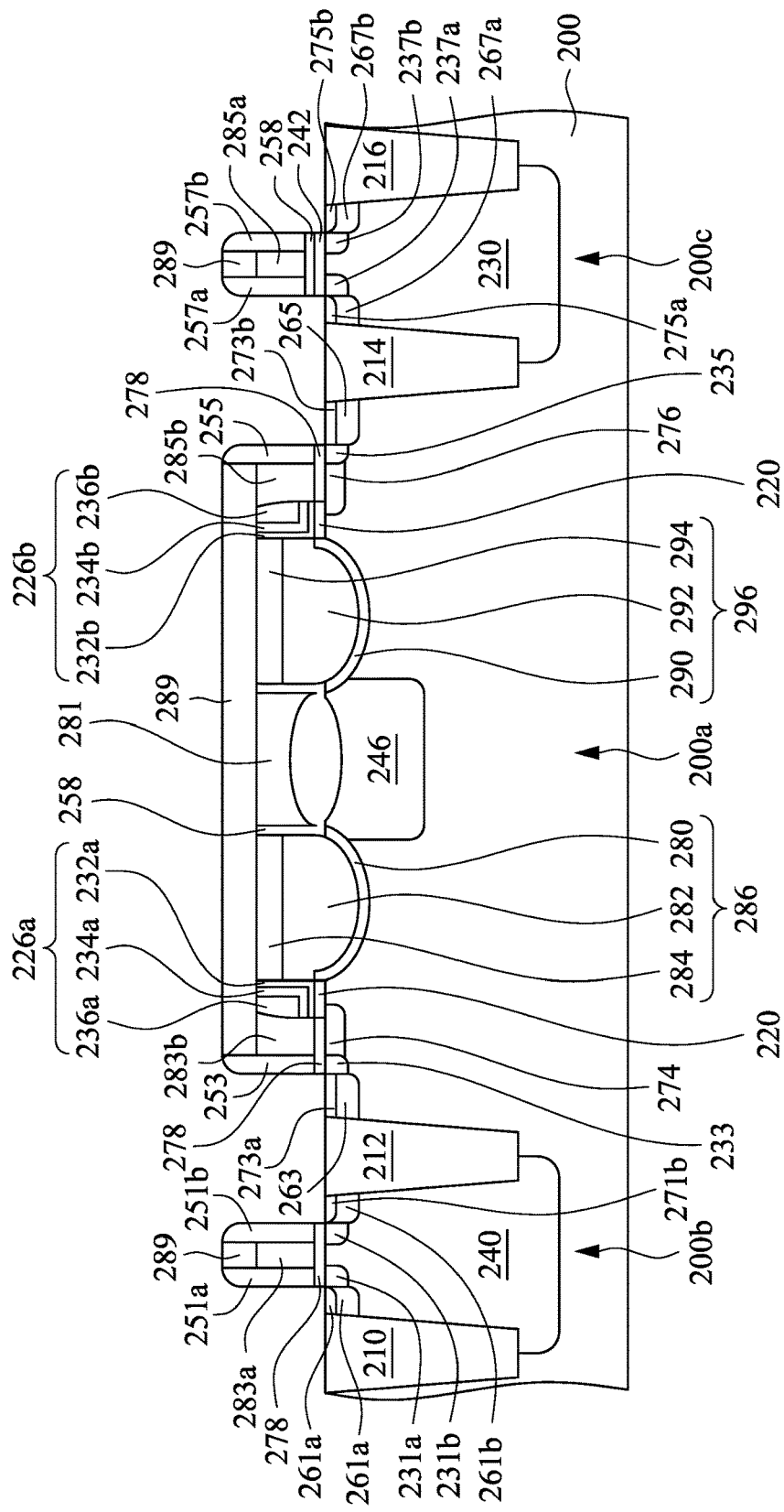
FIG. 2J(2)

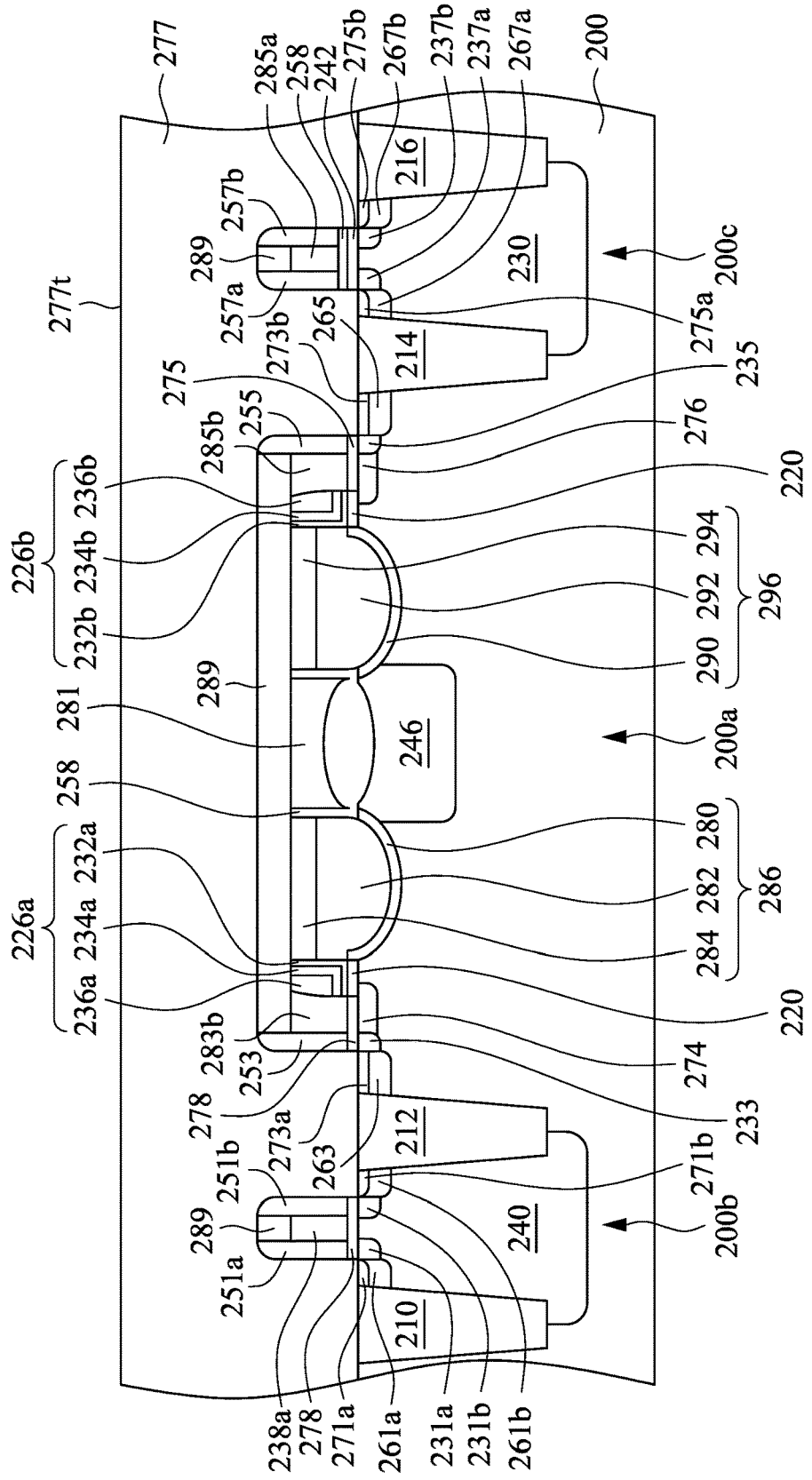
FIG. 2K(1)

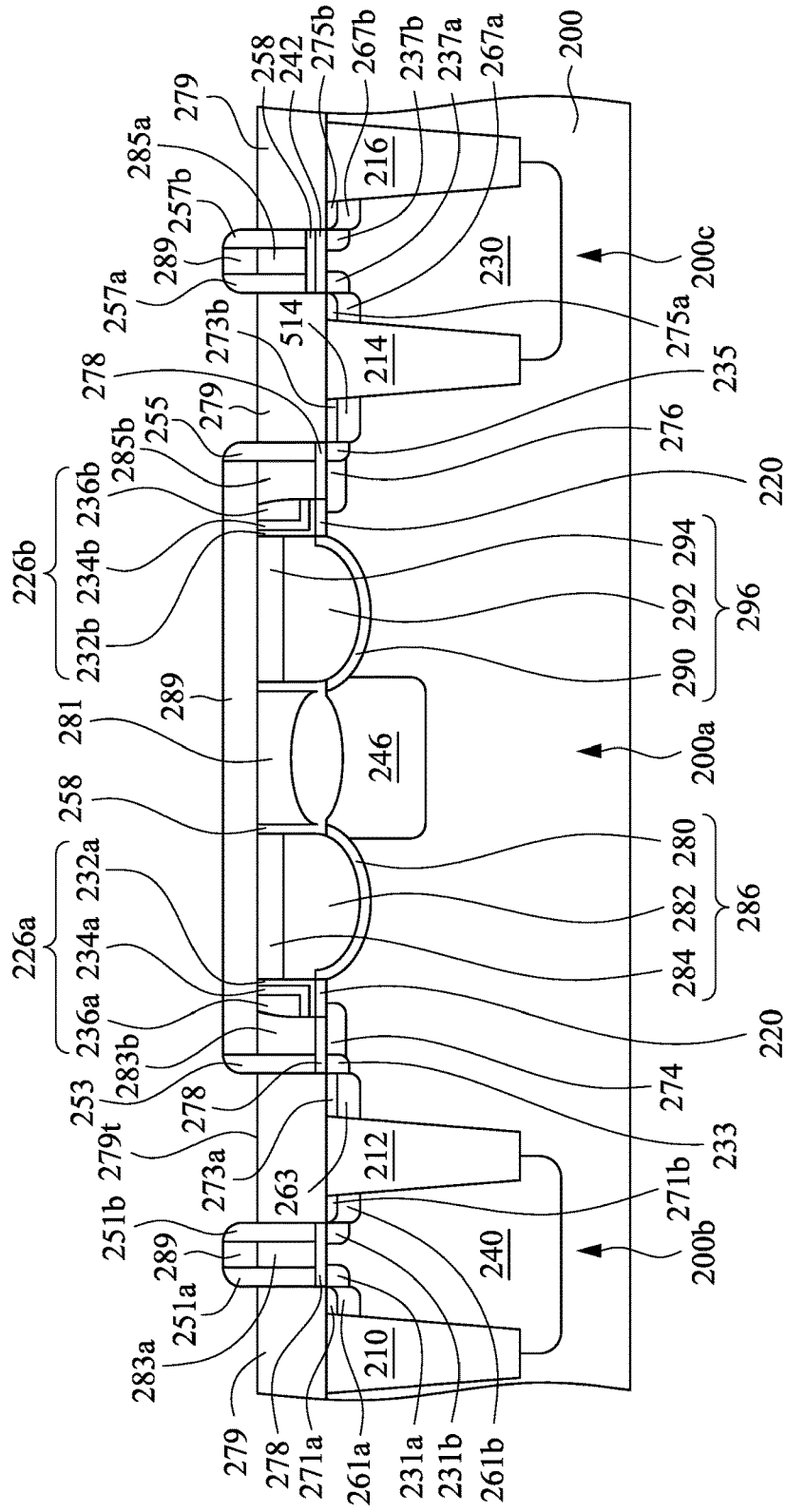
FIG. 2K(2)

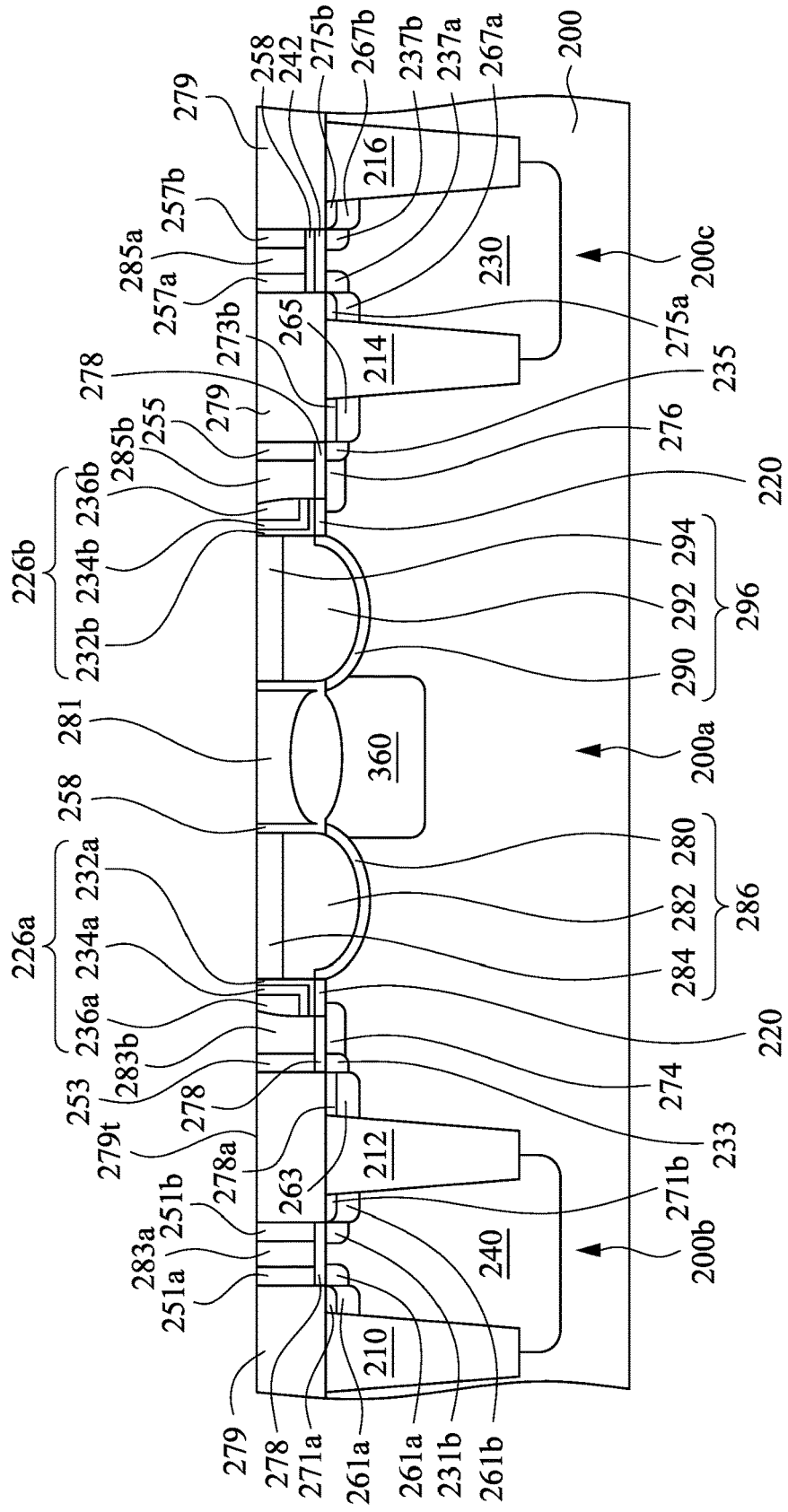
FIG. 2K(3)

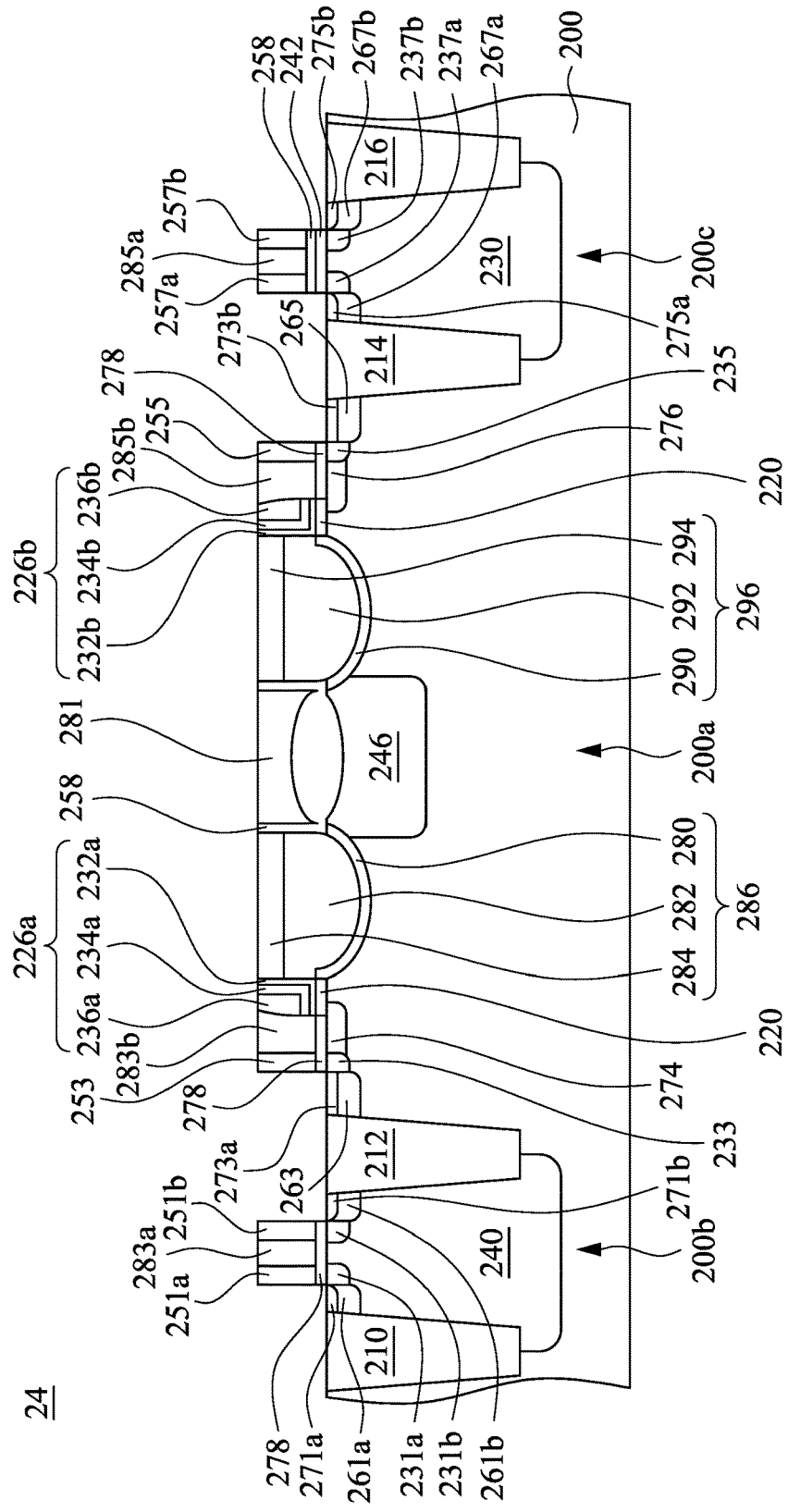
FIG. 2K(4)

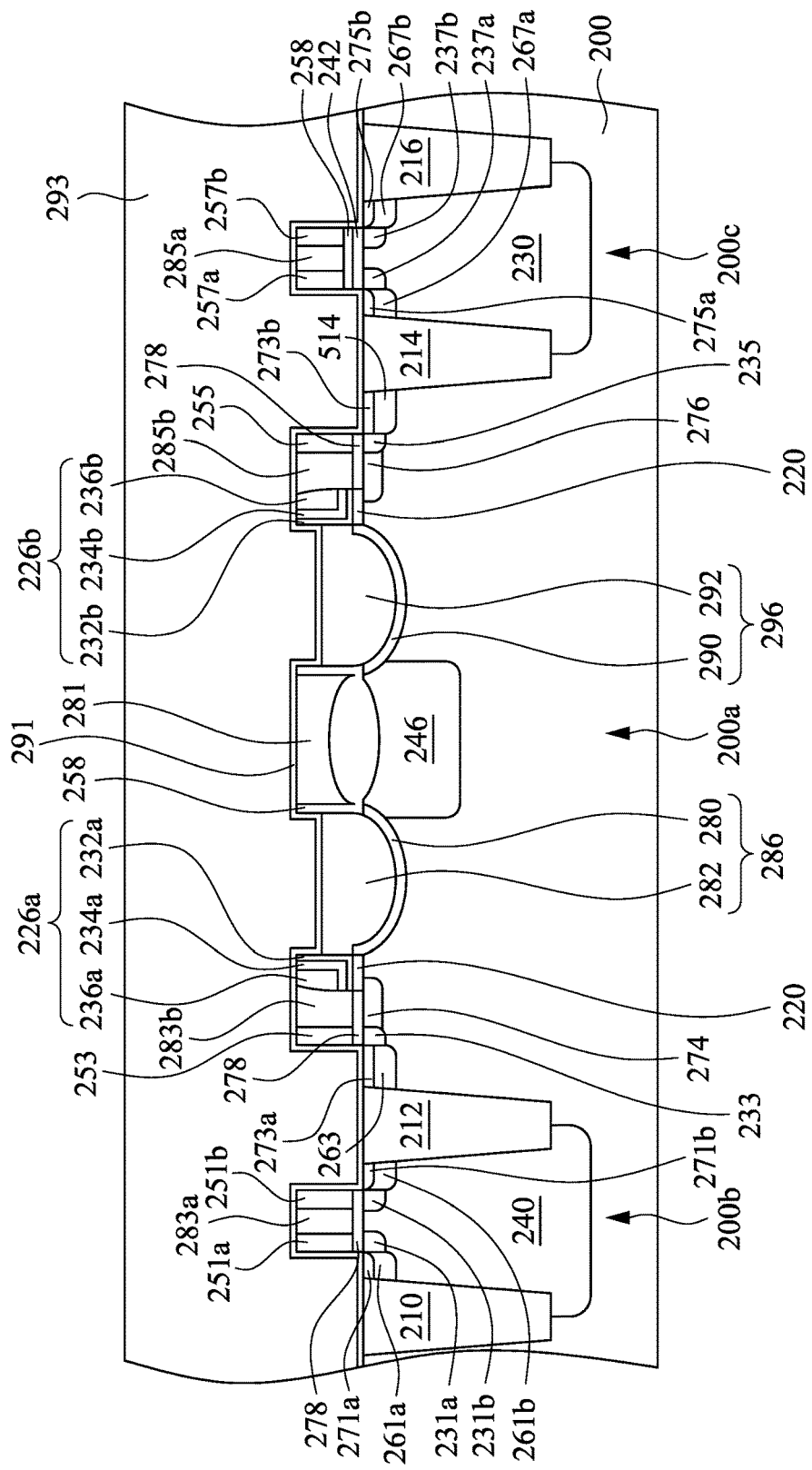
FIG. 2K(5)

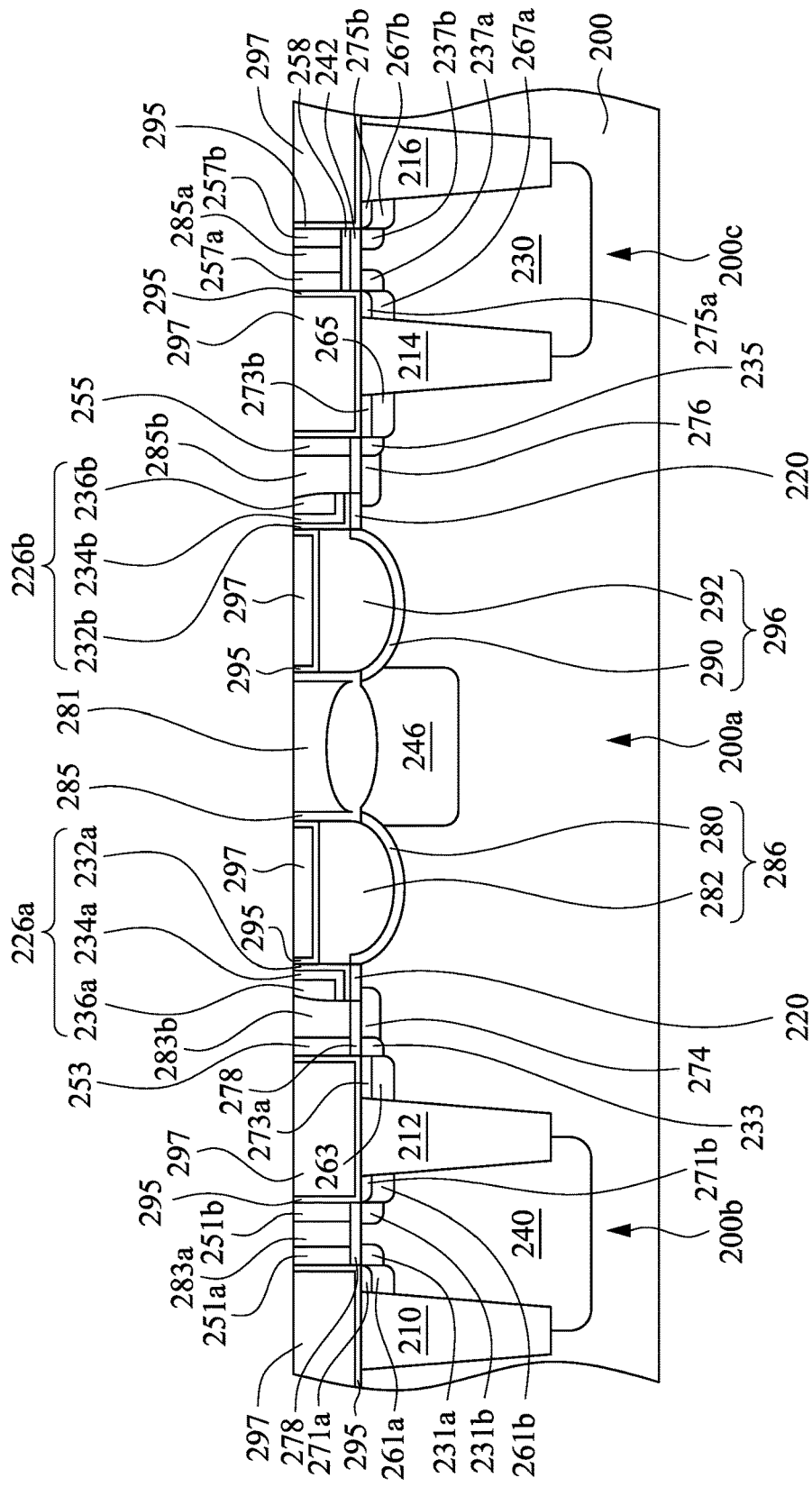
FIG. 2K(6)

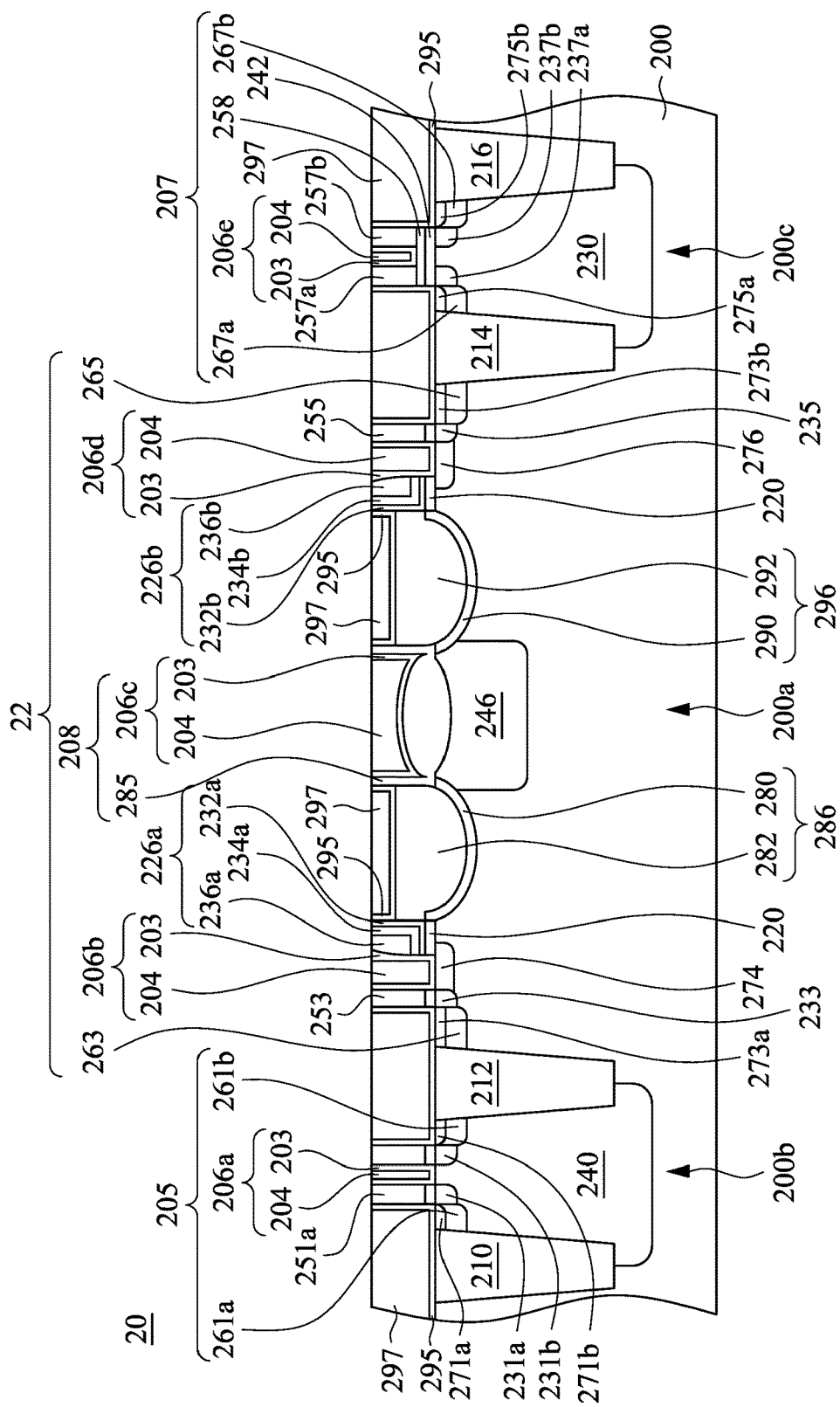
FIG. 2K(7)

MEMORY DEVICE AND METHOD FOR MANUFACTURING THE SAME

RELATED APPLICATIONS

This application claims priority to U.S. Provisional Application Ser. No. 62/590,698, filed Nov. 27, 2017, which is herein incorporated by reference.

BACKGROUND

The semiconductor integrated circuit (IC) industry has experienced exponential growth over the last few decades. In the course of IC evolution, functional density (i.e., the number of interconnected devices per chip area) has generally increased while geometry size (i.e., the smallest component (or line) that can be created using a fabrication process) has decreased.

Super-flash technology has enabled designers to create cost effective and high performance programmable SOC (system on chip) solutions through the use of split-gate flash memory cells. The aggressive scaling of the third generation embedded super-flash (ESF3) memory enables designing flash memories with very high memory array density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A through FIG. 2L are schematic cross-sectional views of intermediate stages showing a method for manufacturing a memory device in accordance with various embodiments.

DETAILED DESCRIPTION

Figure 1:
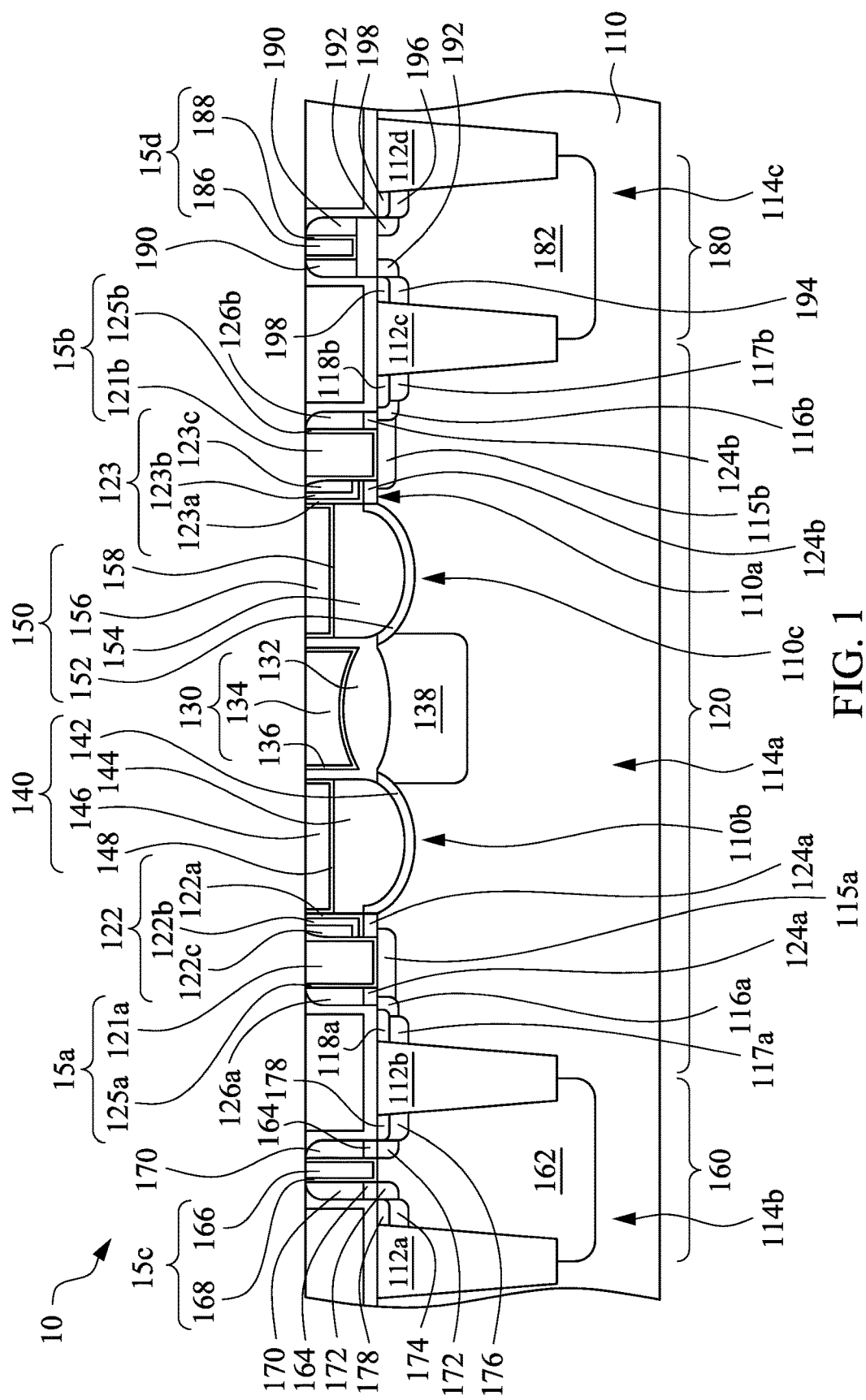
FIG. 1 is a schematic cross-sectional view of a memory device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a typical operation for manufacturing a 1.5 T ESF3 memory, the 1.5 T ESF3 memory is formed with a floating gate for charge trapping. However, a gate structure including the floating gate has a higher stack topology, such that it is more complicated to integrate the operation of the 1.5 T ESF3 memory and a logic operation due to topology problems.

Embodiments of the present disclosure are directed to a memory device and a method for manufacturing the memory device, in which each floating gate of a floating gate memory cell includes a recess channel, and the floating gate memory cell is programmed using a common source coupling source side injection (SSI) programming method, such that control gates are omitted, thereby lowering a structure topology of the floating gate memory cell. Thus, it is much easier to integrate an operation of the floating gate memory cell and a logic process. Furthermore, the recess channels of the floating gates enhance a coupling ratio of a common source and increase an effective channel length, thus decreasing a short channel effect.

FIG. 1 is a schematic cross-sectional view of a memory device 10 in accordance with various embodiments of the present disclosure. In some embodiments, the memory device 10 is a non-volatile memory. The memory device 10 includes a substrate 110, various isolation structures 112a, 112b, 112c and 112d, a floating gate memory cell 120, a first transistor device 160, and a second transistor device 180. The substrate 110 may be a semiconductor substrate. The substrate 110 may be composed of a single-crystalline semiconductor material or a compound semiconductor material. For example, silicon or germanium may be used as a material forming the substrate 110. In certain examples, the substrate 110 may be a silicon on insulator (SOI) substrate. The substrate 110 includes at least two recesses 110b and 110c, such that bottoms of the recesses 110b and 110c are lower than the surface 110a of the substrate 110.

The isolation structures 112a, 112b, 112c and 112d are disposed in the substrate 110 to at least define a first region 114a, a second region 114b, and a third region 114c on the substrate 110. The first region 114a is located between the isolation structures 112b and 112c, the second region 114b is located between the isolation structures 112a and 112b, and the third region 114c is located between the isolation structures 112c and 112d. The isolation structures 112a, 112b, 112c and 112d may be shallow trench isolation (STI) structures. For example, the isolation structures 112a, 112b, 112c and 112d may be formed from silicon oxide.

The floating gate memory cell 120 is disposed in the first region 114a of the substrate 110. In some examples, the floating gate memory cell 120 includes an erase gate structure 130, a first floating gate structure 140, a second floating gate structure 150, a first word line 121a, a first high-k dielectric layer 125a, a second word line 121b, a second high-k dielectric layer 125b, a common source 138, a spacer 122, and a spacer 123.

The first floating gate structure 140 is disposed in the recess 110b of the substrate 110, such that the first floating gate structure 140 is recessed in the substrate 110. In some examples, the first floating gate structure 140 includes a gate dielectric layer 142, a floating gate 144, a mask layer 146 and an etch stop layer 148. The gate dielectric layer 142 covers a surface of the recess 110b. For example, the gate dielectric layer 142 may conformally cover the surface of the recess 110b. The gate dielectric layer 142 may be formed from silicon oxide. The floating gate 144 is disposed on the gate dielectric layer 142 in the recess 110b, such that the gate dielectric layer 142 is disposed between the substrate 110 and the floating gate 144. In some exemplary examples, a bottom of the floating gate 144 is lower than the surface 110a of the substrate 110, such that the floating gate 144 is recessed in the substrate 110. For example, the floating gate 144 may be formed from polysilicon. The mask layer 146 and the etch stop layer 148 are disposed on the floating gate 144. For example, the mask layer 146 may be formed from silicon oxide, and the etch stop layer 148 may be formed from silicon nitride, silicon oxynitride, silicon carbide, silicon oxide, or a combinations thereof.

The second floating gate structure 150 is disposed in the recess 110c of the substrate 110, such that the second floating gate structure 150 is recessed in the substrate 110. In some examples, the second floating gate structure 150 includes a gate dielectric layer 152, a floating gate 154, a mask layer 156, and an etch stop layer 158. The gate dielectric layer 152 covers a surface of the recess 110c. For example, the gate dielectric layer 152 may conformally cover the surface of the recess 110c. The gate dielectric layer 152 may be formed from silicon oxide. The floating gate 154 is disposed on the gate dielectric layer 152 in the recess 110c, such that the gate dielectric layer 152 is disposed between the substrate 110 and the floating gate 154. In some exemplary examples, a bottom of the floating gate 154 is lower than the surface 110a of the substrate 110, such that the floating gate 154 is recessed in the substrate 110. For example, the floating gate 154 may be formed from polysilicon. The mask layer 156 and the etch stop layer 158 are disposed on the floating gate 154. For example, the mask layer 156 may be formed from silicon oxide, and the etch stop layer 158 may be a contact etch stop layer (CESL) formed from silicon nitride, silicon oxynitride, silicon carbide, silicon oxide, or a combinations thereof.

The common source 138 is disposed in the substrate 110, and is located between the first floating gate structure 140 and the second floating gate structure 150. The common source 138 includes dopants, such as boron and phosphorous.

The erase gate structure 130 is disposed on the surface 110a of the substrate 110. The erase gate structure 130 is located between the first floating gate structure 140 and the second floating gate structure 150, such that the first floating gate structure 140 and the second floating gate structure 150 are located at two opposite sides of the erase gate structure 130. The erase gate structure 130 includes an erase tunnel dielectric layer 132, an erase gate 134, and a gate dielectric layer 136. The erase gate 134 and the gate dielectric layer 136 are disposed over the common source 138. The erase gate 134 and the gate dielectric layer 136 are located between the floating gates 144 and 154. The erase tunnel dielectric layer 132 is disposed on the common source 138, in which the erase tunnel dielectric layer 132 is located between the common source 138 and the gate dielectric layer 136, between the first floating gate structure 140 and the gate dielectric layer 136, and between the second floating gate structure 150 and the gate dielectric layer 136. Thus, the erase gate 134 and the gate dielectric layer 136 are separated from the common source 138 and the floating gates 144 and 154 by the erase tunnel dielectric layer 132. For example, the erase tunnel dielectric layer 132 may be form from silicon oxide. In some examples, the erase gate 134 is formed from metal and the gate dielectric layer 136 is formed from a high-k material layer, such that the erase gate 134 and the gate dielectric layer 136 form a high-k meatal gate structure. For example, the erase gate 134 may be formed from Ti, TiN, TaN, Ta, TaC, TaSiN, W, WN, MoN, MoON and/or other suitable materials, and the gate dielectric layer 136 may be formed from hafnium silicon oxide (HfSiO), hafnium silicon oxynitride (HfSiON), hafnium tantalum oxide (HfTaO), hafnium titanium oxide (HfTiO), hafnium zirconium oxide (HfZrO), combinations thereof, and/or other suitable materials.

In some examples, the floating gate memory cell 120 may further include dielectric layers 124a and 124b. The dielectric layers 124a are disposed on the surface 110a of the substrate 110 and near the gate dielectric layer 142. The dielectric layers 124b are disposed on the surface 110a of the substrate 110 and near the gate dielectric layer 152. In some exemplary examples, the dielectric layers 124a and 124b are formed from silicon oxide.

Referring to FIG. 1 again, the spacer 122 is disposed on a portion of the dielectric layers 124a and abuts a sidewall of the first floating gate structure 140. In some examples, the spacer 122 includes dielectric layers 122a, 122b, and 122c stacked on the portion of the dielectric layers 124a and the sidewall of the first floating gate structure 140 in sequence. The dielectric layer 122a may be formed from silicon oxide, the dielectric layer 122b may be formed from silicon nitride, and the dielectric layer 122c may be formed from silicon oxide, such that the spacer 122 may include an oxide-nitride-oxide (ONO) structure.

The spacer 123 is disposed on a portion of the dielectric layers 124b and abuts a sidewall of the second floating gate structure 150. In some examples, the spacer 123 includes dielectric layers 123a, 123b, and 123c stacked on the portion of the dielectric layers 124b and the sidewall of the second floating gate structure 150 in sequence. Similarly, the dielectric layer 123a may be formed from silicon oxide, the dielectric layer 123b may be formed from silicon nitride, and the dielectric layer 123c may be formed from silicon oxide, such that the spacer 123 may include an oxide-nitride-oxide structure.

The first word line 121a and the first high-k dielectric layer 125a form a high-k metal gate structure 15a. For example, the first word line 121a may be formed from metal including Ti, TiN, TaN, Ta, TaC, TaSiN, W, WN, MoN, MoON and/or other suitable materials, and the first high-k dielectric layer 125a may be formed from high-k material including hafnium silicon oxide (HfSiO), hafnium silicon oxynitride (HfSiON), hafnium tantalum oxide (HfTaO), hafnium titanium oxide (HfTiO), hafnium zirconium oxide (HfZrO), combinations thereof, and/or other suitable materials.

The high-k metal gate structure 15a is disposed between the dielectric layers 124a and is adjacent to the spacer 122, such that the spacer 122 is located between the first floating gate structure 140 and the high-k metal gate structure 15a to separate the floating gate 144 from the high-k metal gate structure 15a. The high-k metal gate structure 15a and the erase gate structure 130 are located at opposite sides of the first floating gate structure 140. The spacer 126a is disposed on the other portion of the dielectric layers 124a, such that the spacer 126a and the spacer 122 are located at opposite sides of the high-k metal gate structure 15a. For example, the spacer 126a may be formed from silicon nitride or silicon oxynitride.

The second word line 121b and the second high-k dielectric layer 125b form a high-k metal gate structure 15b. For example, the second word line 121b may be formed from metal including Ti, TiN, TaN, Ta, TaC, TaSiN, W, WN, MoN, MoON and/or other suitable materials, and the second high-k dielectric layer 125b may be formed from high-k material including hafnium silicon oxide (HfSiO), hafnium silicon oxynitride (HfSiON), hafnium tantalum oxide (HfTaO), hafnium titanium oxide (HfTiO), hafnium zirconium oxide (HfZrO), combinations thereof, and/or other suitable materials.

The high-k metal gate structure 15b is disposed between the dielectric layers 124b and is adjacent to the spacer 123, such that the spacer 123 is located between the second floating gate structure 150 and the high-k metal gate structure 15b to separate the floating gate 154 from the high-k metal gate structure 15b. The high-k metal gate structure 15b and the erase gate structure 130 are located at opposite sides of the second floating gate structure 150. The spacer 126b is disposed the other portion of the dielectric layers 124b, such that the spacer 126b and the spacer 123 are located at opposite sides of the high-k metal gate structure 15b For example, the spacer 126b may be formed from silicon nitride or silicon oxynitride. Referring to FIG. 1 again, in some examples, the floating gate memory cell 120 may include implantation regions 115a, 115b, 117a, and 117b, lightly doped drains (LDD) 116a and 116b, and silicide layers 118a and 118b. The implantation regions 115a, 115b, 117a, and 117b, and the lightly doped drains 116a, 116b are disposed in the substrate 110 adjacent to the surface 110a. The implantation regions 115a and 115b are respectively under the dielectric layers 124a and 124b. The lightly doped drains 116a and 116b are respectively disposed in the implantation regions 115a and 115b. The implantation regions 117a and 117b are respectively disposed in the lightly doped drains 116a and 116b. The silicide layer 118a is disposed on the lightly doped drain 116a and the implantation region 117a. The silicide layer 118b is disposed on the lightly doped drain 116b and the implantation region 117b.

The first transistor device 160 is disposed in the second region 114b of the substrate 110. For example, the first transistor device 160 may be a low voltage device. In some examples, the first transistor device 160 includes a well 162, dielectric layers 164, a gate 166, a gate dielectric layer 168, two spacers 170, two lightly-doped drains 172, a source 174, and a drain 176. The well 162 is disposed in the substrate 110. The well 162 includes dopants, such as boron and phosphorous. The dielectric layers 164 are disposed on the well 162. The dielectric layers 164 may be formed from silicon oxide. The gate 166 and the gate dielectric layer 168 form a high-k metal gate structure 15c. For example, the gate 166 may be formed from metal including Ti, TiN, TaN, Ta, TaC, TaSiN, W, WN, MoN, MoON and/or other suitable materials, and the gate dielectric layer 168 may be formed from high-k material including hafnium silicon oxide (HfSiO), hafnium silicon oxynitride (HfSiON), hafnium tantalum oxide (HMO), hafnium titanium oxide (HfTiO), hafnium zirconium oxide (HfZrO), combinations thereof, and/or other suitable materials. The high-k metal gate structure 15c is disposed between the gate dielectric layers 164. The spacers 170 are disposed on the gate dielectric layers 164, and the spacers 170 are disposed at opposite sides of the high-k metal gate structure 15c, such that the spacers 170 sandwich the high-k metal gate structure 15c.

The lightly-doped drains 172 are disposed in the well 162 adjacent to the opposite sides of the high-k metal gate structure 15c. The source 174 and the drain 176 are respectively disposed in the lightly-doped drains 172 adjacent to the opposite sides of the high-k metal gate structure 15c. In some exemplary examples, the first transistor device 160 further includes two silicide layers 178, in which the silicide layers 178 are respectively disposed on the lightly doped drains 172, and are respectively located on the source 174 and the drain 176.

The second transistor device 180 is disposed in the third region 114c of the substrate 110. For example, the second transistor device 180 may be a high voltage device. In some examples, the second transistor device 180 includes a well 182, a gate dielectric layer 184, a gate 186, a high-k dielectric layer 188, two spacers 190, two lightly-doped drains 192, a source 194, and a drain 196. The well 182 is disposed in the substrate 110. The well 182 includes dopants, such as boron and phosphorous. The gate dielectric layer 184 is disposed on the well 182. In some exemplary examples, each of the dielectric layers 164 of the first transistor device 160 is thinner than the gate dielectric layer 184 of the second transistor device 180. The gate dielectric layer 184 may be formed from silicon oxide. The gate 186 and the gate dielectric layer 188 form a high-k metal gate structure 15d. For example, the gate 186 may be formed from metal including Ti, TiN, TaN, Ta, TaC, TaSiN, W, WN, MoN, MoON and/or other suitable materials, and the gate dielectric layer 188 may be formed from high-k material including hafnium silicon oxide (HfSiO), hafnium silicon oxynitride (HfSiON), hafnium tantalum oxide (HMO), hafnium titanium oxide (HfTiO), hafnium zirconium oxide (HfZrO), combinations thereof, and/or other suitable materials. The high-k metal gate structure 15d is disposed on a portion of the gate dielectric layer 184. The spacers 190 are disposed on the other portions of the gate dielectric layer 184, and the spacers 190 are disposed at opposite sides of the high-k metal gate structure 15d, such that the spacers 190 sandwich high-k metal gate structure 15d.

The lightly-doped drains 192 are disposed in the well 182 adjacent to the opposite sides of the high-k metal gate structure 15d. The source 194 and the drain 196 are respectively disposed in the lightly-doped drains 192 adjacent to the opposite sides of the high-k metal gate structure 15d. In some exemplary examples, the first transistor device 180 further includes two silicide layers 198, in which the silicide layers 198 are respectively disposed on the lightly doped drains 192, and are respectively located on the source 194 and the drain 196.

In the floating gate memory cell 120 of the memory device 10, the floating gate 144 of the first floating gate structure 140 and the floating gate 154 of the second floating gate structure 150 are recessed in the substrate 110, such that each of the first floating gate structure 140 and the second floating gate structure 150 has a recess channel. The recess channels of the first floating gate structure 140 and the second floating gate structure 150 enhance a coupling ratio of the common source 138 and increase an effective channel length, thus decreasing a short channel effect. The floating gate memory cell 120 is programmed using a common source coupling source side injection programming method, such that control gates are omitted, thereby lowering a structure topology of the floating gate memory cell 120. Thus, it is much easier to integrate an operation of the floating gate memory cell 120 and a logic process. For example, when the memory device 10 is programmed, a first voltage signal (such as 1 volt) is applied on the silicide layer 273a, a second voltage signal (such as 1.1 volts) higher than the first voltage signal is applied on the metal gate of the high-k metal gate structure 15b (considered as a word line), a reference voltage signal (such as 0 volt) lower than the first voltage signal and the second voltage signal is applied on the metal gate of the high-k metal gate structure 15c (considered as an erase gate), and a third voltage signal (such as 10 volts) higher than the first voltage signal and the second voltage signal is applied on the common source 246. Therefore, when the memory device 10 is programmed, electrons pass through a tunnel under the gate dielectric layers 280 from the implantation region 263 to the common source 246.

Figure 2A:
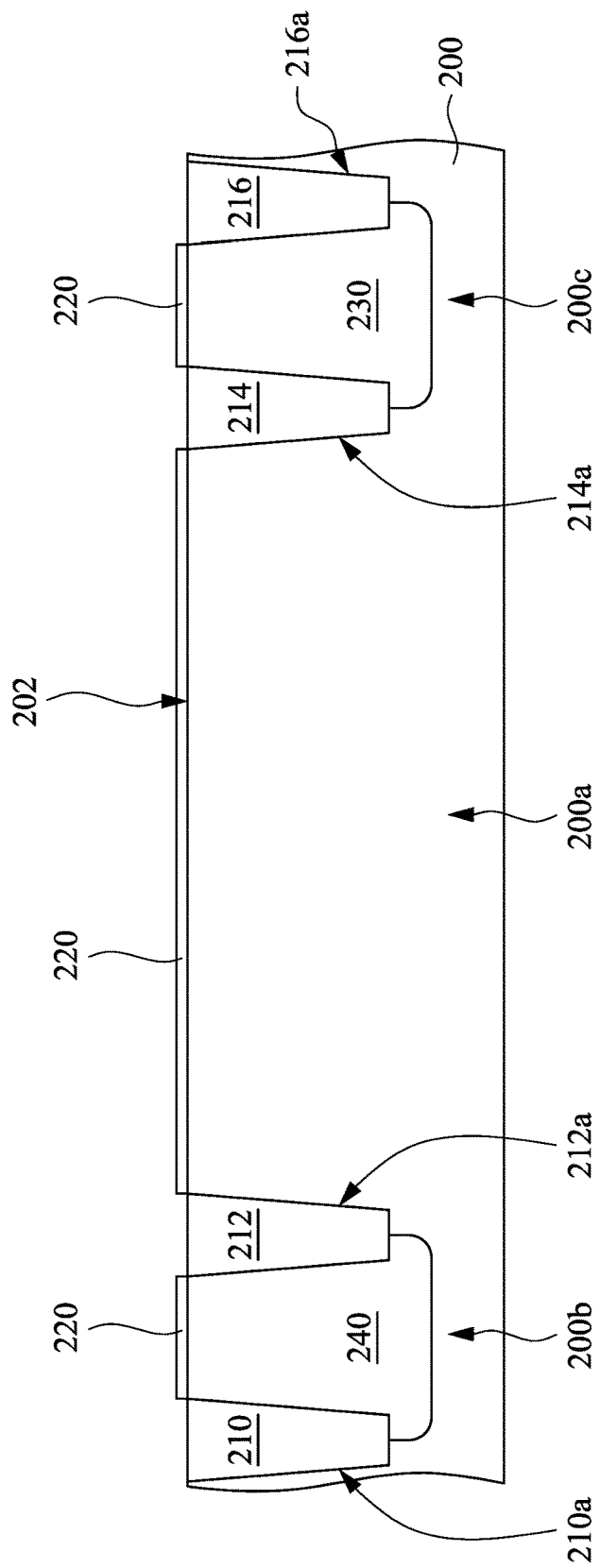

FIG. 2A through FIG. 2K(7) are schematic cross-sectional views of intermediate stages showing a method for manufacturing a memory device in accordance with various embodiments. As shown in FIG. 2A, a substrate 200 is provided. The substrate 200 may be a semiconductor substrate. For example, the substrate 200 may be composed of a single-crystalline semiconductor material or a compound semiconductor material. In some exemplary examples, silicon or germanium id used as a material forming the substrate 200. In certain examples, the substrate 200 may be a silicon on insulator substrate.

Referring to FIG. 2A again, various isolation structures 210, 212, 214, and 216 are formed in the substrate 200. In some examples, in the formation of the isolation structures 210, 212, 214, and 216, a pad oxide layer 220 is formed to blankety cover a surface 202 of the substrate 200 by, for example, a deposition method or a thermal oxidization method. The pad oxide layer 220 may be formed from silicon oxide. A hard mask (not shown) is formed to cover the pad oxide layer 220 by, for example, a deposition method. The hard mask may be formed from silicon nitride. Then, the hard mask and the pad oxide layer 220 are patterned by, for example, a photolithography operation and an etch process. Patterning the hard mask and the pad oxide layer 220 is performed to remove portions of the hard mask and portions of the pad oxide layer 220 to expose portions of the substrate 200. The portions of the substrate 200, which are not covered by the patterned hard mask and the patterned pad oxide layer 220, are removed by an etch process, so as to form various trenches 210a, 212a, 214a, and 216a in the substrate 200. An isolation material is formed to fill the trenches 210a, 212a, 214a, and 216a and to cover the hard mask layer. In some exemplary examples, the isolation material is formed by using a high density plasma chemical vapor deposition (HDP CVD) method. A polish operation may be performed to polish the isolation material, so as to expose the hard mask. For example, the polish operation may be a chemical mechanical polish (CMP) process. Then, the hard mask is removed to form the isolation structures 210, 212, 214, and 216 in the substrate 200. The isolation structures 210, 212, 214, and 216 may be shallow trench isolation structures.

As shown in FIG. 2A, the isolation structures 210, 212, 214, and 216 formed in the substrate 200 at least define a first region 200a, a second region 200b, and a third region 200c on the substrate 200, in which the first region 200a is located between the isolation structures 212 and 214, the second region 200b is located between the isolation structures 210 and 212, and the third region 200c is located between the isolation structures 214 and 216. After the isolation structures 210, 212, 214, and 216 are completed, the remaining pad oxide layer 220 is located on the first region 200a, the second region 200b, and the third region 200c on the surface 202 of the substrate 200.

In some examples, as shown in FIG. 2A, after the isolation structures 210, 212, 214, and 216 are completed, a high voltage well 230 is formed in the third region 200c by using a photolithography method and an implantation method. The high voltage well 230 includes an n-type well and a p-type well. A logic well 240 is formed in the second region 200b by using a photolithography method and an implantation method.

Thereafter, recesses 260 and 270 are formed in the substrate 200, as shown in FIG. 2B(1) through FIG. 2B(3). As shown in FIG. 2B(1), a hard mask layer 250 is formed on the first region 200a, second region 200b, and the third region 200c, in which the hard mask layer 250 is formed to expose two portions 220a and 220b of the pad oxide layer 220 on two portions 200a' and 200a" of the first region 200a in the substrate 200. In some exemplary examples, in forming the hard mask layer 250, a hard mask material layer is formed to cover the pad oxide layer 220, and the isolation structures 210, 212, 214, and 216, and the hard mask material layer is patterned to remove portions of the hard mask material layer, so as to form the hard mask layer 250 exposing the portions 220a and 220b of the pad oxide layer 220. The hard mask material layer may be formed by a deposition process, such as a chemical vapor deposition (CVD) process. The hard mask material layer may be patterned by using a photolithography method and an etch method, such as a dry etch method. For example, the hard mask layer 250 may be formed from silicon nitride.

As shown in FIG. 2B(3), two recesses 260 and 270 are formed in the portions 200a' and 200a" of the first region 200a in the substrate 200, such that a bottom 260a of the recess 260 and a bottom 270a of the recess 270 are lower than the surface 202 of the substrate 200. The recesses 260 and 270 may be formed by using an oxidation method or an etch method. In some exemplary examples, referring to FIG. 2B(2), the recesses 260 and 270 are formed by using an oxidization method, and in forming the recesses 260 and 270, an oxidization operation is performed to oxidize the substrate 200 in the portions 200a' and 200a", so as to form oxide structures 262 and 272 respectively in the portions 200a' and 200a". Then, as shown in FIG. 2B(3), the oxide structures 262 and 272 are removed to respectively form the recesses 260 and 270 in the portions 200a' and 200a" of the first region 200a. For example, the oxide structures 262 and 272 may be removed by using an etch process, such a dry etch operation or a wet etch process.

Then, a first floating gate structure 286 and a second floating gate structure 296 are respectively formed in the recesses 260 and 270 as shown in FIG. 2C(1) through 2C(6). As shown in FIG. 2C(1), two gate dielectric layers 280 and 290 are respectively formed to cover a surface 260s of the recess 260 and a surface 270s of the recess 270. For example, the gate dielectric layers 280 and 290 may be formed by using an oxidization method or a deposition method, such as a chemical vapor deposition method. The gate dielectric layers 280 and 290 may be formed from silicon oxide. In some exemplary examples, the gate dielectric layers 280 and 290 conformally cover the surface 260s of the recess 260 and the surface 270s of the recess 270 respectively.

Referring to FIG. 2C(1) again, a gate material layer 222 is formed on the hard mask layer 250 and the gate dielectric layers 280 and 290. The recesses 260 and 270 are filled with the gate material layer 222. The gate material layer 222 may be formed by using a deposition method, such as a chemical vapor deposition method, a plasma-enhanced chemical vapor deposition (PECVD) method, or a physical vapor deposition (PVD) method. In some exemplary examples, the gate material layer 222 is formed from polysilicon.

As shown in FIG. 2C(2), a planarization operation may be optionally performed on the gate material layer 222 by, for example, a chemical mechanical polishing technique. The planarization operation is performed to remove portions of the gate material layer 222. The planarization operation may stop on a top of the hard mask layer 250.

In some examples, as shown in FIG. 2C(3), an etch back operation is performed on the remaining gate material layer 222 to remove portions of the gate material layer 222 which remain on the hard mask layer 250, and portions of the gate material layer 222 disposed on the recesses 260 and 270. The portions of the gate material layer 222 disposed on the recesses 260 and 270 are removed to respectively form floating gates 282 and 292 on the gate dielectric layers 280 and 290. For example, the etch back operation may be performed by using a dry etch technique or a wet etching technique. After the etch back operation is completed, tops of the floating gates 282 and 292 are lower than the top of the hard mask layer 250, such that trenches 252 and 254 are respectively formed above the floating gates 282 and 292 in the hard mask layer 250.

As shown in FIG. 2C(4), a mask material layer 287 is formed to cover the hard mask layer 250 and the floating gates 282 and 292. The trenches 252 and 254 are filled with the mask material layer 287. For example, the mask material layer 287 may be formed by using a chemical vapor deposition method or a physical vapor deposition method. The mask material layer 287 may be formed from silicon oxide.

As shown in FIG. 2C(5), a planarization operation may be optionally performed on the mask material layer 287 by, for example, a chemical mechanical polishing technique. The planarization operation is performed to remove portions of the mask material layer 287. The planarization operation may stop on the top of the hard mask layer 250. After the planarization operation is completed, portions of the mask material layer 287 remaining in the trenches 252 and 254 respectively form mask layers 284 and 294. Referring to FIG. 2I, the mask layer 284 is disposed on the floating gate 282, the floating gate 282 is disposed on the gate dielectric layer 280 in the recess 260, and the gate dielectric layer 280 covers the surface 260s of the recess 260 to form a first floating gate structure 286 in the recess 260. The mask layer 294 is disposed on the floating gate 292, the floating gate 292 is disposed on the gate dielectric layer 290 in the recess 270, and the gate dielectric layer 290 covers the surface 270s of the recess 270 to form a second floating gate structure 296 in the recess 270. In some exemplary examples, each of the remaining mask material layers 218b shown in FIG. 2C(5) is thinner than the each of the mask layer 284 and the mask layer 294 shown in FIG. 2C(5).

As shown in FIG. 2C(5) and FIG. 2C(6), the mask material layer 287 remaining on the hard mask layer 250 and the hard mask layer 250 are removed by using, for example, an etch technique. In some exemplary examples, the mask material layer 287 remaining on the hard mask layer 250 is removed, and the hard mask layer 250 is then removed to expose a sidewall 286s of the first floating gate structure 286, a sidewall 286s of the second floating gate structure 296, the pad oxide layer 220, and the isolation structures 210, 212, 214, and 216.

Thereafter, a common source 246 is formed in the substrate 200 between the first floating gate structure 286 and the second floating gate structure 296, as shown in FIG. 2D(1) through FIG. 2D(5). As shown in FIG. 2D(1), a first dielectric layer 232 is formed to cover the first floating gate structure 286, the second floating gate structure 296, the pad oxide layer 220, and the isolation structures 210, 212, 214, and 216. For example, the first dielectric layer 232 may be formed by using a chemical vapor deposition method. The first dielectric layer 232 may be formed from silicon oxide. A second dielectric layer 234 is formed to cover the first dielectric layer 232. For example, the second dielectric layer 234 may be formed by using a chemical vapor deposition method. The second dielectric layer 234 may be formed from silicon nitride. A third dielectric layer 236 is formed to cover the second dielectric layer 234. For example, the third dielectric layer 236 may be formed by using a chemical vapor deposition method. The third dielectric layer 236 may be formed from silicon oxide.

As shown in FIG. 2D(2), an etch back operation is performed on the third dielectric layer 236 by using an etch technique, such as a dry etch technique. The etch back operation removes a portion of the third dielectric layer 236 and stops on the second dielectric layer 234, so as to form two spacers 236a on the second dielectric layer 234 adjacent to the sidewall 286s of the first floating gate structure 286, and two spacers 236b on the second dielectric layer 234 adjacent to the sidewall 296s of the second floating gate structure 296. The spacers 236a are respectively located on two opposite sides of the first floating gate structure 286, and the spacers 236b are respectively located on two opposite sides of the second floating gate structure 296.

As shown in FIG. 2D(3), the second dielectric layer 234, the first dielectric layer 232, and the pad oxide layer 220 in the third region 200c are removed. In some examples, an etch mask layer 238 is formed to cover the first region 200a and the second region 200b. The etch mask layer 238 may be formed from photo-resist, and the etch mask layer 238 may be formed by coating an etch mask material film on the first region 200a, the second region 200b, and the third region 200c, and removing a portion of the etch mask material film which is located on the third region 200c using a photolithography technique. In some exemplary examples, after the etch mask layer 238 is formed, the second dielectric layer 234 on the third region 200c is removed by, for example, a dry etch technique. The first dielectric layer 232 on the third region 200c is etched by using a dry etch technique. Then, the pad oxide layer 220 on the third region 200c is etched by using a wet etch technique. The etch mask layer 238 is removed.

As shown in FIG. 2D(4), a dielectric layer 242 is formed on the high voltage well 230 between the isolation structures 214 and 216. The dielectric layer 242 may be referred to a high voltage gate dielectric layer. For example, the dielectric layer 242 may be formed by a deposition technique or an oxidization technique. In some exemplary examples, the dielectric layer 242 is formed by oxidizing the substrate 200, and the dielectric layer 242 is formed from silicon oxide. For example, the dielectric layer 242 may be formed by a furnace oxidization process.

As shown in FIG. 2D(5), a hard mask layer 244 is formed on the first region 200a, the second region 200b, and the third region 200c, and the hard mask layer 244 is formed to have a through hole 248. The through hole 248 exposes one of the spacers 236a which is far away the second region 200b, one of the spacers 236b which is far away the third region 200c, and a portion of the second dielectric layer 234 which extends from a middle region of the first floating gate structure 286 to a middle region of the second floating gate structure 296. The hard mask layer 244 covers the second region 200*b* and the third region 200*c*, and portions of the first region 200*a* which are respectively adjacent to the second region 200*b* and the third region 200*c*. In some exemplary examples, the hard mask layer 244 may be formed from photo-resist, and the hard mask layer 244 may be formed by coating a mask material film on the first region 200*a*, the second region 200*b*, and the third region 200*c*, and removing a portion of the mask material film to form the hard mask layer 244 having the through hole 248. The through hole 248 exposes the second dielectric layer 234 between the adjacent spacers 236*a* and 236*b*, which are located between the first floating gate structure 286 and the second floating gate structure 296.

In some examples, referring to FIG. 2D(5) again, an implantation operation is performed on the substrate 200 by using the hard mask layer 244, the exposed spacers 236*a* and 236*b*, and the exposed second dielectric layer 234 on the first floating gate structure 286 and the second floating gate structure 296 as a mask. The implantation operation includes forming an implantation region in the substrate 200 between the adjacent spacers 236*a* and 236*b*. A furnace thermal operation may be optionally performed to oxidize the implantation region, so as to form a common source 246 between the first floating gate structure 286 and the second floating gate structure 296. The common source 246 includes dopants, such as boron and phosphorous.

Then, an erase tunnel dielectric layer 258 is formed and extends from a portion of the first floating gate structure 286 to a portion of the second floating gate structure 296 through the common source 246, as shown in FIG. 2E(1) through FIG. 2E(5). As shown in FIG. 2E(1), the exposed spacer 236*a* and the exposed spacer 236*b* are removed by using an etch technique. For example, the exposed spacer 236*a* and the exposed spacer 236*b* may be removed by using a wet etch technique. The exposed second dielectric layer 234 is removed by using an etch technique. For example, the exposed second dielectric layer 234 may be removed by a dry etch technique. The etching of the exposed second dielectric layer 234 stops on the first dielectric layer 232, such that a portion of the first dielectric layer 232 underlying the exposed second dielectric layer 234 is exposed.

As shown in FIG. 2E(2), the exposed first dielectric layer 232 is removed to expose a portion of the first floating gate structure 286, a portion of the second floating gate structure 296, a portion of the substrate 200 between the first floating gate structure 286 and the second floating gate structure 296. The exposed first dielectric layer 232 is removed by an etch process. For example, the etch operation may be a wet etch process. After removing of the exposed first dielectric layer 232 is completed, the hard mask layer 244 is removed by, for example, a stripping technique.

As shown in FIG. 2E(3), an erase tunnel dielectric layer 258 is formed to cover the second dielectric layer 234, the exposed portion of the first floating gate structure 286, the exposed portion of the second floating gate structure 296, the exposed portion of the substrate 200, the isolation structures 214 and 216, and the dielectric layer 242. The erase tunnel dielectric layer 258 is formed by a deposition process, such as a chemical vapor deposition operation or a physical vapor deposition process. For example, the erase tunnel dielectric layer 258 may be formed from silicon oxide.

As shown in FIG. 2E(4), an oxidization operation for the common source 246 is performed. In the oxidization process, the dopants in the common source 246 diffuse, and a portion of the common source 246 adjacent to the erase tunnel dielectric layer 258 is oxidized, such that the common source 246 is enlarged, and the erase tunnel dielectric layer 258 on the common source 246 is thickened.

As shown in FIG. 2E(5), a hard mask layer 264 is formed on a portion of the erase tunnel dielectric layer 258 on the third region 200*c*, and another portion of the erase tunnel dielectric layer 258 which extends from the middle region of the first floating gate structure 286 to the middle region of the second floating gate structure 296 through the common source 246. In some exemplary examples, the hard mask layer 264 may be formed from photo-resist, and the hard mask layer 264 may be formed by coating a mask material film on the first region 200*a*, the second region 200*b*, and the third region 200*c*, and removing portions of the etch mask material film to form the hard mask layer 264.

Referring to FIG. 2E(5) again, a dry etch operation is performed by using the hard mask layer 264 as an etch mask. The dry etch operation removes the erase tunnel dielectric layer 258, the second dielectric layer 234, and the first dielectric layer 232 on the second region 200*b*. The dry etch operation further removes the erase tunnel dielectric layer 258, the second dielectric layer 234, and the first dielectric layer 232 on the first region 200*a* which are not covered by the hard mask layer 264. The spacers 236*a* and 236*b* are covered by portions of the erase tunnel dielectric layer 258 with a greater thickness, such that the spacers 236*a* and 236*b* and the underlying second dielectric layer 234 and the first dielectric layer 232 may not be etched during the dry etch process. In some certain examples, the spacers 236*a* and 236*b* may be slightly etched.

As shown in FIG. 2E(5), after the dry etch process, the spacer 236*a*, and a remaining portion 232*a* of the first dielectric layer 232 and a remaining portion 234*a* of the second dielectric layer 234 underlying the spacer 236*a* form a spacer 226*a*. The spacer 226*a* is disposed on the pad oxide layer 220 and covers the sidewall 286*s* of the first floating gate structure 286. In addition, the spacer 236*b*, and a remaining portion 232*b* of the first dielectric layer 232 and a remaining portion 234*b* of the second dielectric layer 234 underlying the spacer 236*b* form a spacer 226*b*. The spacer 226*b* is disposed on the pad oxide layer 220 and covers the sidewall 296*s* of the second floating gate structure 296. The spacer 226*a* and the spacer 226*b* are opposite to the common source 246. In some exemplary examples, the spacers 236*a* and 236*b* are formed from silicon oxide, the remaining portions 234*a* and 234*b* of the second dielectric layer 234 are formed from silicon nitride, and the remaining portions 232*a* and 232*b* of the first dielectric layer 232 are formed from silicon oxide, such that each of the spacer 226*a* and the spacer 226*b* includes an oxide-nitride-oxide structure.

Figure 2F:
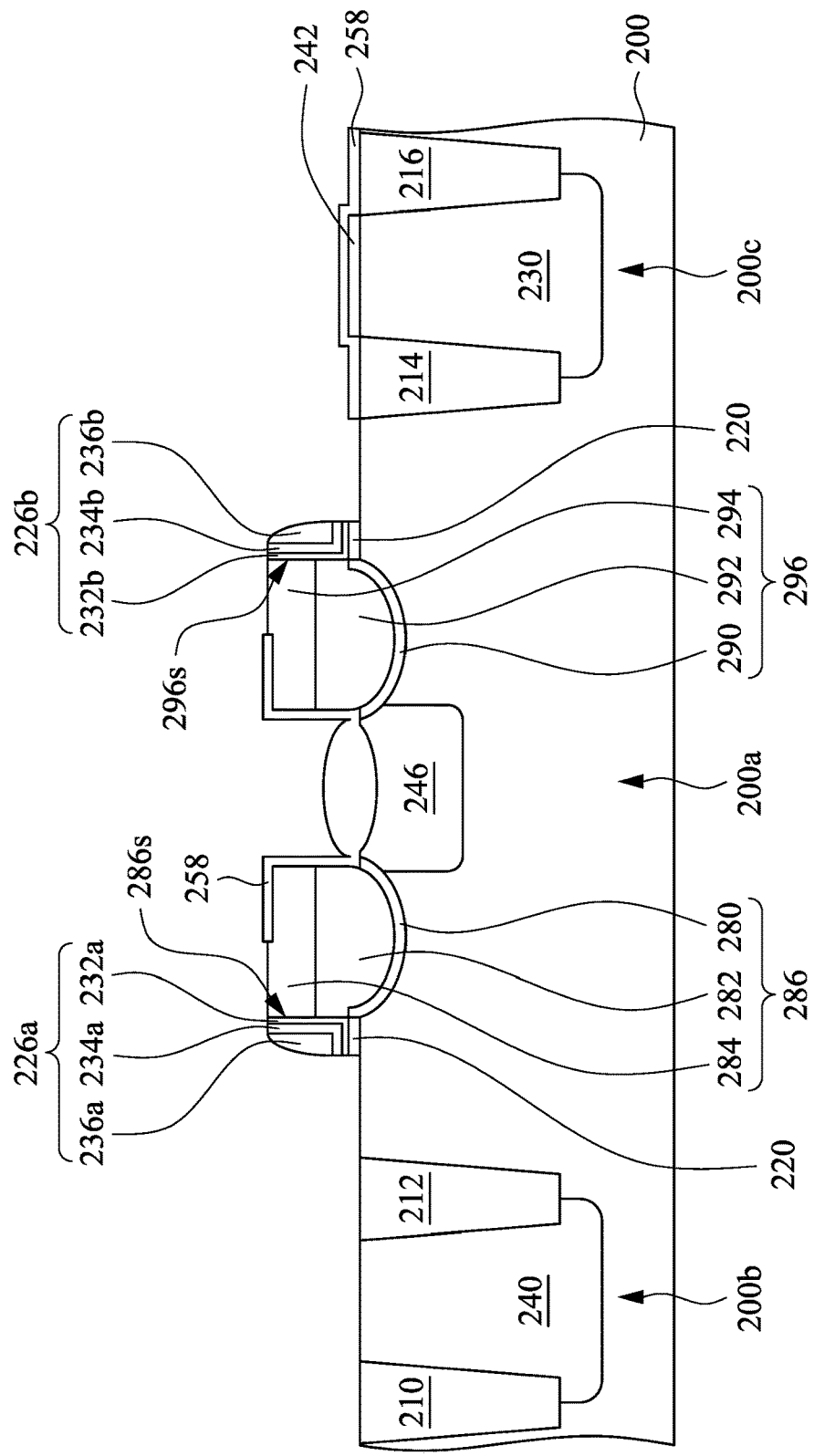

Then, as shown in FIG. 2F, after the dry etch operation is completed, portions of the pad oxide layer 220, which are not covered, are removed by an etch method, such as a dry etch method. Then, the hard mask layer 264 is removed by, for example, a strip method.

Figure 2G:
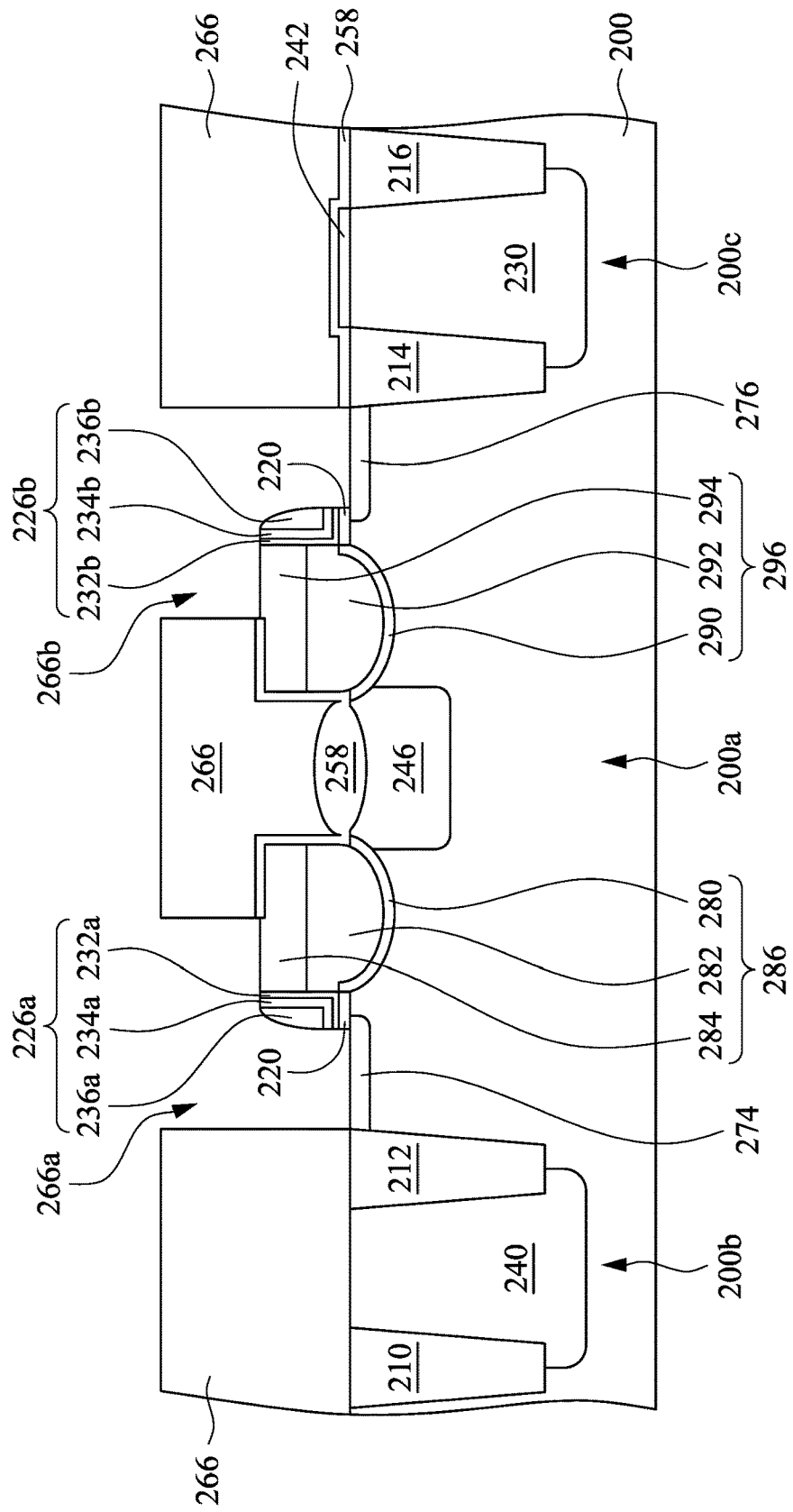
Figure 2I:
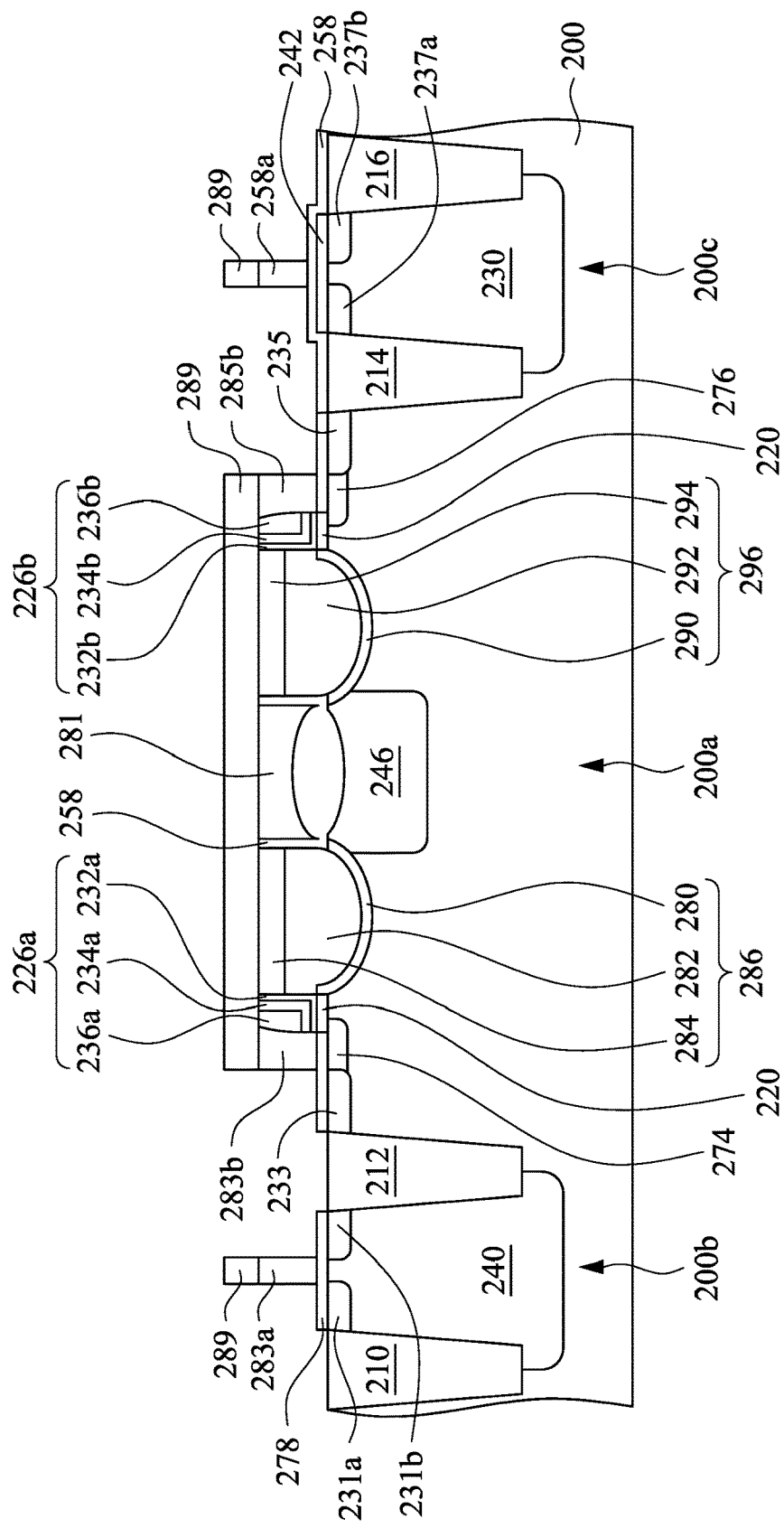

Thereafter, as shown in FIG. 2G, a hard mask layer 390 is formed on the first region 200*a*, the second region 200*b*, and the third region 200*c*, and the hard mask layer 266 is formed to have through holes 266*a* and 266*b*. The through hole 266*a* extends from the middle region of the first floating gate structure 286 to the isolation region 212, and the through hole 266*b* extends from the middle region of the second floating gate structure 296 to the isolation region 214. Thus, the through hole 266*a* exposes a portion of the first floating gate structure 286 and a portion of the substrate 200 between the spacer 226*a* and the isolation structure 212, and the through hole 266*b* exposes a portion of the second floating gate structure 296 and a portion of the substrate 200 between the spacer 226b and the isolation structure 214. The hard mask layer 266 covers the second region 200b and the third region 200c, and a middle portion of the first region 200a. In some exemplary examples, the hard mask layer 266 may be formed from photo-resist, and the hard mask layer 390 may be formed by coating a mask material film on the first region 200a, the second region 200b, and the third region 200c, and removing portions of the mask material film to form the hard mask layer 390 having the through holes 266a and 266b.

In some examples, referring to FIG. 2G again, an implantation operation is performed on the substrate 200 by using the hard mask layer 390, the first spacers 226a and the spacer 226b, and the exposed portions of the first floating gate structure 286 and the second floating gate structure 296 as a mask. The implantation operation includes forming implantation regions 274 and 276 in the substrate 200, in which the implantation region 274 is located between the spacer 226a and the isolation structure 212, and the implantation region 276 is located between the spacer 226b and the isolation structure 214. The implantation regions 274 and 276 include dopants, such as boron and phosphorous.

Then, a dummy erase gate 281 is formed on the erase tunnel dielectric layer 258 over the common source 246, a first dummy word line 283b is formed on a sidewall of the spacer 226a, and a second dummy word line 285b is formed on a sidewall of the spacer 226b, as shown in FIG. 2H(1) through FIG. 2H(7). As shown in FIG. 2H(1), dielectric layers 278 are formed on the logic well 240 between the isolation structures 210 and 212, the implantation regions 274 and 276. The dielectric layers 278 may be referred as a low voltage gate dielectric layer. For example, the dielectric layer 278 may be formed by a deposition technique or an oxidization technique. In some exemplary examples, the dielectric layers 278 are formed by oxidizing the substrate 200, and the dielectric layers 278 are formed from silicon oxide. For example, the dielectric layers 278 may be formed by a furnace oxidization process.

Referring to FIG. 2H(1) again, a conductive layer 288 is formed to cover the first region 200a, the second region 200b, and the third region 200c. The conductive layer 288 may be formed by using a deposition method, such as a chemical vapor deposition method, a plasma-enhanced chemical vapor deposition method, or a physical vapor deposition method. In some exemplary examples, the conductive layer 288 is formed from polysilicon.

As shown in FIG. 2H(2) a hard mask structure 218 is formed on the conductive layer 288 on the second region 200b and the third region 200c. In some exemplary examples, the hard mask structure 218 is a two-layered structure. The hard mask structure 218 includes dielectric layers 218a and 218b, in which the dielectric layer 218a is disposed on the conductive layer 288, and the dielectric layer 218b is disposed on the dielectric layer 218a. For example, the dielectric layer 218a may be formed from silicon nitride, and the dielectric layer 218b is formed from silicon oxide by using tetraethyl orthosilicate (TEOS). In some exemplary examples, in forming the hard mask structure 218, the dielectric layer 218a is formed to blanketly cover the conductive layer 288, the dielectric layer 218b is formed to blanketly cover the dielectric layer 218b, then an etch mask 224 is formed on the dielectric layer 218b on the second region 200b and the third region 200c, and an etch operation is performed on the dielectric layer 218b, which is not covered by the etch mask 224, and the underlying dielectric layer 442 to form the hard mask structure 218. The dielectric layer 218a may be formed by using a chemical vapor deposition method or a physical vapor deposition. The dielectric layer 218b may be formed by using a chemical vapor deposition method. The etch mask 224 may be formed from photo-resist. After the etch operation is completed, the etch mask 224 may be removed by a strip process.

As shown in FIG. 2H(3), the dielectric layer 218b of the hard mask structure 218 may be optionally removed. In some exemplary examples, the dielectric layer 218b is removed by a wet process. For example, the dielectric layer 218b may be removed by dipping in a solution of hydrogen fluoride (HF).

As shown in FIG. 2H(4), in some examples, a buffer layer 228 is formed to cover the dielectric layer 218a of the hard mask structure 218 and the conductive layer 288. For examples, the buffer layer 228 may be a Bottom Anti-Reflective-Coating (BARC) layer and formed by a coating method. A top surface 228t of the buffer layer 228 is substantially flat.

As shown in FIG. 2H(5), the buffer layer 228 and a portion of the conductive layer 288 are removed. In some examples, the buffer layer 228 and the portion of the conductive layer 288 are removed by a blanket etch back operation or a chemical mechanical polishing process. After the buffer layer 228 and the portion of the conductive layer 288 are removed, the conductive layer 288 on the first region 200a is substantially planarized. After the portion of the conductive layer 288 is removed, portions of the conductive layer 288 are remained. One of the remaining portions of the conductive layer 288 is disposed on the erase tunnel dielectric layer 258 over the common source 246 and forms a dummy erase gate 281. Another remaining portion 283 of the conductive layer 288 extends from the spacer 226a to the second region 200b, and the other remaining portion 285 of the conductive layer 288 extends from the spacer 226b to the third region 200c. The dummy erase gate 281 is separated from the portion 283 by the spacer 226a, and the dummy erase gate 281 is separated from the portion 285 by the spacer 226b. The dummy erase gate 281 is separated from the first floating gate structure 286 and the second floating gate structure 296 by the erase tunnel dielectric layer 258. In some examples, portions of the erase tunnel dielectric layer 258 located on the mask layers 284 and 294 are removed.

As shown in FIG. 2H(6), the dielectric layer 218a of the hard mask structure 218 over the second region 200b and the third region 200c is removed by using an etch process. For example, the etch operation may be a dry etch operation or a wet etch process.

As shown in FIG. 2H(7), a hard mask layer 289 is formed on the dummy erase gate 281, the first floating gate structure 286, the second floating gate structure 296, the spacer 226a, the spacer 226b, two portions of the portion 283 of the conductive layer 288 which are respectively adjacent to the spacer 226a and disposed on the dielectric layers 278 over the logic well 240, two portions of the portion 285 of the conductive layer 288 which are respectively adjacent to the spacer 226b and disposed on the erase tunnel dielectric layer 258 over the high voltage well 230. In some exemplary examples, the hard mask layer 289 may be formed from photo-resist, and the hard mask layer 289 may be formed by coating a mask material film on the first region 200a, the second region 200b, and the third region 200c, and removing portions of the etch mask material film to form the hard mask layer 289 by using a photolithography method.

Referring to FIG. 2H(7) again, portions of the conductive layer 288, which are not covered by the hard mask layer 289, are removed, so as to form a dummy gate 283a on the dielectric layer 278 over the logic well 240, a dummy gate 285a on the erase tunnel dielectric layer 258 over the high voltage well 230, a first dummy word line 283b on a sidewall of the spacer 226a, and a second dummy word line 285b on a sidewall of the spacer 226b. The spacer 226a is disposed between the first floating gate structure 286 and the first dummy word line 283b to separate the first floating gate structure 286 from the first dummy word line 283b. The spacer 226b is disposed between the second floating gate structure 296 and the second dummy word line 285b to separate the second floating gate structure 296 from the second dummy word line 285b. In some exemplary examples, the uncovered portions of the conductive layer 288 are etched away by using the hard mask layer 289 as an etch mask. The portions of the conductive layer 288 may be removed by using a dry etch method. For example, the dummy erase gate 281, the dummy gates 283a and 285a, the first dummy word line 283b, and the second dummy word line 285b may be formed from polysilicon.

In some examples, as shown in FIG. 2I, an implantation operation is performed to form lightly doped drains 231a, 231b, 233, 235, 237a, and 237b in the substrate 200. The lightly doped drains 231a and 231b are formed in the logic well 240 and respectively adjacent to opposite sides of the dummy gate 283a. The lightly doped drains 237a and 237b are formed in the high voltage well 230 and are respectively adjacent to opposite sides of the dummy gate 285a. The lightly doped drain 233 is formed in the implantation region 274 and is located between the first dummy word line 283b and the isolation structure 212. The lightly doped drain 235 is formed in the implantation region 276 and is located between the second dummy word line 285b of the conductive layer 288 and the isolation structure 214.

Then, a source 261a, a drain 261b, implantation regions 263 and 265, a source 267a and a drain 267b, and pacers 251a, 251b, 253, 255, 257a, and 257b are formed corresponding to the first region 200a, the second region 200b and the third region 200c, as shown in FIG. 2J(1) through FIG. 2J(2). As shown in FIG. 2J(1), spacers 251a, 251b, 253, 255, 257a, and 257b are formed. The spacers 251a and 251b are disposed on the dielectric layer 278 over the logic well 240, and respectively abut on two opposite sidewalls of the dummy gate 283a. The spacers 257a and 257b are disposed on the erase tunnel dielectric layer 258 over the high voltage well 230, and respectively located on two opposite sidewalls of the dummy gate 285a. The spacer 253 is disposed on the dielectric layer 278 over the implantation region 274 and located on a sidewall of the first dummy word line 283b. The spacer 255 is disposed on the dielectric layer 278 over the implantation region 276 and located on a sidewall of the second dummy word line 285b. In some examples, the spacers 251a, 251b, 253, 255, 257a, and 257b are formed by blanketly depositing a spacer material film to cover the first region 200a, the second region 200b, and the third region 200c, and performing an etch back operation on the spacer material film to remove a portion of the spacer material film. For example, the spacers 251a, 251b, 253, 255, 257a, and 257b may be formed from silicon nitride or silicon oxynitride.

In some examples, referring to FIG. 2J(1) again, a source 261a, a drain 261b, an implantation regions 263 and 265, a source 267a, and a drain 267b are formed in the substrate 200 by using, for example, an implantation technique. The source 261a and the drain 261b are respectively formed in the lightly doped drains 231a and 231b, and are respectively adjacent to the opposite sides of the dummy gate 283a. The source 267a and the drain 267b are respectively formed in the lightly doped drains 237a and 237b, and are respectively adjacent to the opposite sides of the dummy gate 285a. The implantation region 263 is formed in the lightly doped drain 233 adjacent to the spacer 253. The implantation region 265 is formed in the lightly doped drain 235 adjacent to the spacer 255.

As shown in FIG. 2J(2), a silicide operation is performed to form silicide layers 271a, 271b, 273a, 273b, 275a and 275b. In some examples, before the silicide process, portions of the dielectric layer 278 and portions of the dielectric layer 242 are removed to expose the source 261a, the drain 261b, the implantation regions 263 and 265, the source 267a, and the drain 267b. The silicide layers 271a and 271b are respectively formed on the source 261a and the drain 261b in the substrate 200. The silicide layers 273a and 273b are respectively formed on the implantation regions 263 and 265 in the substrate 200. The silicide layers 275a and 275b are respectively formed on the source 267a and the drain 267b in the substrate 200.

Thereafter, the dummy erase gate 281, the dummy gates 283a and 285a, the first dummy word line 283b and the second dummy word line 285b are removed, and high-k metal gate structures 206a, 206b, 206c, 206d and 206e are formed on the positions of the dummy erase gate 281, the dummy gates 283a and 285a, the first dummy word line 283b and the second dummy word line 285b, as shown in FIG. 2K(1) through FIG. 2K(7). As shown in FIG. 2K(1), a buffer layer 277 is formed to cover the hard mask layer 289, the spacers 251a, 251b, 253, 255, 257a, 257b, and the silicide layers 271a, 271b, 273a, 273b, 275a, 275b. For examples, the buffer layer 277 may be a Bottom Anti-Reflective-Coating (BARC) layer and formed by a coating method. A top surface 277t of the buffer layer 600 is substantially flat.

As shown in FIG. 2K(2), a portion of the buffer layer 277 is removed, thereby enabling portions 279 of the buffer layer 277 to remain adjacent to the spacers 251a, 251b, 253, 255, 257a and 257b. In some examples, the portion of the buffer layer 277 is removed by an etch back operation to enable a top surface 279t of each of the remaining portions 279 to be aligned with top surfaces of the dummy gate 283a, the first dummy word line 283b, the dummy gate 285a and the second dummy word line 285b.

As shown in FIG. 2K(3), the hard mask 289 and portions of the spacers 251a, 251b, 253, 255, 257a, 257b are removed to expose the dummy gate 283a, the first dummy word line 283b, the second dummy word line 285b and the dummy gate 285a. In some examples, a planarization operation is conducted to remove the hard mask 289 and the portions of the spacers 251a, 251b, 253, 255, 257a, 257b, in which the planarization operation may be conducted by using an etch method.

As shown in FIG. 2K(4), the remaining portions 279 of the buffer layer 277 adjacent to the spacers 251a, 251b, 253, 255, 257a, 257b are removed to form a semiconductor device 24. In some examples, the remaining portions 279 are removed by used an etch method.

As shown in FIG. 2K(5), a etch stop layer 291 and a dielectric layer 293 are sequentially formed to cover the semiconductor device 24. In some example, the etch stop layer 291 and the dielectric layer 293 are form by using a high density plasma chemical vapor deposition (HDP CVD) method, the dielectric layer 293 may be formed from silicon oxide, and the etch stop layer 291 may be formed from silicon nitride, silicon oxynitride, silicon carbide, silicon oxide, or a combinations thereof. Further, in some example, before forming the contact etch stop layer 291 and the dielectric layer 293, the mask layers 284 and 294 located on the floating gates 292 and 292 are removed.

As shown in FIG. 2K(6), portions of the etch stop layer 291 and the dielectric layer 293 are removed to expose the dummy gate 283a, the first dummy word line 283b, the second dummy word line 285b and the dummy gate 285a. In some examples, the etch stop layer 291 and the dielectric layer 293 are polished, and portions 295 of the etch stop layer 291 and portions 297 of the dielectric layer 293 remain adjacent to the spacers 251a, 251b, 253, 255, 257a, 257b and the floating gates 282 and 292. In some examples, a chemical mechanical polish (CMP) operation is used to polish the etch stop layer 291 and the dielectric layer 293.

As shown in FIG. 2K(7), the dummy gate 283a, the first dummy word line 283b, the second dummy word line 285b and the dummy gate 285a are removed to form openings, and the openings are filled with high-k dielectric layers 203 and metal gates 204. The high-k dielectric layers 203 and metal gates 204 forms high-k metal gate structures 206a, 206b, 206c, 206d and 206e. The high-k metal gate structure 206a is located on the logic well 240. The high-k metal gate structure 206a is disposed on the logic well 240. The high-k metal gate structure 206e is disposed on the high voltage well 230. The high-k metal gate structure 206b is disposed adjacent to the floating gate 282. The high-k metal gate structure 206d is disposed adjacent to the floating gate 292. The high-k metal gate structure 206c is disposed on the erase tunnel dielectric layer 258 and between the floating gate 282 and the floating gate 292. Therefore, a floating gate memory cell 22, a first transistor device 205, and a second transistor device 207 of a memory device MEM are formed.

In some examples, the metal gate 204 of the high-k metal gate structure 206c is considered as an erase gate, the metal gate 204 of the high-k metal gate structure 206b is considered as a first word line, and the metal gate 204 of the high-k metal gate structure 206d is considered as a second word line. In some examples, the metal gates 204 may be formed from metal including Ti, TiN, TaN, Ta, TaC, TaSiN, W, WN, MoN, MoON and/or other suitable materials, and the high-k dielectric layers 203 may be formed from high-k material including hafnium silicon oxide (HfSiO), hafnium silicon oxynitride (HfSiON), hafnium tantalum oxide (HfTaO), hafnium titanium oxide (HfTiO), hafnium zirconium oxide (HfZrO), combinations thereof, and/or other suitable materials.

Referring to FIG. 2K(7) again, the floating gate memory cell 22 is disposed in the first region 200a. The floating gate memory cell 22 mainly includes the first floating gate structure 286, the second floating gate structure 296, an erase gate structure 208, the common source 246, the high-k metal gate structure 206b, the high-k metal gate structure 206d, the spacer 226a, and the spacer 226b. The erase gate structure 208 mainly includes the high-k metal gate structure 206c and the erase tunnel dielectric layer 258 disposed on the common source 246. The erase gate structure 208 is disposed on the common source 246 between the first floating gate structure 286 and the second floating gate structure 296. The high-k metal gate structure 206b and the erase gate structure 208 are disposed at opposite sides of the first floating gate structure 286. The high-k metal gate structure 206d and the erase gate structure 208 are disposed at opposite sides of the second floating gate structure 296. In some examples, a top surface of each of the first floating gate structure 286 and the second floating gate structure 296 is aligned with a top surface of the erase gate structure 208, thereby enabling the memory device MEM to have a low-height structure to overcome topology problems.

In some examples, the first transistor device 205 is a low voltage device and is disposed in the second region 200b. The first transistor device 205 mainly includes the source 261a, the drain 261b and the high-k metal gate structure 206a. The source 261a and the drain 261b are disposed in the logic well 240. The high-k metal gate structure 206a is disposed on the logic well 240 and between the source 261a and the drain 261b.

In some examples, the second transistor device 207 is a high voltage device and is disposed in the third region 200c. The second transistor device 207 mainly includes the source 267a, the drain 267b, the dielectric layers 242 and 258 and the high-k metal gate structure 206e. The source 267a and the drain 267b are disposed in the high voltage well 230. The dielectric layers 242 and 258 are sequentially disposed on the high voltage well 230 and between the source 267a and the drain 267b. The high-k metal gate structure 206e is disposed on the dielectric layers 242 and 258. In some examples, the combination of the dielectric layers 242 and 258 can be considered as a gate dielectric layer of the second transistor device 206, and the high-k metal gate structure 206e is referred as a high voltage gate.

Figure 2L:
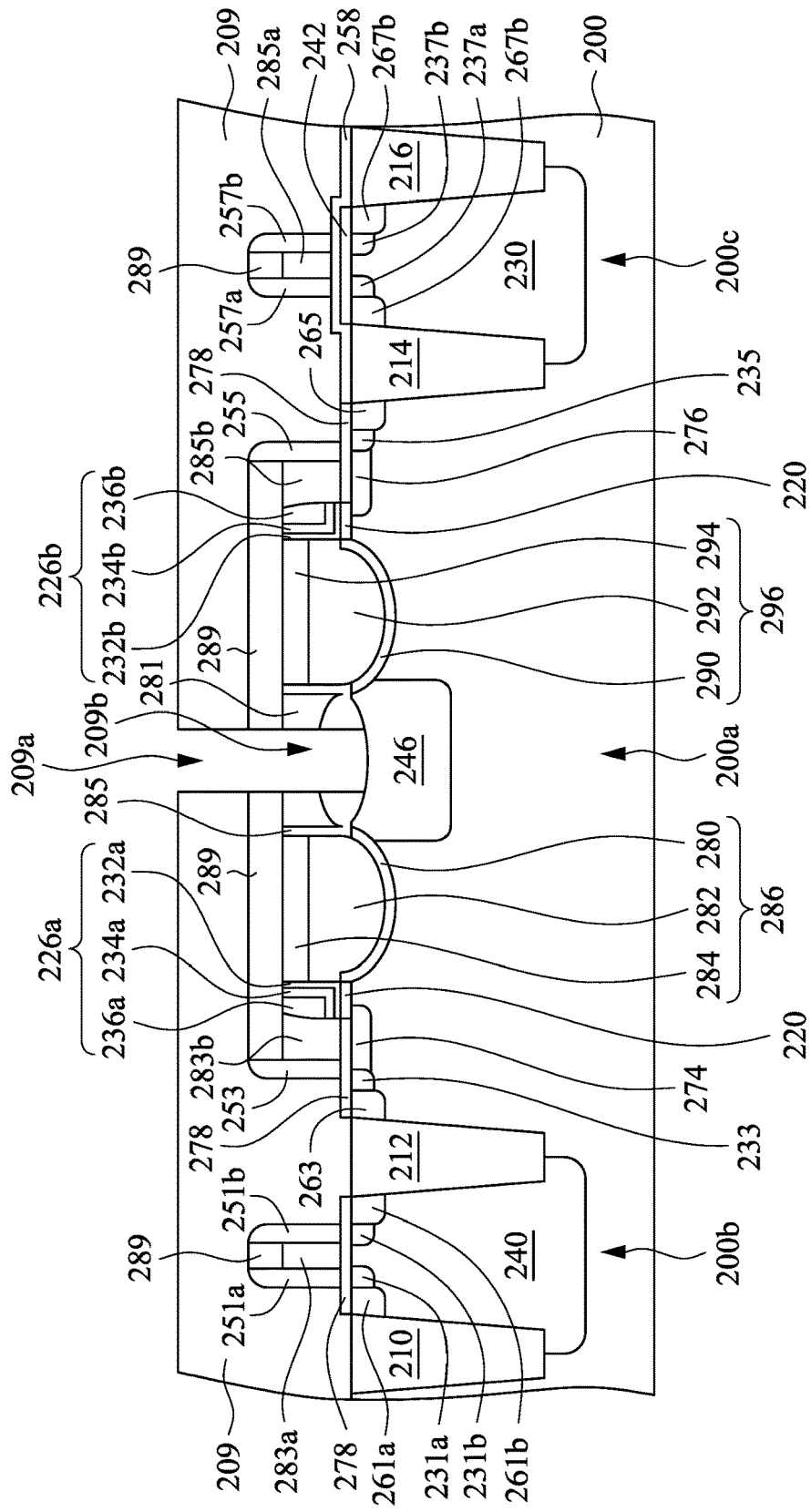

In some examples, after the operation for forming the spacers 251a, 251b, 253, 255, 257a, and 257b shown in FIG. 2J(1), an operation for forming a contact hole 209b is conducted, as shown in FIG. 2L. It is noted that FIG. 2L and FIG. 2J(1) present cross-sectional views with respect to different positions along an axis (such as an x-axis) of the memory device. As shown in FIG. 2L, a mask layer 480 is formed on the first region 200a, the second region 200b, and the third region 200c. The mask layer 480 is formed to have a through hole 209a, in which the through hole 209a exposes a portion of the hard mask layer 289 located on the dummy erase gate 281. In some exemplary examples, the mask layer 480 may be formed from photo-resist, and the mask layer 480 may be formed by coating a mask material film on the first region 200a, the second region 200b, and the third region 200c, and removing a portion of the mask material film to form the mask layer 480 having the through hole 209a.

Figure 3A:
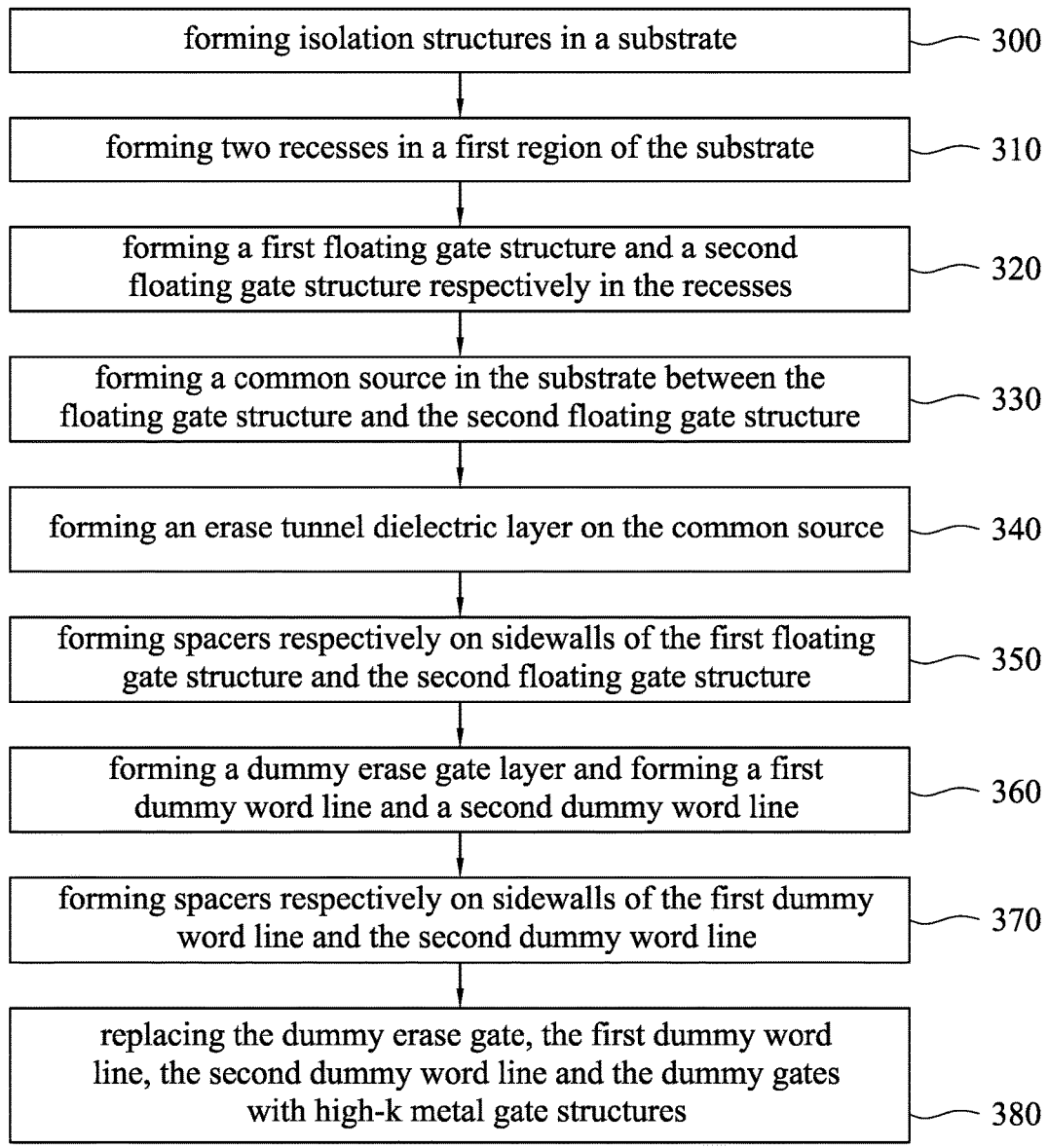
FIG. 3A is a flow chart of a method for manufacturing a memory device in accordance with various embodiments.

Referring to FIG. 3A with FIG. 2A through FIG. 2K(7), FIG. 3A is a flow chart of a method for manufacturing a memory device in accordance with various embodiments. The method begins at operation 300, where various isolation structures 210, 212, 214, and 216 are formed in a substrate 200 as shown in FIG. 2A. The isolation structures 210, 212, 214, and 216 are formed to at least define a first region 200a, a second region 200b, and a third region 200c on the substrate 200. In some examples, a high voltage well 230 and a logic well 240 are respectively formed in the third region 200c and the second region 200b.

At operation 310, as shown in FIG. 2B(1) through FIG. 2B(3), two recesses 260 and 270 are formed in the portions 200a' and 200a" of the first region 200a in the substrate 200 by using a hard mask layer 250. The hard mask layer 250 is formed on the first region 200a, the second region 200b, and the third region 200c. The hard mask layer 250 is formed to expose two portions 220a and 220b of a pad oxide layer 220 on two portions 200a' and 200a" of the first region 200a. Thereafter, the two recesses 260 and 270 are formed in the portions 200a' and 200a" of the first region 200a in the substrate 200.

At operation 320, referring to FIG. 2C(1) through FIG. 2C(6), a first floating gate structure 286 and a second floating gate structure 296 are respectively formed in the recesses 260 and 270. The first floating gate structure 286 is formed to include a gate dielectric layer 280 covering a surface 260s of the recess 260, a floating gate 282 disposed on the gate dielectric layer 280 in the recess 260, and a mask layer 284 disposed on the floating gate 282. The second floating gate structure 296 is formed to include a gate dielectric layer 290 covering a surface 270s of the recess 270, a floating gate 292 disposed on the gate dielectric layer 290 in the recess 270, and a mask layer 294 disposed on the floating gate 292. Further, as shown in FIG. 2C(6), the hard mask layer 250 are removed to expose a sidewall 286s of the first floating gate structure 286 and a sidewall 286s of the second floating gate structure 296.

At operation 330, referring to FIG. 2D(1) through FIG. 2D(5), a common source 246 is formed in the substrate 200 between the first floating gate structure 286 and the second floating gate structure 296. At operation 340, referring to FIG. 2E(1) through FIG. 2E(5), an erase tunnel dielectric layer 258 is formed on the common source 246. The erase tunnel dielectric layer 258 extends from a portion of the first floating gate structure 286 to a portion of the second floating gate structure 296 through the common source 246.

At operation 350, as shown in FIG. 2F, a spacer 226a and a spacer 226b are respectively formed on the sidewall 286s of the first floating gate structure 286 and the sidewall 296s of the second floating gate structure 296. The spacer 226a and the common source 246 are respectively at opposite sides of the first floating gate structure 286. The spacer 226b and the common source 246 are respectively at opposite sides of the second floating gate structure 296.

At operation 360, referring to FIG. 2H(1) through FIG. 2H(7), the dummy erase gate 281 is formed on the erase tunnel dielectric layer 258 over the common source 246, a first dummy word line 283b is formed on a sidewall of the spacer 226a, and a second dummy word line 285b is formed on a sidewall of the spacer 226b. In some examples, the operation 360 is performed by using a hard mask layer 289, and the operation 360 is performed to further form a dummy gate 283a over the logic well 240 and a dummy gate 285a over the high voltage well 230. In some examples, an implantation operation is conducted between the operation 340 and the operation 350 to form the implantation regions 274 and 276 in the substrate 200, as shown in FIG. 2G.

At operation 370, as shown in FIG. 2J(1) through FIG. 2J(2), the spacers 253 and 255 are respectively formed on a sidewall of the first dummy word line 283b and a sidewall of the second dummy word line 285b, and the source 261a, the drain 261b, the implantation regions 263 and 265, the source 267a and the drain 267b are formed corresponding to the first region 200a, the second region 200b and the third region 200c. In some examples, the operation 370 is performed to further form spacers 251a, 251b, 257a, and 257b, in which the spacers 251a and 251b respectively abut on two opposite sidewalls of the dummy gate 283a, the spacers 257a and 257b respectively abut on two opposite sidewalls of the dummy gate 285a. In some examples, the operation 370 is performed to further form silicide layers 271a, 271b, 273a, 273b, 275a and 275b on the source 261a, the drain 261b, the implantation regions 263 and 265, the source 267a and the drain 267b.

In some examples, an implantation operation is conducted between the operation 360 and the operation 370 to form the lightly doped drains 231a, 231b, 233, 235, 237a, and 237b in the substrate 200, as shown in FIG. 2I.

At operation 380, as shown in FIG. 2K(1) through FIG. 2K(7), the dummy erase gate 281, the dummy gates 283a and 285a, the first dummy word line 283b and the second dummy word line 285b are removed, and the high-k metal gate structures 206a, 206b, 206c, 206d and 206e are formed on the positions of the dummy erase gate 281, the dummy gates 283a and 285a, the first dummy word line 283b and the second dummy word line 285b.

Figure 3B:
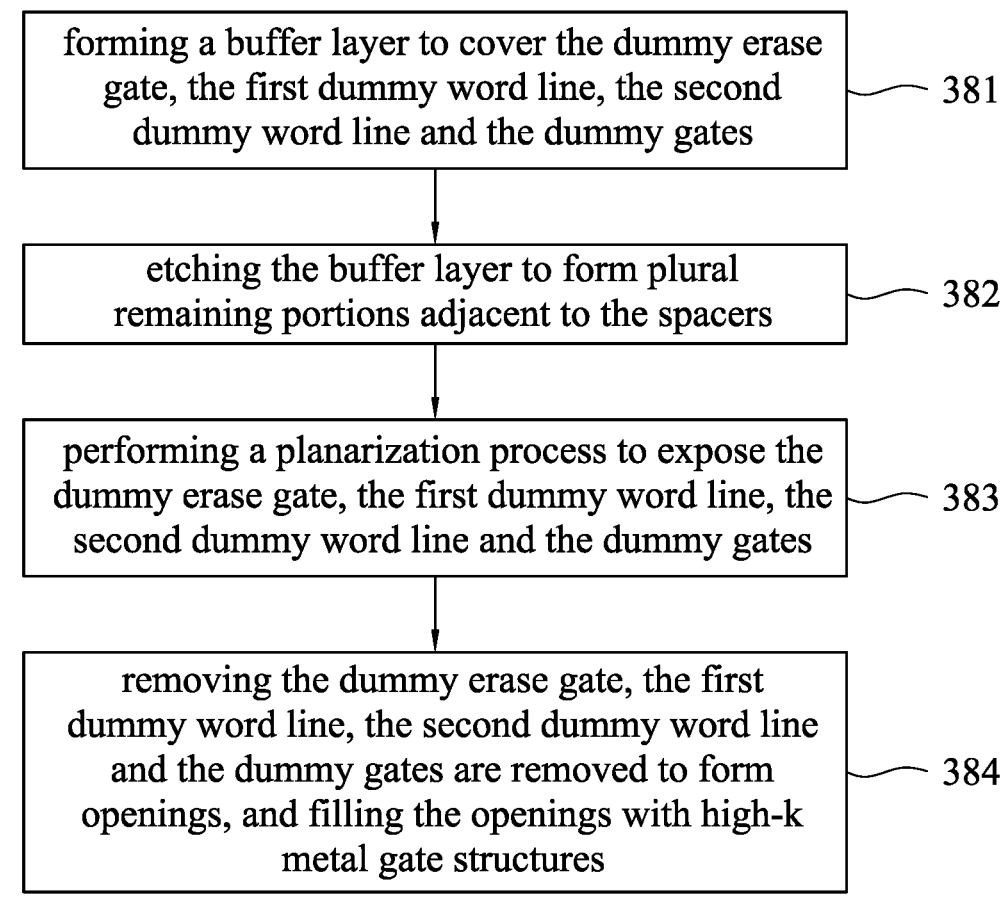
FIG. 3B is a flow chart of an operation for forming high-k metal gate structures in accordance with various embodiments.

Referring to FIG. 3B, FIG. 3B is a flow chart of the operation 380 in accordance with various embodiments. At operation 781, as shown in FIG. 2K(1), the buffer layer 277 is formed to cover the dummy erase gate 281, the first dummy word line 283b, the second dummy word line 285b, the dummy gate 283a, the dummy gate 285a and the hard mask layer 289. At operation 782, as shown in FIG. 2K(2), the buffer layer 277 is etched to form plural remaining portions 279 adjacent to the spacers 251a, 251b, 253, 255, 257a and 257b. A top surface of each of the remaining portions 279 is aligned with top surfaces of the first dummy word line 283b and the second dummy word line 285b. At operation 783, as shown in FIG. 2K(3), a planarization operation is conducted on the hard mask layer 289, thereby removing the hard mask layer 289 to expose the dummy erase gate 281, the first dummy word line 434b, the second dummy word line 285b and the dummy gates 283a and 285a. At operation 784, as shown in FIG. 2K(4) through FIG. 2K(7), the dummy erase gate 281, the first dummy word line 283b, the second dummy word line 285b and the dummy gates 283a and 285a are removed to form openings, and the high-k metal gate structures 206a, 206b, 206c, 206d and 206e are formed in the openings.

In accordance with an embodiment, the present disclosure discloses a memory device. The m device includes a substrate, various isolation structures, a floating gate memory cell, a first transistor device, and a second transistor device. The substrate has a surface. The isolation structures are disposed in the substrate to at least define a first region. The floating gate memory cell is disposed in the first region. The floating gate memory cell includes an erase gate structure, a first floating gate structure, a second floating gate structure, a first word line, a common source, a second word line, a first spacer, and a second spacer. The erase gate structure is disposed on the surface of the substrate. The first floating gate structure and the second floating gate structure are recessed in the substrate and are located at two opposite sides of the erase gate structure. The first word line is disposed on the surface of the substrate, in which the first word line is adjacent to the first floating gate structure opposite to the erase gate structure. The common source is disposed in the substrate between the first floating gate structure and the second floating gate structure. The second word line is disposed on the surface of the substrate, in which the second word line is adjacent to the second floating gate structure opposite to the erase gate structure. The first spacer is disposed between the first floating gate structure and the first word line. The second spacer is disposed between the second floating gate structure and the second word line.

In accordance with one embodiment, each of the first floating gate structure and the second floating gate structure includes a floating gate recessed in the substrate, a gate dielectric layer disposed between the substrate and the floating gate, and a mask layer disposed on the floating gate.

In accordance with one embodiment, the erase gate structure includes an erase gate disposed over the common source, a silicide layer disposed on the erase gate, and an erase tunnel dielectric layer disposed between the common source and the erase gate, between the first floating gate structure and the erase gate, and between the second floating gate structure and the erase gate.

In accordance with one embodiment, the erase gate, the first word line, and the second word line are formed from metal.

In accordance with one embodiment, the memory device further includes a first transistor device and a second transistor device, in which the isolation structures further define a second region and a third region on the substrate, the first transistor device is disposed in the second region, and the second transistor device is disposed in the third region.

In accordance with one embodiment, each of the first transistor device and the second transistor device includes a high-k dielectric layer disposed on a well formed in the substrate, and a metal gate disposed on the high-k dielectric layer.

In accordance with one embodiment, the first transistor device is a low voltage device, and the second transistor device is a high voltage device.

In accordance with another embodiment, the present disclosure discloses a method for manufacturing a memory device. In this method, various isolation structures are formed in a substrate to at least define a first region on the substrate. Two recesses are formed in the first region of the substrate. A floating gate memory cell is formed in the first region. In forming the floating gate memory cell, a first floating gate structure and a second floating gate structure are respectively formed in the recesses. A common source is formed in the substrate between the first floating gate structure and the second floating gate structure. An erase gate structure is formed on the common source between the first floating gate structure and the second floating gate structure. A first word line and a second word line are formed on a surface of the substrate, in which the first word line and the second word line are respectively adjacent to the first floating gate structure and the second floating gate structure, and are opposite to the erase gate structure. A first spacer and a second spacer are respectively formed between the first floating gate structure and the first word line and between the second floating gate structure and the second word line.

In accordance with one embodiment, forming the first floating gate structure and the second floating gate structure includes forming two gate dielectric layers to respectively cover surfaces of the recesses, forming two floating gates respectively on the gate dielectric layers in the recesses, and forming two mask layers respectively on the floating gates.

In accordance with one embodiment, forming the common source includes performing an implantation operation to form an implantation region in the substrate between the first floating gate structure and the second floating gate structure, and performing a furnace thermal operation to oxidize the implantation region.

In accordance with one embodiment, in the operation for forming the erase gate structure, an erase tunnel dielectric layer is formed and extends from a portion of the first floating gate structure to a portion of the second floating gate structure through the common source. An erase gate is formed on the erase tunnel dielectric layer over the common source.

In accordance with one embodiment, the erase gate, the first word line, and the second word line are formed from metal.

In accordance with one embodiment, the operation for forming the isolation structures in the substrate further defines a second region and a third region on the substrate, and the fabrication method further includes forming a first transistor device in the second region, and forming a second transistor device in the third region.

In accordance with one embodiment, each of forming the first transistor device and forming the second transistor device includes forming a high-k dielectric layer on a well formed in the substrate, and forming a metal gate on the high-k dielectric layer.

In accordance with one embodiment, the first transistor device is a low voltage device, and the second transistor device is a high voltage device.

In accordance with yet another embodiment, the present disclosure discloses a method for manufacturing a memory device. In this method, various isolation structures are formed in a substrate to at least define a region. Two recesses are formed in the region. A first floating gate structure and a second floating gate structure are respectively formed in the recesses. A common source is formed in the substrate between the first floating gate structure and the second floating gate structure. An erase tunnel dielectric layer is formed and extends from a portion of the first floating gate structure to a portion of the second floating gate structure through the common source. A first spacer and a second spacer are respectively formed on a sidewall of the first floating gate structure and a sidewall of the second floating gate structure, in which the first spacer and the second spacer are opposite to the common source. A dummy erase gate is formed on the erase tunnel dielectric layer over the common source. A first dummy word line is formed on a sidewall of the first spacer, and a second dummy word line is formed on a sidewall of the second spacer by using a hard mask layer. The hard mask layer has plural remaining portions located on the dummy erase gate, the first dummy word line and the second dummy word line. Third spacers abutting the first dummy word line and the second dummy word line are formed. A buffer layer is formed to cover the hard mask layer, the dummy erase gate, the first dummy word line and the second dummy word line. The buffer layer is etched to form plural remaining portions adjacent to the third spacers abutting the first dummy word line and the second dummy word line, in which a top surface of each of the remaining portions is aligned with top surfaces of the first dummy word line and the second dummy word line. A planarization operation is conducted to remove the remaining portions of the hard mask layer, thereby exposing the dummy erase gate, the first dummy word line and the second dummy word line. The dummy erase gate, the first dummy word line and the second dummy word line are removed to form plural openings. Plural high-k metal gate structures are formed in the openings.

In accordance with one embodiment, each of the high-k metal gate structures comprises a high-k dielectric layer and a metal gate disposed on the high-k dielectric layer.

In accordance with one embodiment, forming the first floating gate structure and the second floating gate structure includes forming two gate dielectric layers to respectively cover surfaces of the recesses, forming two floating gates respectively on the gate dielectric layers in the recesses, and forming two mask layers respectively on the floating gates.

In accordance with one embodiment, the floating gates, the erase gate, the first word line, the second word line, the low voltage gate, and the high voltage gate are formed from polysilicon.

In accordance with one embodiment, before forming the erase gate, the first word line, and the second word line, the method further includes forming two implantation regions in the substrate in the first region, in which the implantation regions are respectively adjacent to the first spacer and the second spacer opposite to the common source.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein.

Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a substrate having a surface;
   a plurality of isolation structures disposed in the substrate to at least define a first region on the substrate; and
   a floating gate memory cell disposed in the first region, wherein the floating gate memory cell comprises:
      an erase gate structure disposed on the surface of the substrate;
      a first floating gate structure and a second floating gate structure recessed in the substrate and located at two opposite sides of the erase gate structure;
      a first word line disposed on the surface of the substrate, wherein the first word line is adjacent to the first floating gate structure opposite to the erase gate structure;
      a common source disposed in the substrate between the first floating gate structure and the second floating gate structure;
      a second word line disposed on the surface of the substrate, wherein the second word line is adjacent to the second floating gate structure opposite to the erase gate structure;
      a first spacer disposed between the first floating gate structure and the first word line; and
      a second spacer disposed between the second floating gate structure and the second word line.

2. The memory device of claim 1, wherein each of the first floating gate structure and the second floating gate structure comprises:
   a floating gate recessed in the substrate;
   a gate dielectric layer disposed between the substrate and the floating gate; and
   a mask layer disposed on the floating gate.

3. The memory device of claim 2, wherein the erase gate structure comprises:
   an erase gate disposed over the common source;
   a silicide layer disposed on the erase gate; and
   an erase tunnel dielectric layer disposed between the common source and the erase gate, between the first floating gate structure and the erase gate, and between the second floating gate structure and the erase gate.

4. The memory device of claim 3, wherein the erase gate, the first word line, and the second word line are formed from metal.

5. The memory device of claim 1, further comprising a first transistor device and a second transistor device, wherein the isolation structures further define a second region and a third region on the substrate, the first transistor device is disposed in the second region, and the second transistor device is disposed in the third region.

6. The memory device of claim 5, wherein each of the first transistor device and the second transistor device comprises:
   a high-k dielectric layer disposed on a well formed in the substrate; and
   a metal gate disposed on the high-k dielectric layer.

7. The memory device of claim 6, wherein the first transistor device is a low voltage device, and the second transistor device is a high voltage device.

8. A method for manufacturing a memory device, the method comprising:
   forming a plurality of isolation structures in a substrate to at least define a first region on the substrate;
   forming two recesses in the first region of the substrate; and
   forming a floating gate memory cell in the first region, wherein forming the floating gate memory cell comprises:
      forming a first floating gate structure and a second floating gate structure respectively in the recesses;
      forming a common source in the substrate between the first floating gate structure and the second floating gate structure;
      forming an erase gate structure on the common source between the first floating gate structure and the second floating gate structure;
      forming a first word line and a second word line on a surface of the substrate, wherein the first word line and the second word line are respectively adjacent to the first floating gate structure and the second floating gate structure, and are opposite to the erase gate structure; and
      forming a first spacer and a second spacer respectively between the first floating gate structure and the first word line and between the second floating gate structure and the second word line.

9. The method of claim 8, wherein forming the first floating gate structure and the second floating gate structure comprises:
   forming two gate dielectric layers to respectively cover surfaces of the recesses;
   forming two floating gates respectively on the gate dielectric layers in the recesses; and
   forming two mask layers respectively on the floating gates.

10. The method of claim 9, wherein forming the common source comprises:
    performing an implantation operation to form an implantation region in the substrate between the first floating gate structure and the second floating gate structure; and
    performing a furnace thermal operation to oxidize the implantation region.

11. The method of claim 9, wherein forming the erase gate structure comprises:
    forming an erase tunnel dielectric layer extending from a portion of the first floating gate structure to a portion of the second floating gate structure through the common source; and
    forming an erase gate on the erase tunnel dielectric layer over the common source.

12. The method of claim 11, wherein the erase gate, the first word line, and the second word line are formed from metal.

13. The method of claim 8, wherein forming the isolation structures in the substrate further defines a second region and a third region on the substrate, the method further comprising:
    forming a first transistor device in the second region; and
    forming a second transistor device in the third region.

14. The method of claim 13, wherein each of forming the first transistor device and forming the second transistor device comprises:
- forming a high-k dielectric layer on a well formed in the substrate; and
- forming a metal gate on the high-k dielectric layer.

15. The method of claim 14, wherein the first transistor device is a low voltage device, and the second transistor device is a high voltage device.

16. A method for manufacturing a memory device, the method comprising:
- forming a plurality of isolation structures in a substrate to at least define a region on the substrate;
- forming two recesses in the region;
- forming a first floating gate structure and a second floating gate structure respectively in the recesses;
- forming a common source in the substrate between the first floating gate structure and the second floating gate structure;
- forming an erase tunnel dielectric layer extending from a portion of the first floating gate structure to a portion of the second floating gate structure through the common source;
- forming a first spacer and a second spacer respectively on a sidewall of the first floating gate structure and a sidewall of the second floating gate structure, wherein the first spacer and the second spacer are opposite to the common source;
- forming a dummy erase gate on the erase tunnel dielectric layer over the common source;
- forming a first dummy word line on a sidewall of the first spacer and a second dummy word line on a sidewall of the second spacer by using a hard mask layer, wherein the hard mask layer has plural remaining portions located on the dummy erase gate, the first dummy word line and the second dummy word line;
- forming third spacers abutting the first dummy word line and the second dummy word line;
- forming a buffer layer covering the hard mask layer, the dummy erase gate, the first dummy word line and the second dummy word line;
- etching the buffer layer to form plural remaining portions adjacent to the third spacers abutting the first dummy word line and the second dummy word line, wherein a top surface of each of the remaining portions is aligned with top surfaces of the first dummy word line and the second dummy word line;
- performing a planarization operation to remove the remaining portions of the hard mask layer, thereby exposing the dummy erase gate, the first dummy word line and the second dummy word line;
- removing the dummy erase gate, the first dummy word line and the second dummy word line to form plural openings; and
- forming plural high-k metal gate structures in the openings.

17. The method of claim 16, wherein each of the high-k metal gate structures comprises a high-k dielectric layer and a metal gate disposed on the high-k dielectric layer.

18. The method of claim 16, wherein forming the first floating gate structure and the second floating gate structure comprises:
- forming two gate dielectric layers to respectively cover surfaces of the recesses;
- forming two floating gates respectively on the gate dielectric layers in the recesses; and
- forming two mask layers respectively on the floating gates.

19. The method of claim 18, wherein the floating gates, the erase gate, the first word line, the second word line, the low voltage gate, and the high voltage gate are formed from polysilicon.

20. The method of claim 16, wherein before forming the dummy erase gate, the first dummy word line, and the second dummy word line, the method further comprises:
- forming two implantation regions in the substrate in the first region, wherein the implantation regions are respectively adjacent to the first spacer and the second spacer opposite to the common source.

* * * * *